US008714088B2

(12) United States Patent
Oya et al.

(10) Patent No.: US 8,714,088 B2

(45) Date of Patent: May 6, 2014

(54) LITHOGRAPHIC PRINTING PLATE PRECURSOR AND LITHOGRAPHIC PRINTING METHOD

(75) Inventors: Toyohisa Oya, Shizuoka (JP); Kazuto Kunita, Shizuoka (JP); Katsumi Araki, Kanagawa (JP); Yu Iwai, Shizuoka (JP); Koji Sonokawa, Shizuoka (JP); Tomoya Sasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1107 days.

(21) Appl. No.: 12/142,564

(22) Filed: Jun. 19, 2008

(65) Prior Publication Data

US 2009/0114108 A1 May 7, 2009

(30) Foreign Application Priority Data

| | | | |
|---|---|---|---|
| Jun. 21, 2007 | (JP) | ................................ | 2007-163321 |
| Sep. 6, 2007 | (JP) | ................................ | 2007-231901 |
| Feb. 6, 2008 | (JP) | ................................ | 2008-026525 |

(51) Int. Cl.
*B41M 1/06* (2006.01)
*B41N 1/00* (2006.01)

(52) U.S. Cl.
USPC .......................................... 101/453; 101/451

(58) Field of Classification Search
None
See application file for complete search history.

(56) References Cited

U.S. PATENT DOCUMENTS

| | | | | |
|---|---|---|---|---|
| 6,667,141 | B2 * | 12/2003 | Iwamoto et al. | 430/111.4 |
| 2005/0069811 | A1 | 3/2005 | Mitsumoto et al. | |
| 2006/0057492 | A1 * | 3/2006 | Kunita et al. | 430/270.1 |
| 2006/0194150 | A1 | 8/2006 | Mitsumoto et al. | |
| 2007/0042293 | A1 | 2/2007 | Oohashi et al. | |
| 2007/0056457 | A1 * | 3/2007 | Iwai et al. | 101/453 |
| 2007/0224535 | A1 * | 9/2007 | Hoshi et al. | 430/204 |

FOREIGN PATENT DOCUMENTS

| | | | |
|---|---|---|---|
| EP | 1048457 | A2 | 11/2000 |
| EP | 1630618 | A2 | 3/2006 |
| EP | 1754597 | A2 | 2/2007 |
| EP | 1975710 | A2 | 10/2008 |
| JP | 2001-171250 | A | 6/2001 |
| JP | 2005-91618 | A | 4/2005 |
| JP | 2005-119273 | A | 5/2005 |
| JP | 2005-231347 | A | 9/2005 |
| JP | 2006-85049 | A | 3/2006 |
| JP | 2006-113343 | A | 4/2006 |
| JP | 2006-297907 | A | 11/2006 |
| JP | 2007-50660 | A | 3/2007 |
| JP | 2007-101714 | A | 4/2007 |
| WO | WO 2005091068 | A1 * | 9/2005 |

OTHER PUBLICATIONS

European Search Report in corresponding EP 08011283.2 issued Nov. 25, 2009.
Database XP-002554838, WPI Week 200558, Thomson Scientific, London, UK.
Japanese Office Action issued on Feb. 19, 2013, in coresponding Japanese Patent Application No. 2008-162369 (Partial English translation is provided).
Communication pursuant to Article 94(3) EPC for European Application No. 08011283.2, dated Sep. 26, 2013.

* cited by examiner

*Primary Examiner* — Joshua D Zimmerman

(74) *Attorney, Agent, or Firm* — Birch, Stewart, Kolasch & Birch, LLP

(57) ABSTRACT

A lithographic printing plate precursor includes an image-recording layer and a protective layer containing a stratiform compound, wherein at least one of the image-recording layer and the protective layer contains a polymer containing as a repeating unit, a structural unit having an ammonium structure.

18 Claims, 1 Drawing Sheet

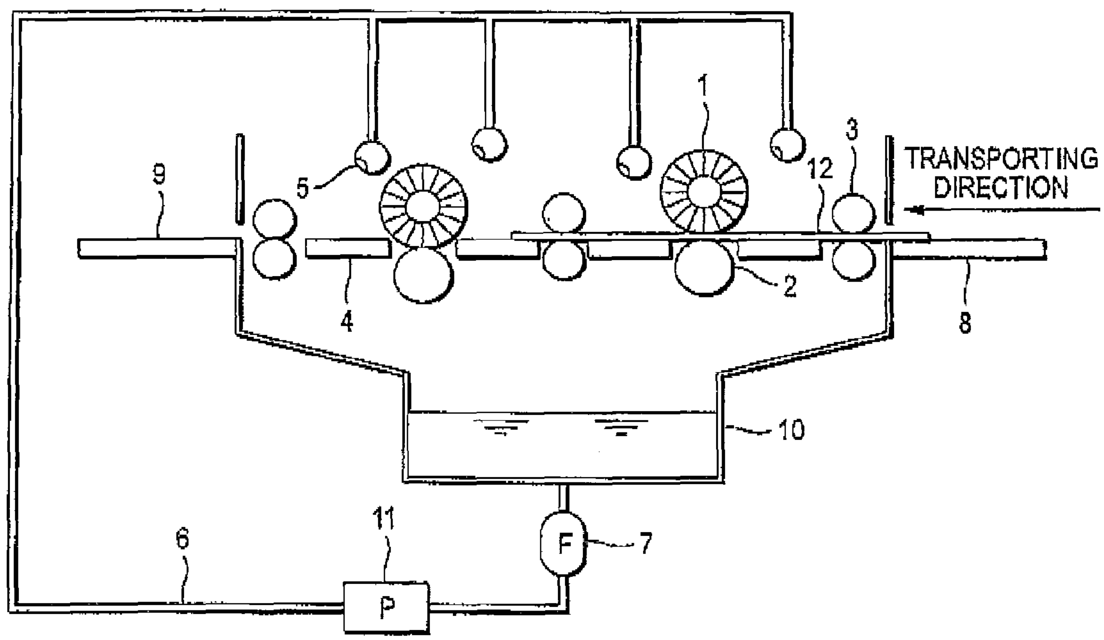
1
3
TRANSPORTING
DIRECTION
12
9
5
4
2
8
10
11
6
P
F
7

LITHOGRAPHIC PRINTING PLATE PRECURSOR AND LITHOGRAPHIC PRINTING METHOD

FIELD OF THE INVENTION

The present invention relates to a lithographic printing plate precursor. More particularly, it relates to a lithographic printing plate precursor capable of undergoing image recording with a laser and capable of undergoing on-machine development.

BACKGROUND OF THE INVENTION

In general, a lithographic printing plate is composed of an oleophilic image area accepting ink and a hydrophilic non-image area accepting dampening water (fountain solution) in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) has heretofore been broadly used. Ordinarily, the lithographic printing plate is obtained by conducting plate making according to a method of exposing the lithographic printing plate precursor through an original, for example, a lith film, and then while leaving the part forming the image area of the image-recording layer, removing the other unnecessary image-recording layer by dissolving with an alkaline developer or an organic solvent to reveal the hydrophilic surface of support.

In the hitherto known plate making process of lithographic printing plate precursor, after exposure, the step of removing the unnecessary image-recording layer by dissolving, for example, with a developer is required. However, it is one of the subjects to save or simplify such an additional wet treatment described above. Particularly, since disposal of liquid wastes discharged resulting from the wet treatment has become a great concern throughout the field of industry in view of the consideration for global environment in recent years, the demand for the solution of the above-described subject has been increased more and more.

As one of simple plate making methods in response to the above-described requirement, a method referred to as on-machine development has been proposed wherein a lithographic printing plate precursor having an image-recording layer capable of being removed in the unnecessary areas during a conventional printing process is used and after imagewise exposure, the image-recording layer corresponding to the non-image area is removed on a printing machine to prepare a lithographic printing plate.

Specific methods of the on-machine development include, for example, a method of using a lithographic printing plate precursor having an image-recording layer that can be dissolved or dispersed in dampening water, an ink solvent or an emulsion of dampening water and ink, a method of mechanically removing an image-recording layer by contact with a roller or a blanket cylinder of a printing machine, and a method of lowering cohesion of an image-recording layer or adhesion between an image-recording layer and a support upon penetration of dampening water, ink solvent or the like and then mechanically removing the image-recording layer by contact with a roller or a blanket cylinder of a printing machine.

In the invention, unless otherwise indicated particularly, the term "development processing step" means a step of using an apparatus (ordinarily, an automatic developing machine) other than a printing machine and removing an unexposed area in an image-recording layer of a lithographic printing plate precursor upon contact with liquid (ordinarily, an alkaline developer) thereby revealing a hydrophilic surface of support. The term "on-machine development" means a method or a step of removing an unexposed area in an image-recording layer of a lithographic printing plate precursor upon contact with liquid (ordinarily, printing ink and/or dampening water) by using a printing machine thereby revealing a hydrophilic surface of support.

On the other hand, digitalized technique of electronically processing, accumulating and outputting image information using a computer has been popularized in recent years, and various new image-outputting systems responding to the digitalized technique have been put into practical use. Correspondingly, attention has been drawn to a computer-to-plate (CTP) technique of carrying digitalized image information on highly converging radiation, for example, a laser beam and conducting scanning exposure of a lithographic printing plate precursor with the radiation thereby directly preparing a lithographic printing plate without using a lith film. Thus, it is one of the important technical subjects to obtain a lithographic printing plate precursor adaptable to the technique described above.

As described above, in recent years, the simplification of plate making operation and the realization of dry system and non-processing system have been further strongly required from both aspects of the consideration for global environment and the adaptation for digitization.

As lithographic printing plate precursors adapting to the above-described requirements, lithographic printing plate precursors having a photopolymerizable and/or heat-polymerizable image-recording layer are used. In such a lithographic printing plate precursor, a protective layer (overcoat layer) is provided on the image-recording layer for the purpose of imparting an oxygen blocking property, preventing occurrence of scratch on the image-recording layer, preventing ablation caused at the time of exposure with a high illuminance laser beam or the like. As a material for the protective layer, polyvinyl alcohol, polyvinyl pyrrolidone, polyvinyl imidazole, a water-soluble acrylic resin (for example, polyacrylic acid), gelatin, gum arabic or a cellulose polymer (for example, carboxymethyl cellulose) is exemplified. It is also known that the oxygen blocking property is improved and the occurrence of scratch on the image-recording layer is more prevented by means of adding a stratiform compound, for example, mica (see, for example, JP-A-2001-171250 (the term "JP-A" as used herein means an "unexamined published Japanese patent application") and JP-A-2005-119273 (corresponding to US2005/0069811 A1)).

However, when the stratiform compound is used in the protective layer, one or more of the performances, for example, ink-receptive property at the beginning of printing, ink-receptive property during printing, developing property or on-machine development property may decrease in sometimes. In particular, when the stratiform compound is added to a water-soluble polymer, for example, polyvinyl alcohol, polyvinyl pyrrolidone, polyacrylic acid or a cellulose polymer, which is suitably used in the protective layer, because of the good oxygen blocking property, the polymerization is apt to proceed resulting in the improvement in printing durability, but the development property and ink-receptive property may decrease in many cases. Therefore, the solution of such a problem is one of the important technical tasks.

In order to improve the decrease in ink-receptive property, it is proposed that a phosphonium compound is added to an image-recording layer or a protective layer (see, for example, JP-A-2006-297907 (corresponding to US2006/0194150 A1) and JP-A-2007-50660 (corresponding to US2007/0042293 A1)). However, these proposals are still insufficient in view of achieving excellent levels in all of the printing durability, on-machine development property and ink-receptive property.

SUMMARY OF THE INVENTION

An object of the present invention is to provide a lithographic printing plate precursor which contains a stratiform compound in its protective layer, which can be efficiently form an image by laser exposure and which is excellent in printing durability, ink-receptive property and on-machine development property, and a lithographic printing method using the lithographic printing plate precursor.

As the result of intensive investigations to achieve the above-described object, the inventors have found that a lithographic printing plate precursor which is excellent in all of the printing durability, ink-receptive property and on-machine development property can be obtained by using a specific polymer having an ammonium structure to complete the present invention.

Specifically, the present invention includes the following items.

(1) A lithographic printing plate precursor comprising a protective layer containing a stratiform compound and containing a polymer containing as a repeating unit, a structural unit having an ammonium structure in at least one of an image-recording layer and the protective layer.

(2) The lithographic printing plate precursor as described in (1) above, wherein the structural unit having an ammonium structure is a structure represented by the following formula (1):

(1)

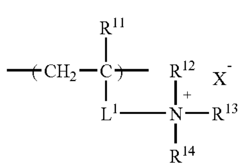

In formula (1), $R^{11}$ represents a hydrogen atom, an alkyl group or a halogen atom, $L^1$ represents a single bond or a divalent connecting group, $R^{12}$, $R^{13}$ and $R^{14}$ each independently represents a hydrogen atom, an alkyl group, an aryl group, a heterocyclic group or an alkylidene group, or at lest two of $R^{12}$, $R^{13}$ and $R^{14}$ may be combined with each other to form a ring, and $X^-$ represents a counter ion necessary for neutralizing a charge.

(3) The lithographic printing plate precursor as described in (2) above, wherein the divalent connecting group represented by $L^1$ in formula (1) is a group containing at least one group selected from a phenylene group, a carbonyloxy group and a carbonylimino group.

(4) The lithographic printing plate precursor as described in (2) or (3) above, wherein the counter ion represented by $X^-$ in formula (1) is at least one anion selected from a halide ion, a carboxylate ion, an alkylsulfonate ion, an arylsulfonate ion, an alkylsulfate ion, a sulfate ion, a phosphate ion, an alkylphosphate ion, a phosphonate ion, $PF_6^-$ and $BF_4^-$.

(5) The lithographic printing plate precursor as described in any one of (1) to (4) above, wherein the polymer containing as a repeating unit, a structural unit having an ammonium structure further contains a structural unit represented by the following formula (2):

(2)

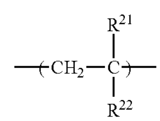

In formula (2), $R^{21}$ represents a hydrogen atom, an alkyl group or a halogen atom, and $R^{22}$ represents an ester group, an amido group, a cyano group, a hydroxy group or an aryl group.

(6) The lithographic printing plate precursor as described in (5) above, wherein $R^{22}$ represents an ester group, an amido group or a phenyl group which may have a substituent.

(7) The lithographic printing plate precursor as described in (5) or (6) above, wherein $R^{22}$ represents a group containing a polyalkyleneoxy group.

(8) The lithographic printing plate precursor as described in any one of (1) to (7) above, wherein the polymer containing as a repeating unit, a structural unit having an ammonium structure further contains an ethylenically unsaturated group in its side chain.

(9) The lithographic printing plate precursor as described in (8) above, wherein the ethylenically unsaturated group is a group represented by the following formula (3):

(3)

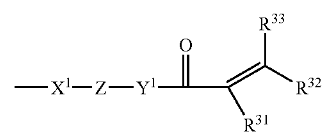

In formula (3), $R^{31}$ to $R^{33}$ each independently represents a hydrogen atom, an alkyl group or a halogen atom, $X^1$ and $Y^1$ each independently represents a single bond or a divalent connecting group, and Z represents a connecting group represented by formula (4) or (5) shown below:

(4)

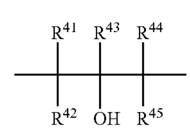

(5)

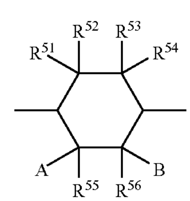

In formula (4), $R^{41}$ to $R^{45}$ each independently represents a hydrogen atom, an alkyl group or a halogen atom, and in formula (5), $R^{51}$ to $R^{56}$ each independently represents a hydrogen atom or a substituent, and A and B each independently represents a hydrogen atom, an alkyl group, a hydroxy group or a halogen atom, provided that at least one of A and B is a hydroxy group.

(10) The lithographic printing plate precursor as described in any one of (1) to (9) above, wherein the polymer containing as a repeating unit, a structural unit having an ammonium structure is contained in the image-recording layer.

(11) The lithographic printing plate precursor as described in any one of (1) to (9) above, wherein the polymer containing as a repeating unit, a structural unit having an ammonium structure is contained in the image-recording layer and the protective layer.

(12) The lithographic printing plate precursor as described in any one of (1) to (11) above which further comprises an undercoat layer, wherein the polymer containing as a repeating unit, a structural unit having an ammonium structure is contained in the undercoat layer, the image-recording layer and the protective layer.

(13) The lithographic printing plate precursor as described in any one of (1) to (12) above, wherein the image-recording layer contains (A) a sensitizing dye, (B) a polymerization initiator, and (C) a polymerizable monomer.

(14) The lithographic printing plate precursor as described in (13) above, wherein the sensitizing dye (A) is an infrared absorbing agent.

(15) The lithographic printing plate precursor as described in any one of (1) to (14) above, wherein the image-recording layer further contains a binder polymer.

(16) The lithographic printing plate precursor as described in any one of (1) to (15) above, wherein the image-recording layer further contains a microcapsule or a microgel.

(17) The lithographic printing plate precursor as described in any one of (1) to (16) above, wherein the image-recording layer is capable of being removed with printing ink and/or dampening water.

(18) A lithographic printing method comprising either exposing imagewise the lithographic printing plate precursor as described in (17) above with a laser and then loading the described lithographic printing plate precursor on a printing machine or loading the lithographic printing plate precursor as described in (17) above on a printing machine and then exposing imagewise the lithographic printing plate precursor with a laser, thereafter supplying printing ink and dampening water to the exposed lithographic printing plate precursor to perform on-machine development processing thereby conducting printing.

(19) The lithographic printing method as described in (18) above, wherein the laser is an infrared laser.

According to the present invention, a lithographic printing plate precursor which can be efficiently form an image by laser exposure and which is excellent in ink-receptive property and on-machine development property while maintaining printing durability in an excellent level, and a lithographic printing method using the lithographic printing plate precursor can be provided.

BRIEF DESCRIPTION OF THE DRAWINGS

FIG. 1 is an illustration for showing a structure of an automatic development processor.

| [Description of reference numerals and signs] | |
|---|---|
| 1: | Rotating brush roller |
| 2: | Backing roller |
| 3: | Transport roller |
| 4: | Transport guide plate |
| 5: | Spray pipe |
| 6: | Pipe line |
| 7: | Filter |
| 8: | Plate supply table |
| 9: | Plate discharge table |
| 10: | Developer tank |
| 11: | Circulating pump |
| 12: | Plate |

DETAILED DESCRIPTION OF THE INVENTION

Lithographic Printing Plate Precursor

The lithographic printing plate precursor according to the invention comprises an image-recording layer and a protective layer on a support in this order, contains a stratiform compound in the protective layer and contains a polymer containing as a repeating unit, a structural unit having an ammonium structure in at least one of the image-recording layer and protective layer. The invention will be described in more detail below.

Polymer Containing Structural Unit Having Ammonium Structure

As the polymer containing as a repeating unit, a structural unit having an ammonium structure (hereinafter, also referred to as a "specific polymer") according to the invention, any polymer containing a structural unit having an ammonium structure may be used without particular limitation. The ammonium structure may be a chainlike structure (for example, an alkylammonium, a dialkylammonium, a trialkylammonium or a tetraalkylammonium) or a cyclic structure (for example, pyridinium or imidazolinium).

As the specific polymer according to the invention, any of an addition polymer, a polycondensation polymer, a polyaddition polymer and a ring-opening polymer may be used without particular limitation and an addition polymer is preferable.

<Repeating Unit Having Ammonium Structure>

The specific polymer according to the invention preferably contains a repeating unit represented by the following formula (1):

(1)

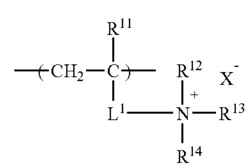

In formula (1), $R^{11}$ represents a hydrogen atom or a substituent, $L^1$ represents a single bond or a divalent connecting group, $R^{12}$, $R^{13}$ and $R^{14}$ each independently represents a hydrogen atom or a substituent, and $X^-$ represents a counter ion necessary for neutralizing a charge.

$R^{11}$ will be described in detail below. In formula (1), $R^{11}$ represents a hydrogen atom or a substituent. $R^{11}$ preferably represents a hydrogen atom, an alkyl group, an aryl group, a substituted carbonyl group, a substituted oxy group, a heterocyclic group or a halogen atom, more preferably represents a hydrogen atom, an alkyl group or a halogen atom, particularly a hydrogen atom or an alkyl group.

The alkyl group represented by $R^{11}$ is preferably includes a straight-chain, branched or cyclic alkyl group having from 1 to 20 carbon atoms. Of the alkyl groups, a straight-chain alkyl group having from 1 to 12 carbon atoms, a branched alkyl group having from 3 to 12 carbon atoms and a cyclic alkyl group having from 5 to 10 carbon atoms are more preferred. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group.

The aryl group represented by $R^{11}$ includes a substituted or unsubstituted aryl group preferably having from 5 to 20 carbon atoms, more preferably having from 6 to 18 carbon atoms, particularly preferably having from 6 to 12 carbon atoms. The aryl group represented by $R^{11}$ may have a substituent.

Preferable examples of the aryl group include a phenyl group, a 4-methylphenyl group, a 4-methoxyphenyl group, a 4-chlorophenyl group, a 4-(dimethylamino)phenyl group, 1-naphthyl group, a 2-naphthyl group, a biphenyl group, a xylyl group, a mesityl group, a cumenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group.

The heterocyclic group represented by $R^{11}$ is preferably a 3-membered to 8-membered heterocyclic group, more preferably a 3-membered to 6-membered heterocyclic group, particularly preferably a 5-membered to 6-membered heterocyclic group. The kind of the hetero atom constituting the hetero ring preferably includes a nitrogen atom, an oxygen atom and a sulfur atom. The heterocyclic group represented by $R^{11}$ may have a substituent.

Preferable examples of the heterocyclic group include a pyrrole ring group, a furan ring group, a thiophene ring group, a benzopyrrole ring group, a benzofuran ring group, a benzothiophene ring group, a pyrazole ring group, an isoxazole ring group, an isothiazole ring group, an indazole ring, a benzisoxazole ring group, a benzisothiazole ring group, an imidazole group, an oxazole ring group, a thiazole ring group, a benzimidazole group, a benzoxazole ring group, a benzothiazole ring group, a pyridine ring group, a quinoline ring group, an isoquinoline ring group, a pyridazine ring group, a pyridine ring group, a pyrazine ring group, a phthalazine ring group, a quinazoline ring group, a quinoxaline ring group, an aciridine ring group, a phenanthrydine ring group, a carbazole ring group, a purine ring group, a pyrane ring group, a piperidine ring group, a piperazine ring group, a morpholine ring group, an indole ring group, an indolizine ring group, a chromene ring group, a cinnnoline ring group, an acridine ring group, a phenothiazine ring group, a tetrazole ring group and a triazine ring group.

The substituted carbonyl group represented by $R^{11}$ is preferably a group represented by $R^{15}$—CO— (wherein $R^{15}$ represents a hydrogen atom or a substituent). Preferable examples of the substituted carbonyl group represented by $R^{11}$ include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and aryl group in the above-described substituted carbonyl group include those described for the alkyl group, substituted alkyl group, aryl group and substituted aryl group above. Of the substituted carbonyl groups, a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group are more preferable, and a formyl group, an acyl group, an alkoxycarbonyl group and an aryloxycarbonyl group are particularly preferable.

Specific preferable examples of the substituted carbonyl group represented by $R^{11}$ include a formyl group, an acetyl group, a benzoyl group, a carboxyl group, a methoxycarbonyl group, an ethoxycarbonyl group, an allyloxycarbonyl group, a dimethylamiophenylethenylcarbonyl group, a methoxycarbonylmethoxycarbonyl group, an N-methylcarbamoyl group, an N-phenylcarbamoyl group, an N,N-diethylcarbamoyl group and a morpholinocarbonyl group.

The substituted oxy group represented by $R^{11}$ is preferably a group represented by $R^{16}$O— (wherein $R^{15}$ represents a hydrogen atom or a substituent). Preferable examples of the substituted oxy group represented by $R^{11}$ include a hydroxy group, an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. The alkyl group and aryl group in the above-described substituted oxy group include those described for the alkyl group, substituted alkyl group, aryl group and substituted aryl group above. When the substituted oxy group represented by $R^{11}$ is an acyloxy group, specific examples of the acyl group include specific examples of the substituted carbonyl group represented by $R^{11}$ above. Of the substituted oxy groups, an alkoxy group, an aryloxy group, an acyloxy group and an arylsulfoxy group are more preferable.

Specific preferable examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonoxy group and a phosphonatoxy group.

The halogen atom represented by $R^{11}$ is preferably a fluorine atom, a chlorine atom, a bromine atom or an iodine atom, more preferably a fluorine atom, a chlorine atom or a bromine atom, particularly preferably a fluorine atom, a chlorine atom or a bromine atom.

When the group represented by $R^{11}$ is capable of being substituted, the group may have a substituent. As to the substituent, any appropriate group which can be substituted may be selected. Examples of the substituent include an alkyl group, an aryl group, an alkenyl group, an alkynyl group, a halogen atom (for example, a fluorine atom, a chlorine atom, a bromine atom or an iodine atom), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter, referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter, referred to as a phosphonato group), a dialkylphosphono group ($—PO_3(\text{alkyl})_2$) wherein "alkyl" means an alkyl group, hereinafter the same, a diarylphosphono group ($—PO_3(\text{aryl})_2$) wherein "aryl" means an aryl group, hereinafter the same, an alkylarylphosphono group ($—PO_3(\text{alkyl})(\text{aryl})$), a monoalkylphosphono group ($—PO_3H(\text{alkyl})$) and a conjugate base group thereof (hereinafter, referred to as an alkylphosphonato group), a monoarylphosphono group ($—PO_3H(\text{aryl})$) and a conjugate base group thereof (hereinafter, referred to as an arylphosphonato group), a phosphonoxy group ($—OPO_3H_2$) and a conjugate base group thereof (hereinafter, referred to as a phosphonatoxy group), a dialkylphosphonoxy group ($—OPO_3(\text{alkyl})_2$), a diarylphosphonoxy group ($—OPO_3(\text{aryl})_2$), an alkylarylphosphonoxy group ($—OPO_3(\text{alkyl})(\text{aryl})$), a monoalkylphosphonoxy group ($—OPO_3H(\text{alkyl})$) and a conjugate base group thereof (hereinafter, referred to as an alkylphosphonatoxy group), a monoarylphosphonoxy group ($—OPO_3H(\text{aryl})$) and a conjugate base group thereof (hereinafter, referred to as an arylphosphonatoxy group), a cyano group, a nitro group, an aryl group, an alkenyl group, an alkynyl group, a heterocyclic group and a silyl group.

These groups may be combined with each other to from a composite substituent.

$R^{11}$ is particularly preferably a hydrogen atom or a methyl group.

$R^{12}$, $R^{13}$ and $R^{14}$ will be described in detail below. $R^{12}$, $R^{13}$ and $R^{14}$ each independently preferably represents a hydrogen atom, an alkyl group, an aryl group, a heterocyclic group or an alkylidene group, more preferably a hydrogen atom or an alkyl group, particularly preferably an alkyl group. When one of $R^{12}$, $R^{13}$ and $R^{14}$ represents an alkylidene group (that is, a divalent group derived by further eliminating one hydrogen atom from a carbon atom having a free valence in a monovalent hydrocarbon group), one of $R^{12}$, $R^{13}$ and $R^{14}$ is not present because the remainder of the groups capable of being substituted on the nitrogen atom is only one. Alternatively, $R^{12}$, $R^{13}$ and $R^{14}$ may be combined with each other to form a ring.

When $R^{12}$, $R^{13}$ and $R^{14}$ each represents an alkyl group, preferable examples of the alkyl group include a methyl group, an ethyl group, a n-propyl group, an isopropyl group, a cyclopropyl group, a n-butyl group, an isobutyl group, a sec-butyl group, a tert-butyl group, a cyclobutyl group, a n-pentyl group, an isopentyl group, a sec-pentyl group, a tert-pentyl group, a neopentyl group, a cyclopentyl group, a n-hexyl group, an isohexyl group, a sec-hexyl group, a tert-hexyl group, a cyclohexyl group, a cyclohexylmethyl group, a cyclopentylmethyl group, a cyclopropylmethyl group, a cyclohexylmethyl group, a cyclobutylmethyl group, a straight-chain or branched heptyl group, a cyclopentylethyl group, a straight-chain or branched octyl group, a straight-chain or branched nonyl group, a straight-chain or branched decyl group, a dodecyl group, a tetradecyl group, a hexadecyl group, an octadecyl group and an eicosyl group. More preferable examples thereof include a methyl group, an ethyl group, a n-propyl group, an isopropyl group, a cyclopropyl group, a n-butyl group, an isobutyl group, a sec-butyl group, a tert-butyl group, a cyclobutyl group, a n-pentyl group, an isopentyl group, a sec-pentyl group, a tert-pentyl group, a neopentyl group, a cyclopentyl group, a n-hexyl group, an isohexyl group, a sec-hexyl group, a tert-hexyl group, a cyclohexyl group, a cyclohexylmethyl group, a straight-chain or branched heptyl group, a cyclopentylethyl group and a straight-chain or branched octyl group. Particularly preferable examples thereof include a methyl group, an ethyl group, a n-propyl group, an isopropyl group, a cyclopropyl group, a n-butyl group, an isobutyl group, a sec-butyl group, a tert-butyl group, a cyclobutyl group, a n-pentyl group, an isopentyl group, a sec-pentyl group, a tert-pentyl group, a neopentyl group, a cyclopentyl group, a n-hexyl group, an isohexyl group, a sec-hexyl group, a tert-hexyl group and a cyclohexyl group.

The group represented by any one of $R^{12}$, $R^{13}$ and $R^{14}$ may have a substituent. As to the substituent, any appropriate group which can be substituted may be selected. Preferable examples of the substituent include a trifluoromethyl group, a fluoro group, a chloro group, a bromo group, a methoxy group, a hydroxy group, a nitro group, a vinyl group, a dimethylamino group, an aryl group, a methoxycarbonyl group and an ethoxycarbonyl group. More preferable examples thereof include a fluoro group, a chloro group, a bromo group, a methoxy group, a hydroxy group, a vinyl group, a dimethylamino group, a phenyl group, a methoxycarbonyl group and an ethoxycarbonyl group. Particularly preferable examples thereof include a fluoro group, a chloro group, a bromo group, a methoxy group, a hydroxy group, a vinyl group, a phenyl group, a methoxycarbonyl group and an ethoxycarbonyl group. These groups may further be substituted with the substituent in a similar manner.

Preferable examples of the group having a substituent represented by any one of $R^{12}$, $R^{13}$ and $R^{14}$ include a benzyl group, a 4-methylbenzyl group, a 3-methylbenzyl group, a 2-methylbenzyl group, a 4-methoxybenzyl group, a 3-methoxybenzyl group, a 2-methoxybenzyl group, a 4-dimethylaminobenzyl group, a 3,5-dimethylbenzyl group, a 3,4,5-trimethylbenzyl group, a 4-phenylbenzyl group and a 4-phenoxybenzyl group.

More preferable examples thereof include a benzyl group, a 4-methylbenzyl group, a 3-methylbenzyl group, a 2-methylbenzyl group, a 4-methoxybenzyl group, a 3-methoxybenzyl group, a 2-methoxybenzyl group, a 4-dimethylaminobenzyl group and a 3,5-dimethylbenzyl group.

Particularly preferable examples thereof include a benzyl group, a 4-methylbenzyl group, a 3-methylbenzyl group, a 2-methylbenzyl group, a 4-methoxybenzyl group, a 3-methoxybenzyl group, a 2-methoxybenzyl group and a 4-dimethylaminobenzyl group.

All of the groups represented by $R^{12}$, $R^{13}$ and $R^{14}$ may be the same or different from each other, or two of the groups represented by $R^{12}$, $R^{13}$ and $R^{14}$ may be the same, and any appropriate combination of the groups may be selected. $R^{12}$, $R^{13}$ and $R^{14}$ each preferably represents an alkyl group having from 1 to 20 carbon atoms, more preferably 1 to 10 carbon atoms, particularly preferably 1 to 8 carbon atoms. The groups represented by $R^{12}$, $R^{13}$ and $R^{14}$ may be the same or different from each other.

According to the invention, preferable examples of the combination of the groups represented by $R^{12}$, $R^{13}$ and $R^{14}$ include a combination of a methyl group, a methyl group and a methyl group, a combination of a methyl group, a methyl group and a ethyl group, a combination of a methyl group, a methyl group and a propyl group, a combination of a methyl group, a methyl group and an isopropyl group, a combination of a methyl group, a methyl group and a butyl group, a combination of a methyl group, a methyl group and an isobutyl group, a combination of a methyl group, a methyl group and a pentyl group, a combination of a methyl group, a methyl group and a hexyl group, a combination of a methyl group, a methyl group and a benzyl group, a combination of an ethyl group, an ethyl group and a methyl group, a combination of an ethyl group, an ethyl group and a methyl group, a combination of an ethyl group, an ethyl group and an ethyl group, a combination of an ethyl group, an ethyl group and a propyl group, a combination of an ethyl group, an ethyl group and an isopropyl group, a combination of an ethyl group, an ethyl group and a butyl group, a combination of an ethyl group, an ethyl group and an isobutyl group, a combination of an ethyl group, an ethyl group and a pentyl group, a combination of an ethyl group, an ethyl group and a hexyl group and a combination of an ethyl group, an ethyl group and a benzyl group.

More preferable examples of the combination of the groups represented by $R^{12}$, $R^{13}$ and $R^{14}$ include a combination of a methyl group, a methyl group and a methyl group, a combination of a methyl group, a methyl group and a ethyl group, a combination of a methyl group, a methyl group and a propyl group, a combination of a methyl group, a methyl group and an isopropyl group, a combination of a methyl group, a methyl group and a butyl group, a combination of a methyl group, a methyl group and an isobutyl group, a combination of a methyl group, a methyl group and a pentyl group, a combination of a methyl group, a methyl group and a hexyl group and a combination of a methyl group, a methyl group and a benzyl group.

Particularly preferable examples of the combination of the groups represented by $R^{12}$, $R^{13}$ and $R^{14}$ include a combination of a methyl group, a methyl group and a methyl group, a combination of a methyl group, a methyl group and a ethyl group, a combination of a methyl group, a methyl group and a propyl group, a combination of a methyl group, a methyl group and an isopropyl group, a combination of a methyl group, a methyl group and a butyl group, a combination of a methyl group, a methyl group and an isobutyl group and a combination of a methyl group, a methyl group and a pentyl group.

When $R^{12}$, $R^{13}$ and $R^{14}$ each represents an aryl group or a heterocyclic group, preferable examples of the aryl group and heterocyclic group include those described for $R^{11}$ above, respectively.

When $R^{12}$, $R^{13}$ and $R^{14}$ represent an alkylidene group (that is, a divalent group derived by further eliminating one hydrogen atom from a carbon atom having a free valence in a monovalent hydrocarbon group), preferably examples of the alkylidene group include a methylene group, an ethylene group and a propylene group. More preferably, the case wherein the group represented by any one of $R^{12}$, $R^{13}$ and $R^{14}$ is connected to the remainder of the groups capable of being substituted on the nitrogen atom to form a ring (for example, pyridinium, pyrazinium, thiazolium, imidazolinium, oxazolinium, indolinium, isoindolinium or benzimidazolinium) is exemplified.

Examples of the case wherein $R^{12}$, $R^{13}$ and $R^{14}$ are combined with each other to form a ring include the nitrogen-containing hetero ring formed in the case wherein one of $R^{12}$, $R^{13}$ and $R^{14}$ represents an alkylidene group described above and pyrrolidinium, imidazolidinium, piperidinium, piperazinium, morpholinium and indolinium.

$L^1$ will be described below. $L^1$ represents a single bond or a divalent connecting group.

The divalent connecting group represented by $L^1$ is preferably a divalent group comprising from 1 to 60 carbon atoms, from 0 to 10 nitrogen atoms, from 0 to 50 oxygen atoms, from 1 to 100 hydrogen atoms and from 0 to 20 sulfur atoms.

More specifically, $L^1$ includes the divalent groups shown below and groups comprising an appropriate combination of these groups.

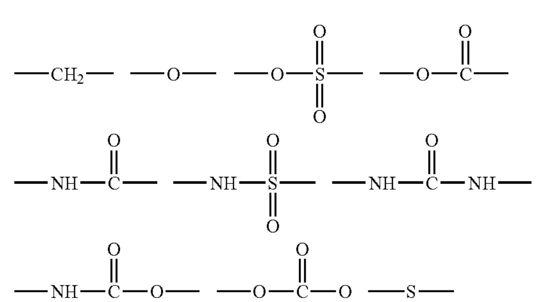

-continued

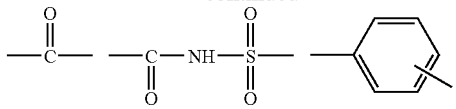

More preferable examples of the divalent connecting group represented by $L^1$ include the divalent groups represented by the structural formulae shown below.

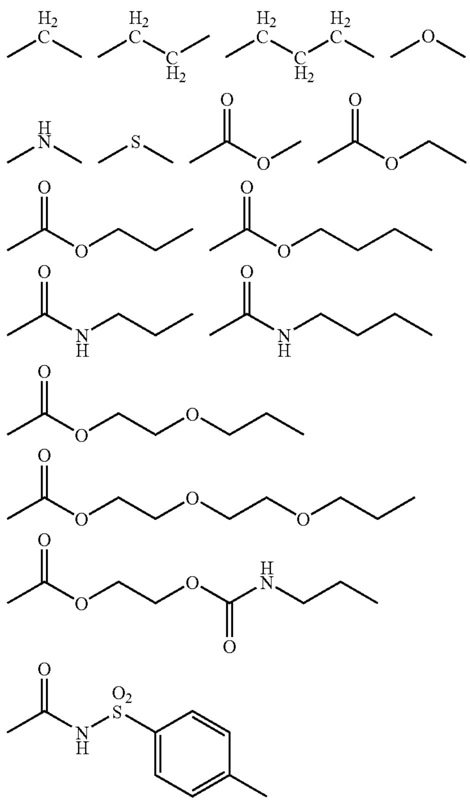

$X^-$ will be described below. $X^-$ represents a counter ion necessary for neutralizing a charge.

$X^-$ is preferably a halide ion (for example, $F^-$, $Cl^-$, $Br^-$ or $I^-$), a carboxylate ion having from 1 to 100 carbon atoms, an alkylsulfonate ion having from 1 to 100 carbon atoms, an arylsulfonate ion having from 6 to 100 carbon atoms, an alkylsulfate ion having from 1 to 100 carbon atoms, a sulfate ion, a hydrogen sulfate ion, a sulfite ion, a hydrogen sulfite ion, a phosphate ion, a hydrogen phosphate ion, an alkylphosphate ion having from 1 to 100 carbon atoms, an arylphosphate ion having from 6 to 100 carbon atoms, an alkylphosphonate ion having from 1 to 100 carbon atoms, an arylphosphonate ion having from 6 to 100 carbon atoms, a hydroxide ion, a carbonate ion, a hydrogen carbonate ion, $PF_6^-$, $BF_4^-$, $B(C_6F_5)_4^-$, and a combination thereof.

$X^-$ is more preferably a halide ion (for example, $F^-$, $Cl^-$ or $Br^-$), a carboxylate ion having from 1 to 70 carbon atoms, an alkylsulfonate ion having from 1 to 70 carbon atoms, an arylsulfonate ion having from 6 to 70 carbon atoms, an alkylsulfate ion having from 1 to 70 carbon atoms, a sulfate ion, a phosphate ion, an alkylphosphate ion having from 1 to 70 carbon atoms, an alkylphosphonate ion having from 1 to 70 carbon atoms, an arylphosphonate ion having from 6 to 70 carbon atoms, $PF_6^-$, $BF_4^-$ and a combination thereof.

$X^-$ is particularly preferably a carboxylate ion having from 1 to 50 carbon atoms, an alkylsulfonate ion having from 1 to 50 carbon atoms, an arylsulfonate ion having from 6 to 50 carbon atoms, an alkylsulfate ion having from 1 to 50 carbon atoms, a sulfate ion, a phosphate ion, an alkylphosphate ion having from 1 to 50 carbon atoms, an alkylphosphonate ion having from 1 to 50 carbon atoms, an arylphosphonate ion having from 6 to 50 carbon atoms, $PF_6^-$, $BF_4^-$ and a combination thereof.

When $X^-$ represents a carboxylate ion, an alkylsulfonate ion, an arylsulfonate ion, an alkylsulfate ion, an alkylphosphate ion, an alkylphosphonate or an arylphosphonate ion, preferable examples of these groups are set forth below, but the invention should not be construed as being limited thereto.

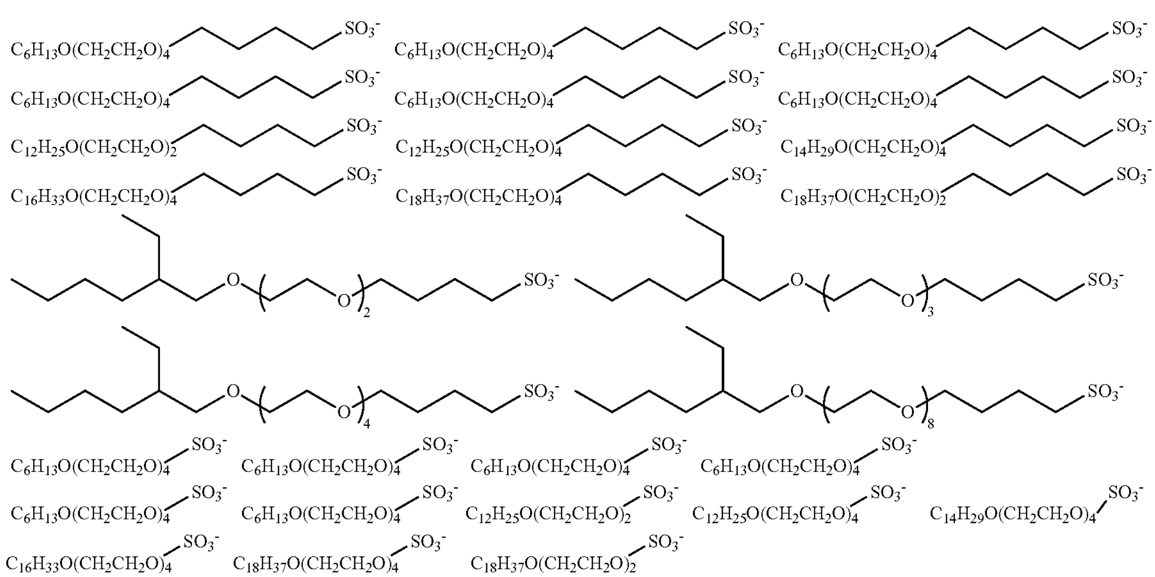

-continued

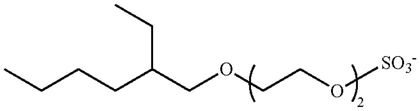
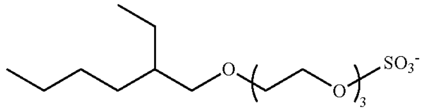
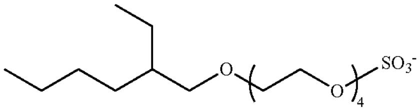
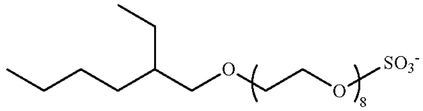

$CH_3SO_3^-$ $C_2H_5SO_3^-$ $C_3H_7SO_3^-$ $C_4H_9SO_3^-$ $C_6H_{13}SO_3^-$ $C_8H_{17}SO_3^-$ $C_{12}H_{25}SO_3^-$ $C_{14}H_{29}SO_3^-$ $C_{16}H_{33}SO_3^-$ $C_{18}H_{37}SO_3^-$ $C_{20}H_{41}SO_3^-$ $C_{22}H_{45}SO_3^-$

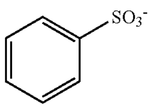
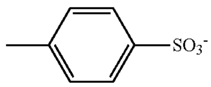
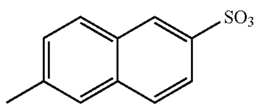
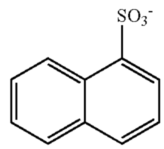

$CH_3CO_2^-$ $C_2H_5CO_2^-$ $C_3H_7CO_2^-$ $C_4H_9CO_2^-$ $C_6H_{13}CO_2^-$ $C_8H_{17}SO_2^-$ $C_{12}H_{25}CO_2^-$ $C_{14}H_{29}CO_2^-$ $C_{16}H_{33}CO_2^-$ $C_{18}H_{37}CO_2$ $C_{20}H_{41}CO_2^-$ $C_{22}H_{45}CO_2^-$

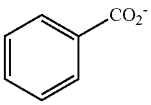
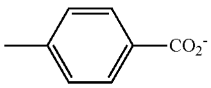
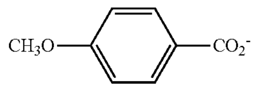
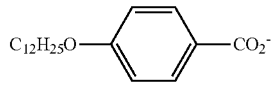

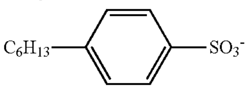
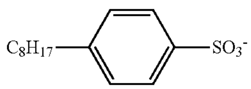
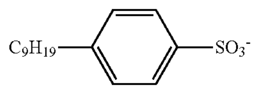
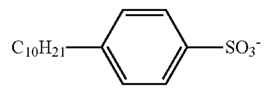

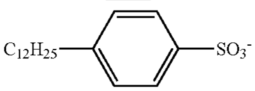
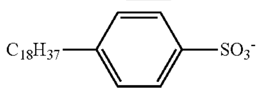
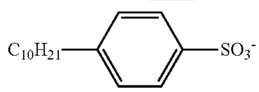
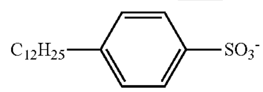

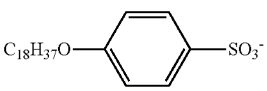
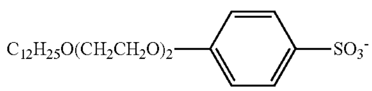
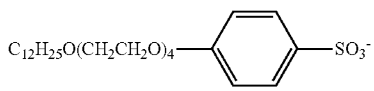

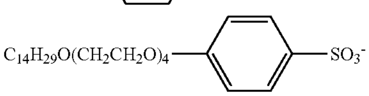
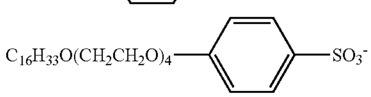
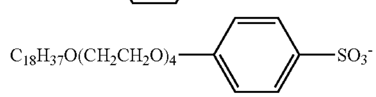

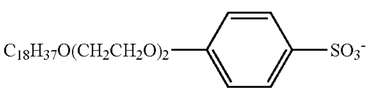
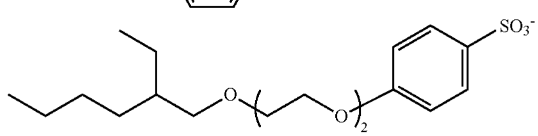

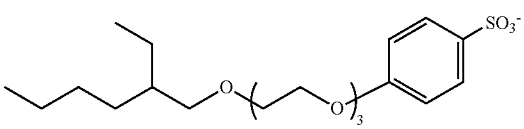
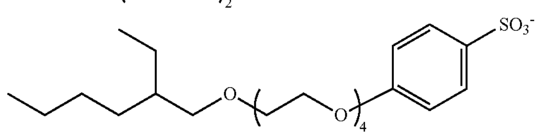

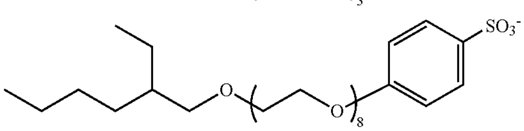

$CH_3OPO_3^{2-}$ $C_2H_5OPO_3^{2-}$ $C_3H_7OPO_3^{2-}$ $C_4H_9OPO_3^{2-}$ $C_6H_{13}OPO_3^{2-}$ $C_8H_{17}OPO_3^{2-}$ $C_{12}H_{25}OPO_3^{2-}$ $C_{14}H_{29}OPO_3^{2-}$ $C_{16}H_{33}OPO_3^{2-}$ $C_{18}H_{37}OPO_3^{2-}$ $C_{20}H_{41}OPO_3^{2-}$ $C_{22}H_{45}OPO_3^{2-}$

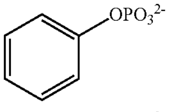
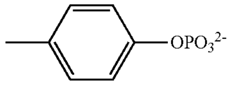
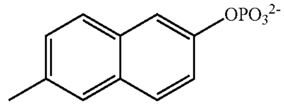

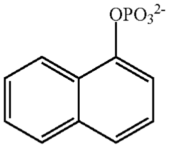

$(CH_3O)_2PO_2^-$ $(C_2H_5O)_2PO_2^-$ $(C_3H_7O)_2PO_2^-$ $(C_4H_9O)_2PO_2^-$ $(C_6H_{13}O)_2PO_2^-$ $(C_8H_{17}O)_2PO_2^-$ $(C_{12}H_{25}O)_2PO_2^-$ $(C_{14}H_{29}O)_2PO_2^-$ $(C_{16}H_{33}O)_2PO_2^-$ $(C_{18}H_{37}O)_2PO_2^-$ $(C_{20}H_{41}O)_2PO_2^-$ $(C_{22}H_{45}O)_2PO_2^-$ $C_{12}H_{25}O(CH_2CH_2O)_2PO_3^{2-}$ $C_{12}H_{25}O(CH_2CH_2O)_4PO_3^{2-}$ $C_{14}H_{29}O(CH_2CH_2O)_4PO_3^{2-}$ $C_{16}H_{33}O(CH_2CH_2O)_4PO_3^{2-}$ $C_{18}H_{37}O(CH_2CH_2O)_4PO_3^{2-}$

-continued
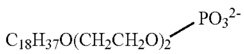 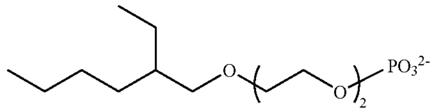 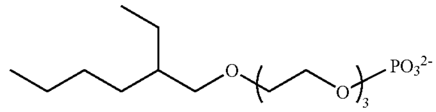
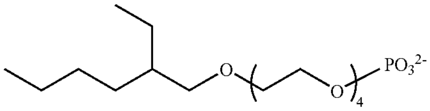 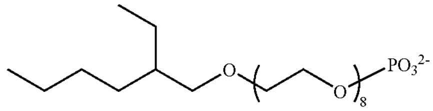 $CH_3PO_3^{2-}$ $C_2H_5PO_3^{2-}$
$C_3H_7PO_3^{2-}$ $C_4H_9PO_3^{2-}$ 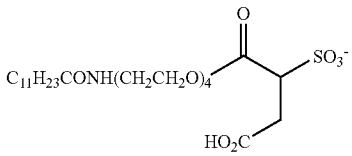 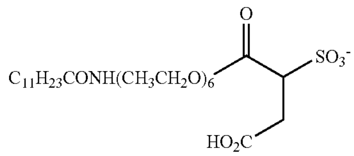
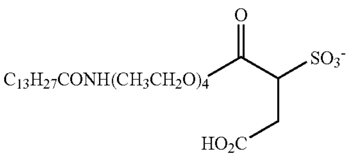 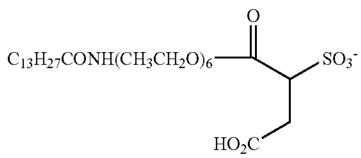 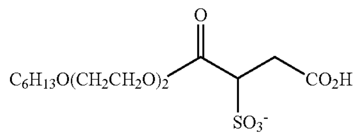
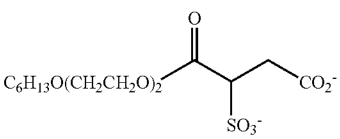 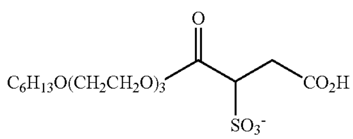 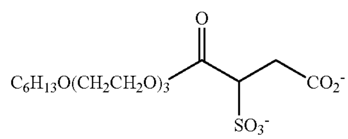
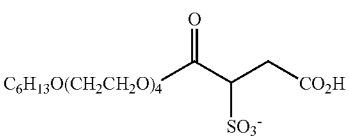 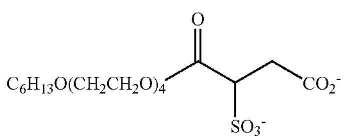 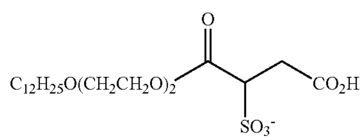
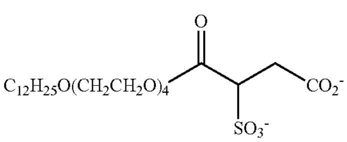 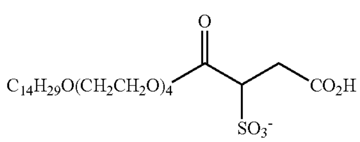 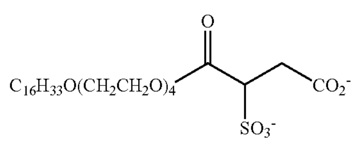
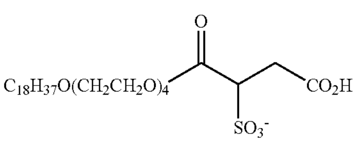 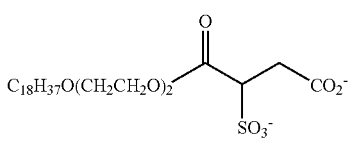
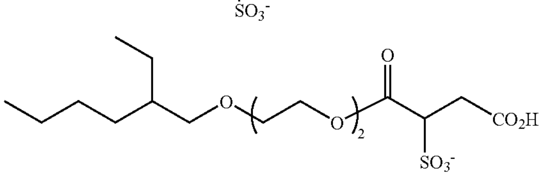 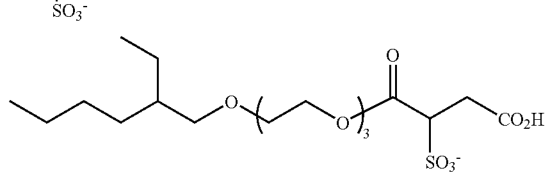
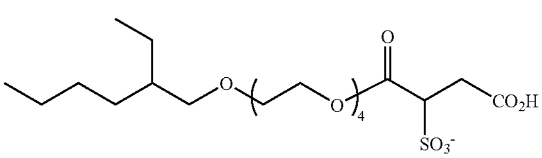 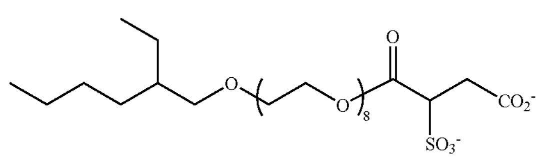
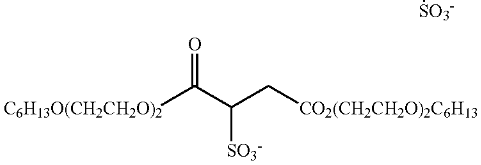 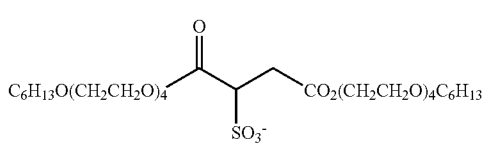
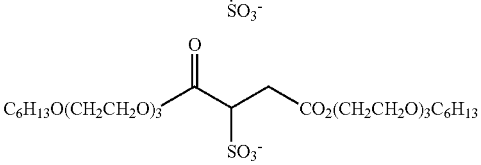 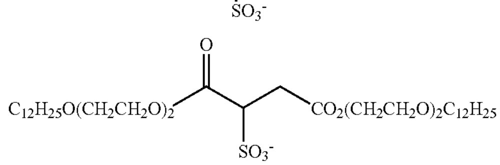

-continued

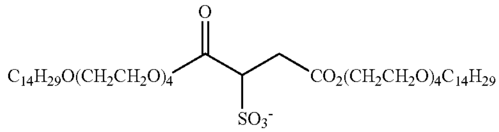

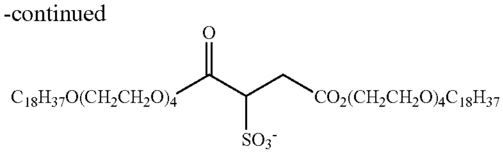

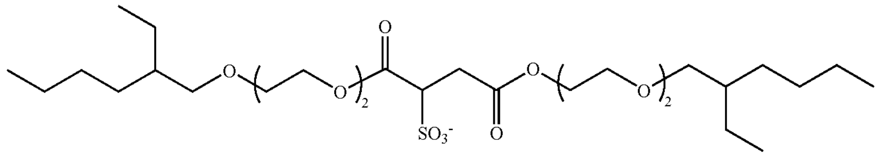

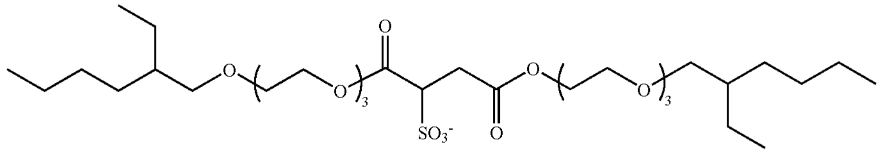

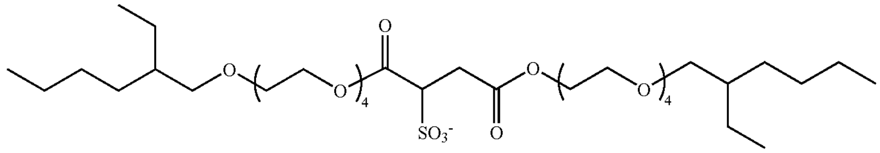

The repeating unit having an ammonium structure according to the invention more preferably has a structure represented by formula (6), (7) or (8) shown below.

(6)

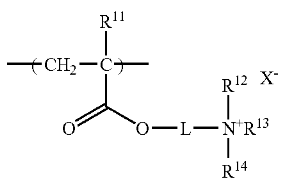

(7)

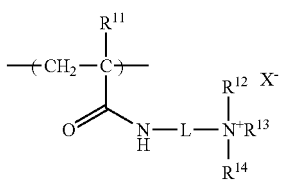

(8)

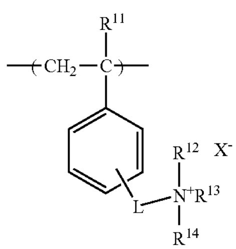

In formulae (6), (7) and (8), $R^{11}$, $R^{12}$, $R^{13}$, $R^{14}$ and $X^-$ have the same meaning as $R^{11}$, $R^{12}$, $R^{13}$, $R^{14}$ and $X^-$ in formula (1), respectively, and L has the same meaning as $L^1$ in formula (1).

As the repeating unit having an ammonium structure according to the invention, in addition to the repeating unit represented by formula (1) as in the case wherein the specific polymer is an addition polymer, repeating units in which an ammonium group is introduced into a side chain of monomer unit in case wherein the specific polymer is a polycondensation polymer (for example, polyester), a polyaddition polymer (for example, polyurethane) or a ring-opening polymer are also preferably exemplified. In the case wherein the specific polymer is polyurethane, a structural unit in which an ammonium group is introduced into a side chain of structural unit derived from a diisocyanate or diol, for example, a structural unit derived from a diol having an ammonium group in a side chain is preferably exemplified.

The structural unit having an ammonium structure included in the specific polymer according to the invention may be composed of a single kind or plural kinds.

(Copolymerization Component>

The specific polymer according to the invention may contain a copolymerization component as long as the effects of the invention are not damaged for the purpose of improving various performances, for example, image strength. A structure of preferable copolymerization component includes a structure represented by formula (2) shown below.

(2)

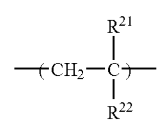

In formula (2), $R^{21}$ represents a hydrogen atom or a substituent, and $R^{22}$ represents a substituent.

Preferable examples of $R^{21}$ include the preferable examples of $R^{11}$ in formula (1). Preferable examples of $R^{22}$ include an ester group, an amido group, a cyano group, a hydroxy group or an aryl group. Among them, an ester group, an amido group or a phenyl group which may have a substituent is preferable.

Examples of the substituent for the phenyl group include the substituents for $R^{12}$ to $R^{14}$ in formula (1), an alkyl group, an aralkyl group an alkoxy group and an acetoxymethyl group. The substituent for the phenyl group may further have a substituent.

The copolymerization component represented by formula (2) includes, for example, an acrylate, a methacrylate, an acrylamide, a methacrylamide, an N-substituted acrylamide, an N-substituted methacrylamide, an N,N-disubstituted acrylamide, an N,N-disubstituted methacrylamide, a styrene, an acrylonitrile and a methacrylonitrile. Preferably, an acrylate, a methacrylate, an acrylamide, a methacrylamide, an N-substituted acrylamide, an N-substituted methacrylamide, an N,N-disubstituted acrylamide, an N,N-disubstituted methacrylamide and a styrene are exemplified.

Specifically, an acrylate, for example, an alkyl acrylate (in which the alkyl group preferably has from 1 to 20 carbon atoms) (for example, methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or teterahydrofurfuryl acrylate), an aryl acrylate (for example, phenyl acrylate), a methacrylate, for example, an alkyl methacrylate (in which the alkyl group preferably has from 1 to 20 carbon atoms) (for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or teterahydrofurfuryl methacrylate), an aryl methacrylate (for example, phenyl methacrylate, cresyl methacrylate or naphthyl methacrylate), a styrene, for example, styrene, an alkylstyrene (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (for example, methoxystyrene, 4-methoxy-3-methylstyrene or dimethoxystyrene) or a halogenostyrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile, methacrylonitrile, acrylic acid, and a radical polymerizable compound having a carboxylic acid (for example, acrylic acid, methacrylic acid, itaconic acid, p-carboxystyrene or a metal salt or an ammonium salt thereof) are exemplified.

The structural unit represented by formula (2) preferably contains a polyalkyleneoxy group in the structural unit. Examples of the polyalkyleneoxy group include groups represented by formulae $—O(CH_2CH_2—O—)_n—R^{23}$, $—O—(CH(CH_3)CH_2—O—)_n—R^{23}$ and $—O—(CH_2CH(CH_3)—O—)_n—R^{23}$. In the above formulae, n represents a number preferably from 1 to 10, more preferably from 1 to 6, still more preferably from 1 to 4, particularly preferably from 1 to 2. n means a single number or an average value when plural alkyleneoxy groups having different numbers are used. $R^{23}$ represents a substituent preferably having from 1 to 30 carbon atoms, more preferably from 1 to 20 carbon atoms, still more preferably from 1 to 10 carbon atoms, particularly preferably from 1 to 10 carbon atoms.

Examples of the substituent represented by $R^{23}$ include a methyl group, an ethyl group, a n-propyl group, an isopropyl group, a cyclopropyl group, a n-butyl group, an isobutyl group, a sec-butyl group, a tert-butyl group, a cyclobutyl group, a n-pentyl group, an isopentyl group, a sec-pentyl group, a tert-pentyl group, a neopentyl group, a cyclopentyl group, a n-hexyl group, an isohexyl group, a sec-hexyl group, a tert-hexyl group, a cyclohexyl group, a cyclohexylmethyl group, a cyclopentylmethyl group, a cyclopropylmethyl group, a cyclohexylmethyl group, a cyclobutylmethyl group, a straight-chain or branched heptyl group, a cyclopentylethyl group, a straight-chain or branched octyl group, a straight-chain or branched nonyl group, a straight-chain or branched decyl group, a dodecyl group, a tetradecyl group, a hexadecyl group, an octadecyl group and an eicosyl group. More preferable examples thereof include a methyl group, an ethyl group, a n-propyl group, an isopropyl group, a cyclopropyl group, a n-butyl group, an isobutyl group, a sec-butyl group, a tert-butyl group, a cyclobutyl group, a n-pentyl group, an isopentyl group, a sec-pentyl group, a tert-pentyl group, a neopentyl group, a cyclopentyl group, a n-hexyl group, an isohexyl group, a sec-hexyl group, a tert-hexyl group, a cyclohexyl group, a cyclohexylmethyl group, a straight-chain or branched heptyl group, a cyclopentylethyl group and a straight-chain or branched octyl group. Particularly preferable examples thereof include a methyl group, an ethyl group, a n-propyl group, an isopropyl group, a n-butyl group, an isobutyl group, a sec-butyl group, a n-hexyl group and a straight-chain or branched octyl group.

<Copolymerization Component Having Polymerizable Group>

The specific polymer according to the invention may further contain an ethylenically unsaturated group in the side chain thereof.

The term "ethylenically unsaturated group" as used herein means a known appropriate group having a substituted or unsubstituted ethylene group. Preferable examples of the ethylenically unsaturated group include an acryloyl group, a methacryloyl group, a styryl group, an allyl group, a vinyl group, an acrylonitrile group, a methacrylonitrile group, a maleic acid structure, a maleimide structure and a cinnamic acid structure.

The ethylenically unsaturated group and the main chain of the polymer may be connected with an appropriate connecting group. Preferable examples of the connecting group include the connecting groups represented by $L^1$ in formula (1) above.

When the specific polymer according to the invention contains an ethylenically unsaturated group in the side chain thereof, the ethylenically unsaturated group preferably has a structure represented by formula (3) shown below.

(3)

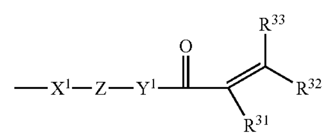

In formula (3), $R^{31}$ to $R^{33}$ each independently represents a hydrogen atom or a substituent, $X^1$ and $Y^1$ each independently represents a single bond or a divalent connecting group, and Z represents a connecting group represented by formula (4) or (5) shown below:

(4)

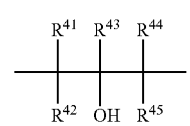

-continued

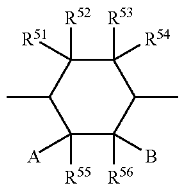

(5)

In formula (4), $R^{41}$ to $R^{45}$ each independently represents a hydrogen atom or a monovalent substituent, and in formula (5), $R^{51}$ to $R^{56}$ each independently represents a hydrogen atom or a monovalent substituent, and A and B each independently represents a hydrogen atom or a monovalent substituent, provided that at least one of A and B is a hydroxy group, and preferably each independently represents a hydrogen atom, an alkyl group, a hydroxy group or a halogen atom, provided that at least one of A and B is a hydroxy group.

As to the substituent represented by any one of $R^{31}$ to $R^{33}$ in formula (3), any appropriate group which can be substituted may be selected. Preferable examples of the substituent include a halogen atom (for example, a fluorine atom, a chlorine atom, a bromine atom or an iodine atom), an amino group, a substituted amino group, a substituted carbonyl group, a substituted oxy group, a mercapto group, a substituted thio group, a silyl group, a nitro group, a cyano group, an alkyl group, an alkenyl group, an alkynyl group, an aryl group, a heterocyclic group, a sulfo group, a substituted sulfonyl group, a sulfonato group, a substituted sulfinyl group, a phosphono group, a substituted phosphono group, a phosphonato group and a substituted phosphonato group.

More preferable examples of the substituent for $R^{31}$ to $R^{33}$ include the preferable examples of $R^{11}$ in formula (1).

$R^{31}$ is particularly preferably a hydrogen atom or a methyl group, and $R^{32}$ and $R^{33}$ is each particularly preferably a hydrogen atom.

In formula (3), $X^1$ represents a connecting group connecting the main chain skeleton of the specific polymer to the group represented by Z. Preferable examples of $X^1$ and $Y^1$ include the preferable examples of $L^1$ in formula (1).

Preferable examples of $R^{41}$ to $R^{45}$ and $R^{51}$ to $R^{56}$ in formulae (4) and (5) respectively include the preferable examples of $R^{11}$ in formula (1). Each of $R^{41}$ to $R^{45}$ and $R^{51}$ to $R^{56}$ is more preferably a hydrogen atom or an alkyl group, particularly preferably a hydrogen atom an alkyl group having 6 or less carbon atoms (for example, a methyl group, an ethyl group, a propyl group, a butyl group, a pentyl group, a hexyl group, an isopropyl group, an isobutyl group, a sec-butyl group, a tert-butyl group, an isopentyl group, a neopentyl group or a cyclohexyl group).

As to A and B in formula (5), it is particularly preferable that one of A and B is a hydroxy group and the other is a hydrogen atom.

Preferable examples of the structure having an ethylenically unsaturated group in its side chain are set forth below, but the invention should not be construed as being limited thereto.

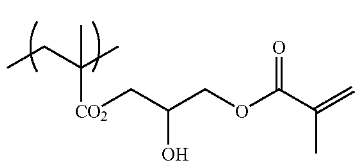

-continued

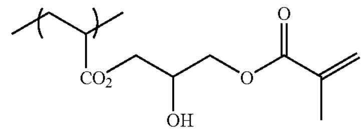

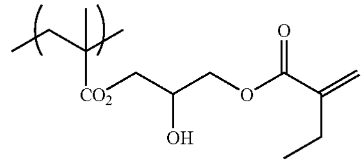

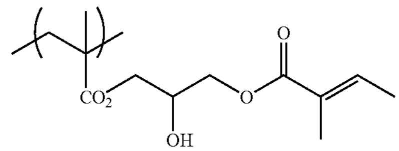

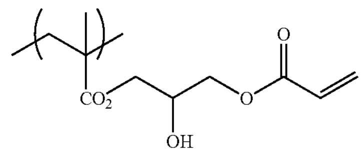

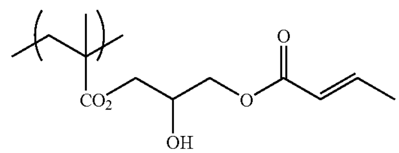

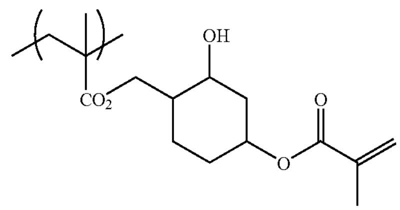

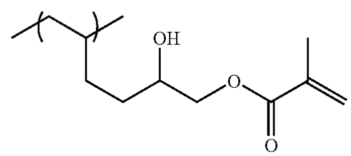

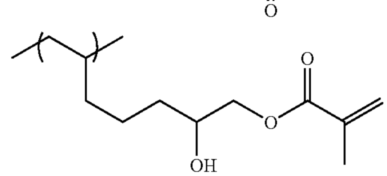

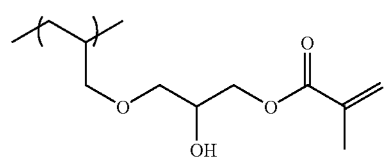

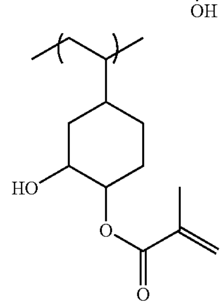

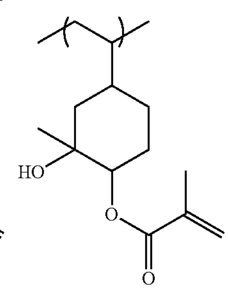

-continued
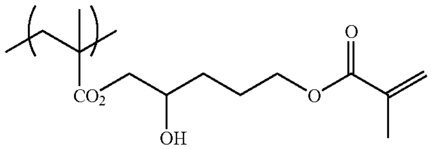
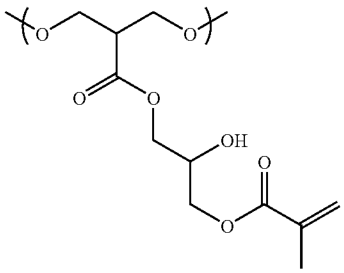
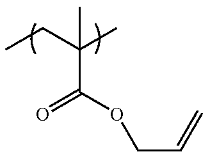
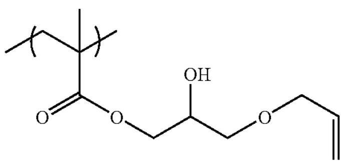
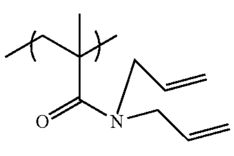
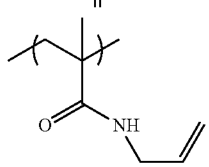
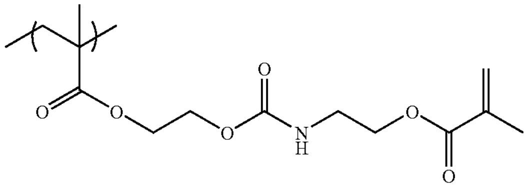
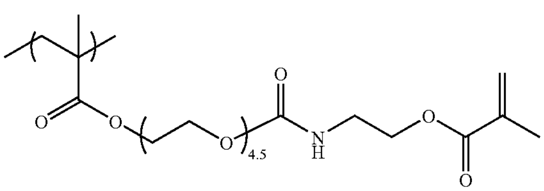
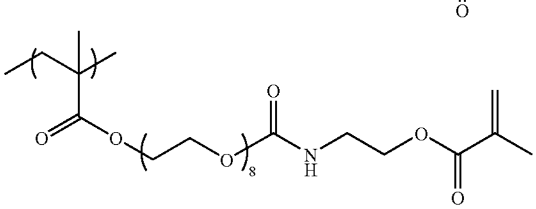
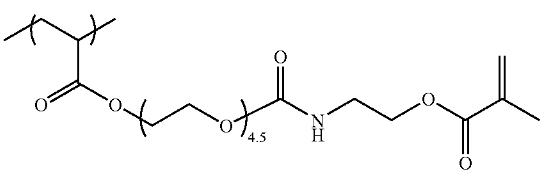
-continued
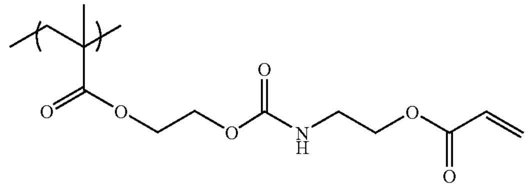
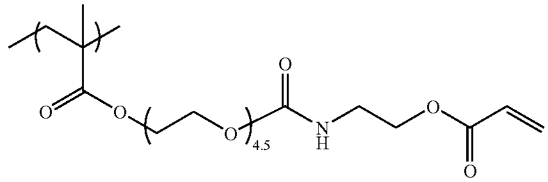
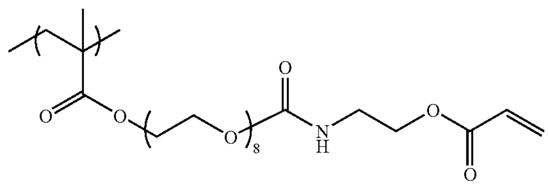
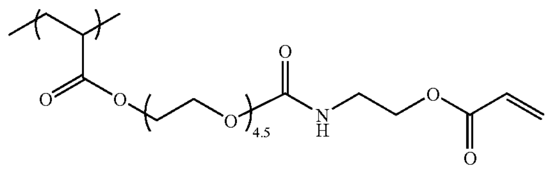
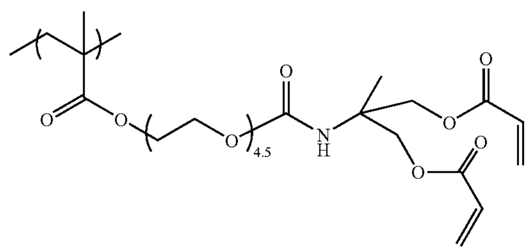
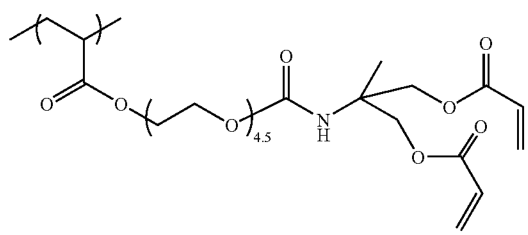
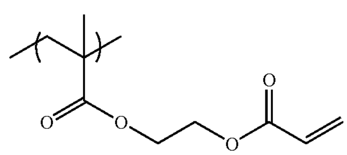
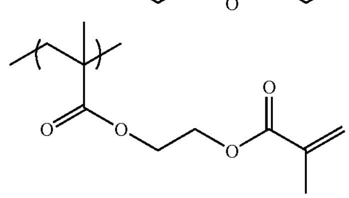
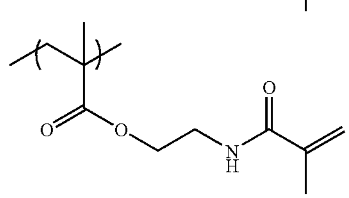

-continued
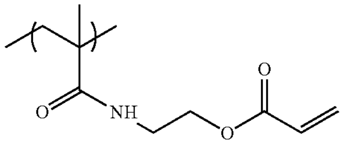
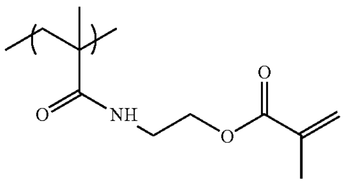
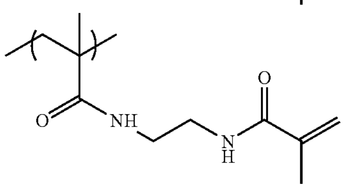
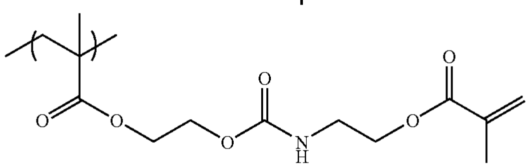
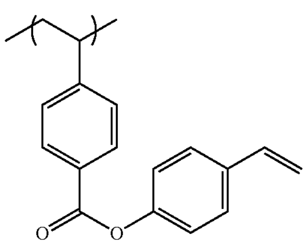
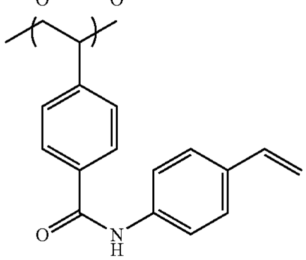
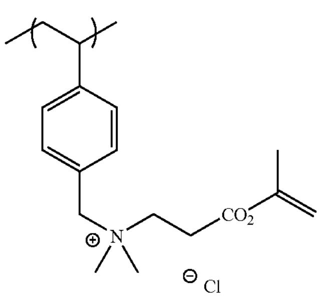
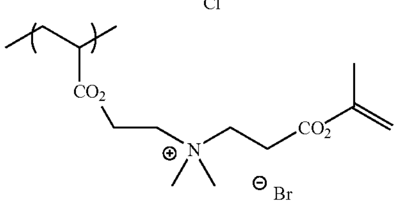
-continued
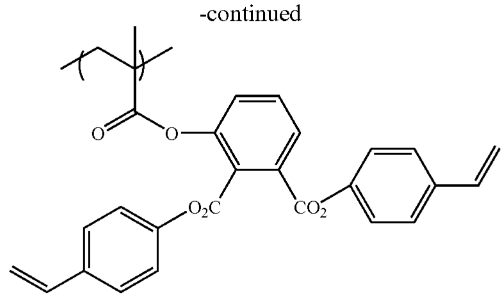
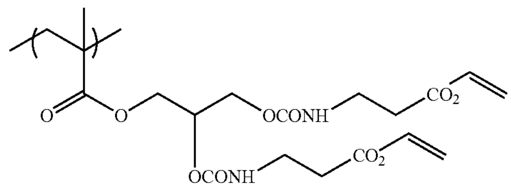
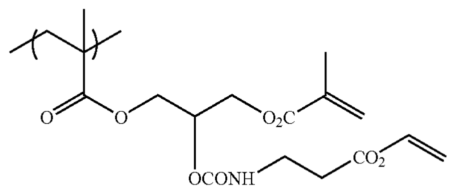
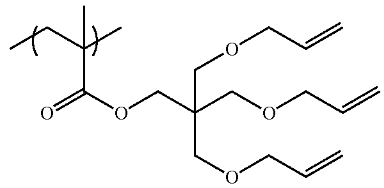
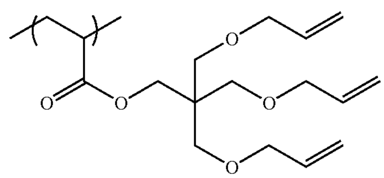
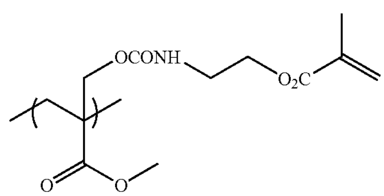
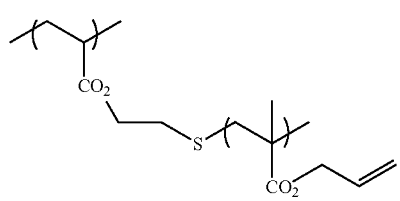
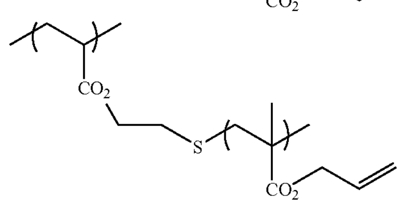

-continued

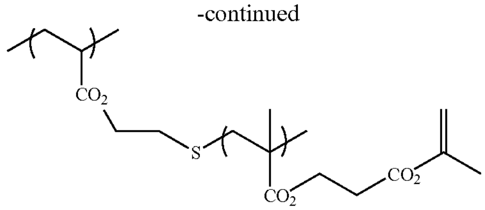

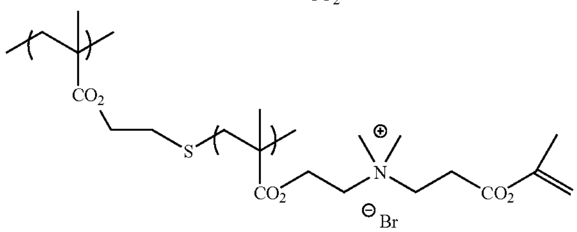

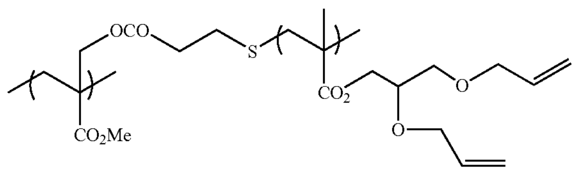

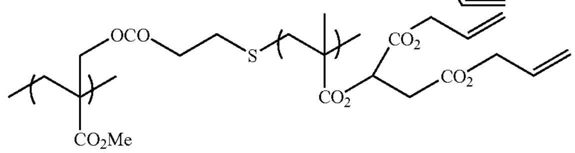

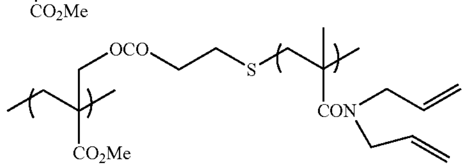

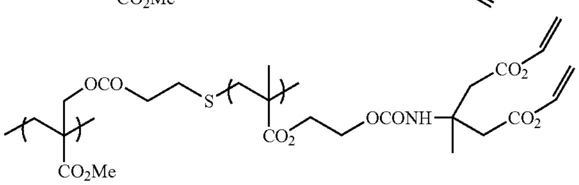

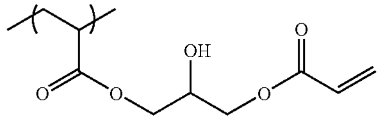

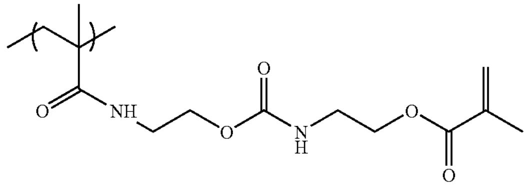

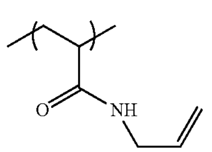

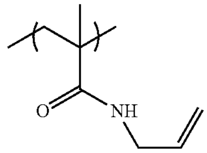

In the specific polymer according to the invention, a ratio of the structural unit having an ammonium structure to the structural unit represented by formula (2) is not particularly limited and it is preferably from 1:99 to 99:1, more preferably from 5:95 to 95:5, still more preferably from 5:95 to 80:20, still further more preferably from 10:90 to 50:50, particularly preferably from 20:80 to 40:60, in a molar ratio. In the range described above, the effect of the invention in that the ink-receptive property and on-machine development property are excellent while maintaining the printing durability is remarkably achieved.

A ratio of the structural unit having an ethylenically unsaturated group in its side chain to the total of the structural unit having an ammonium structure and the structural unit represented by formula (2) is preferably from 1:99 to 50:50, more preferably from 1:99 to 30:70, still more preferably from 1:99 to 20:80, in a molar ratio. In the range described above, the effect of the invention in that the ink-receptive property and on-machine development property are excellent is remarkably achieved and it is also possible to improve the printing durability.

The specific polymer according to the invention may further contain other copolymerization component as long as the effect of the invention is ensured. As the other copolymerization component used in the invention, any copolymerization component capable of forming a two or more component polymer may be used and crotonic acid, maleic acid, maleic anhydride, a partially esterified maleic acid, a partially amidated maleic acid, an aromatic hydrocarbon ring having a vinyl group, a hetero aromatic ring having a vinyl group (for example, vinyl imidazole, vinyl triazole, vinyl carbazole or vinyl pyrrolidone), (meth)acrylonitrile, (meth)crotonitrile, various benzoyloxyethylenes, various acetoxyethylene, a vinyl ketone and a vinyl ether are exemplified.

The number of kinds of other monomers to be copolymerized is not particularly limited and it is preferably from 0 to 12, more preferably from 0 to 8, particularly preferably from 0 to 5.

The specific polymer according to the invention preferably has a reduced specific viscosity value (unit: cSt/g/ml) obtained according to the measuring method described below from 5 to 120, more preferably from 10 to 110, particularly preferably from 15 to 100.

<Measuring Method of Reduced Specific Viscosity>

In a 20 ml measuring flask was weighed 3.33 g (1 g as a solid content) of a 30% polymer solution (30% solution in polymerization solvent) and the measuring flask was filled up to the gauge line with N-methylpyrrolidone. The resulting solution was put into an Ubbelohde viscometer (viscometer constant: 0.010 cSt/s) and a period for running down of the solution at 30° C. was measured. The viscosity was determined in a conventional manner according to the following calculating formula:

$$\text{Kinetic viscosity}=\text{Viscometer constant}\times\text{Period for liquid to pass through a capillary } (sec)$$

Two or more specific polymers according to the invention may be incorporated into the lithographic printing plate precursor.

The specific polymer according to the invention is incorporated into at least one of the image-recording layer and protective layer. It may also be incorporated into both of the image-recording layer and protective layer. Further, it may also be incorporated into an undercoat layer in addition to the image-recording layer and/or protective layer.

The content of the specific polymer according to the invention is preferably from 0.0005 to 30.0% by weight, more preferably from 0.001 to 20.0% by weight, most preferably from 0.002 to 15.0% by weight, based on the total solid content of the layer into which the specific polymer is incorporated. In the range described above, good ink-receptivity is obtained.

Specific examples of the specific polymer according to the invention are set forth below, but the specific polymer according to the invention should not be construed as being limited thereto. The structure and amount added thereof can be appropriately varied depending on the combination with a coating solution component for the preparation of lithographic printing plate precursor.
(1)
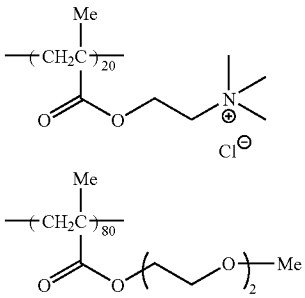
(2)
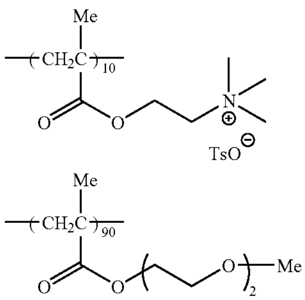
(3)
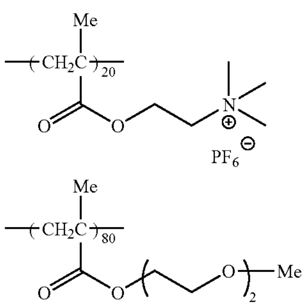
(4)
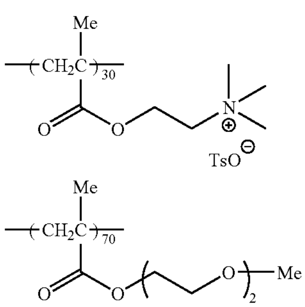
(5)
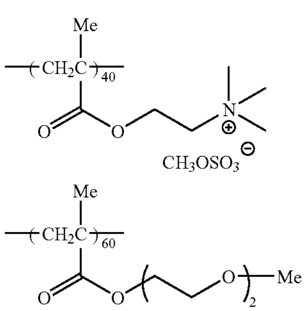
-continued
(6)
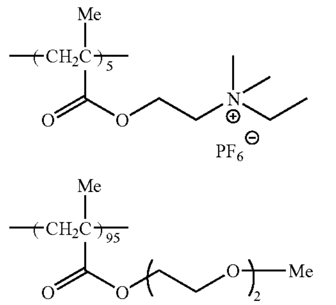
(7)
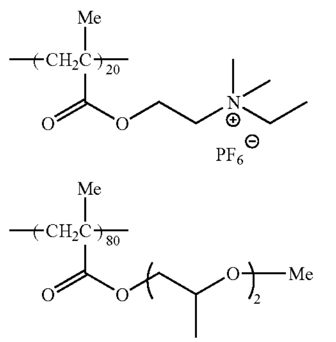
(8)
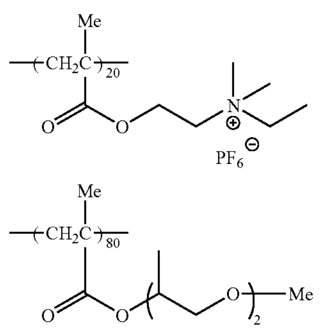
(9)
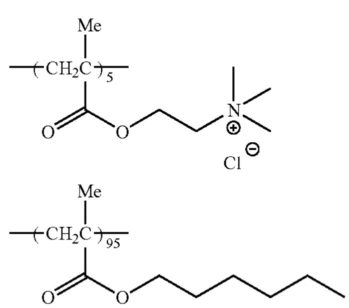
(10)
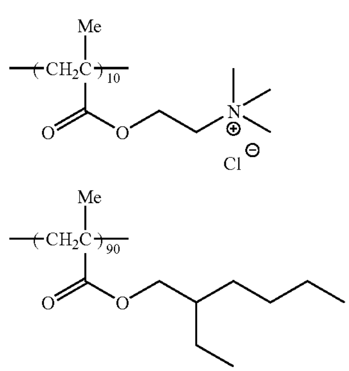

-continued
(11)
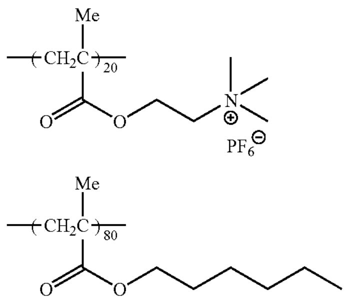
(12)
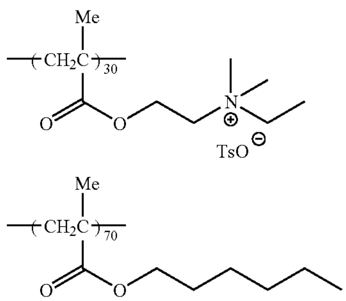
(13)
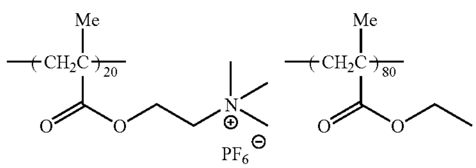
(14)
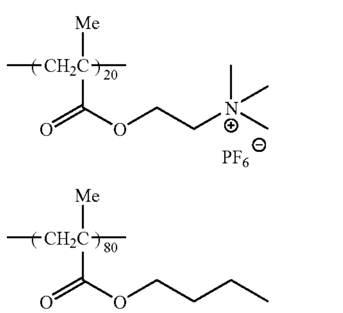
(15)
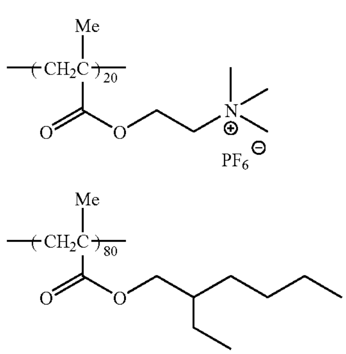
(16)
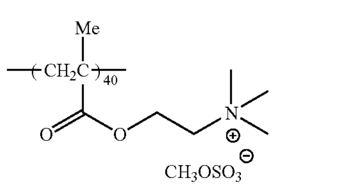
-continued
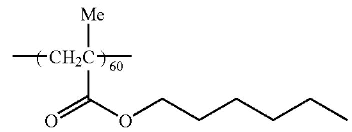
(17)
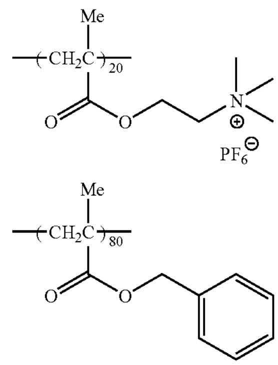
(18)
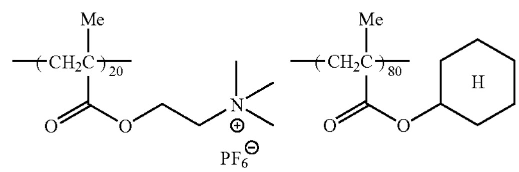
(19)
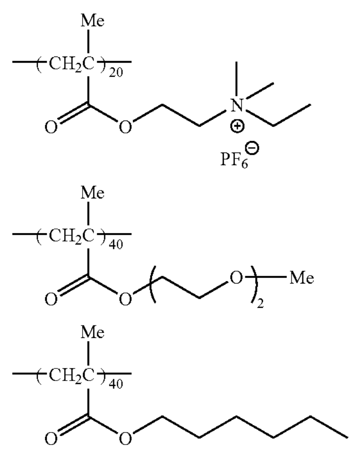
(20)
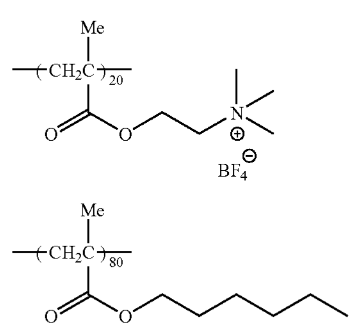
(21)
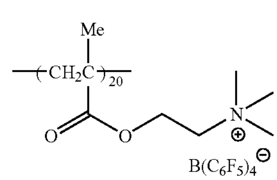

-continued
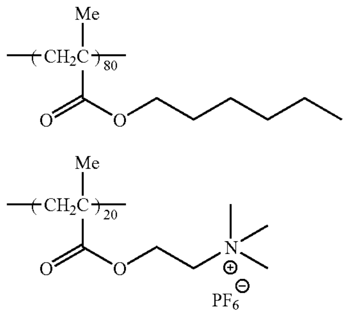
(22)
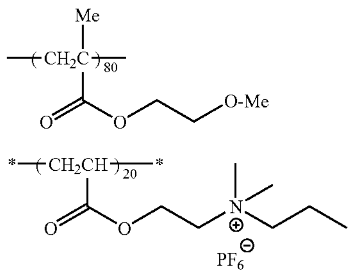
(23)
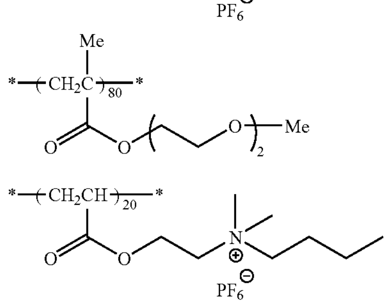
(24)
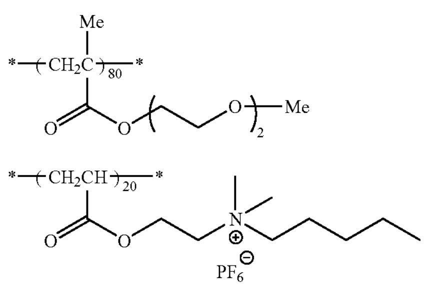
(25)
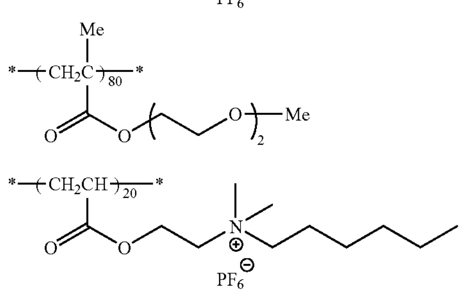
(26)
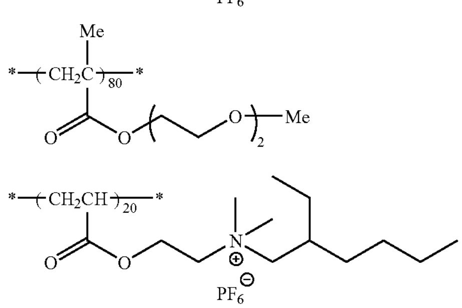
(27)
-continued
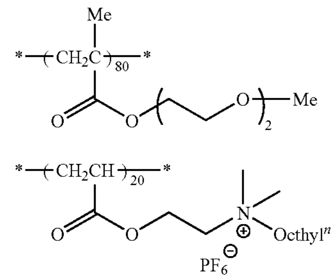
(28)
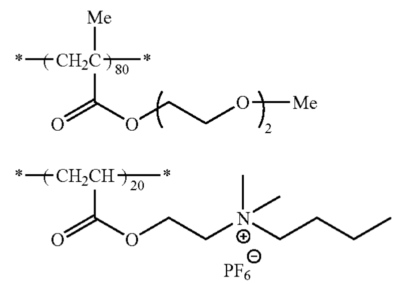
(29)
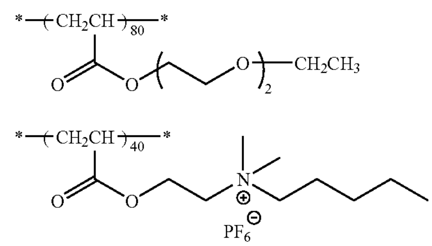
(30)
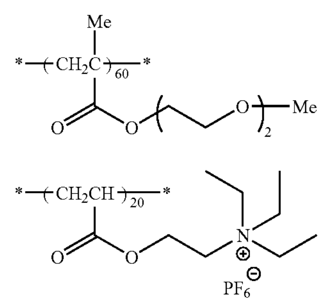
(31)
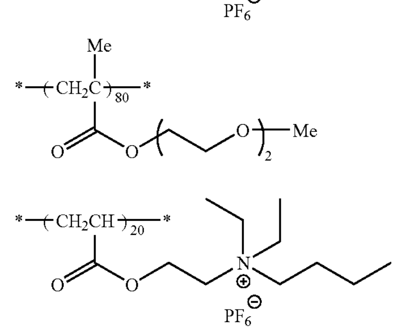
(32)
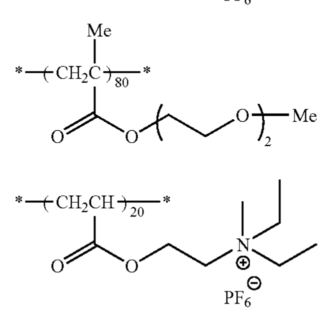
(33)

-continued
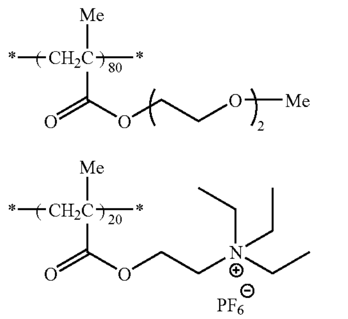
(34)
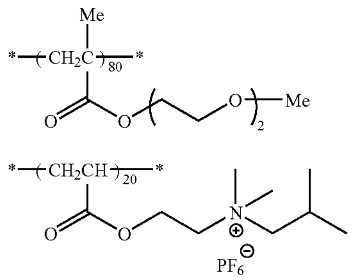
(35)
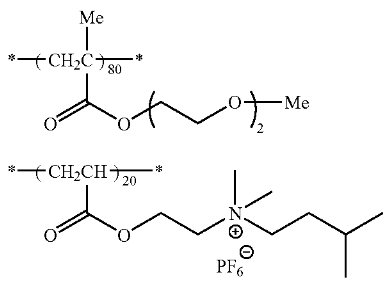
(36)
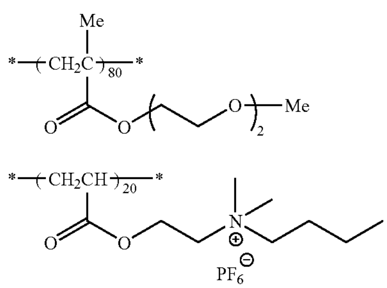
(37)
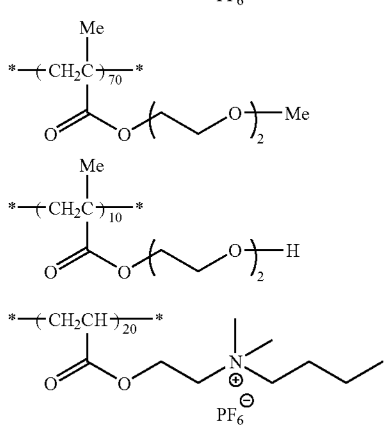
(38)
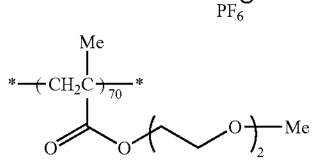
-continued
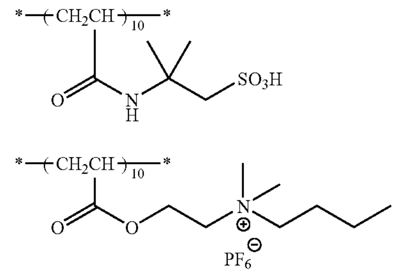
(39)
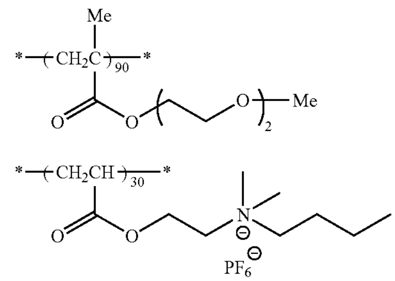
(40)
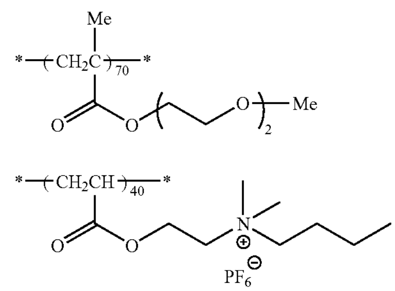
(41)
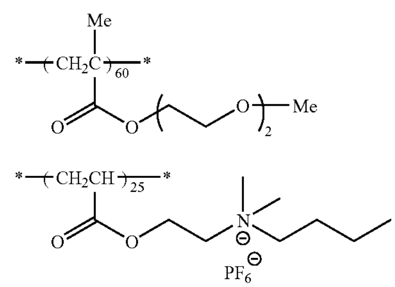
(42)
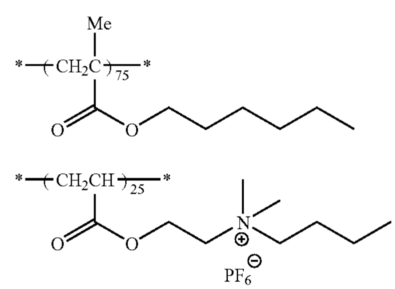
(43)
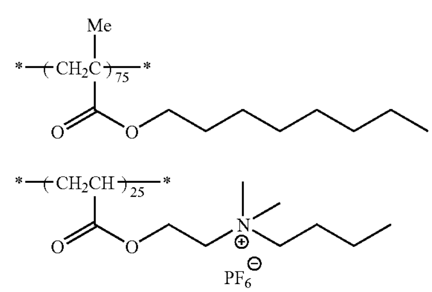
(44)

-continued
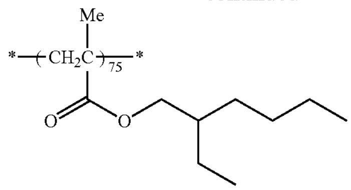
(45)
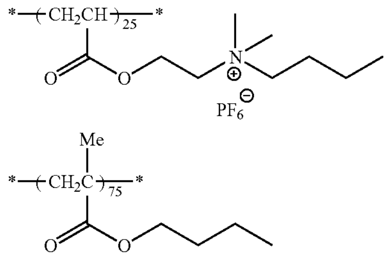
(46)
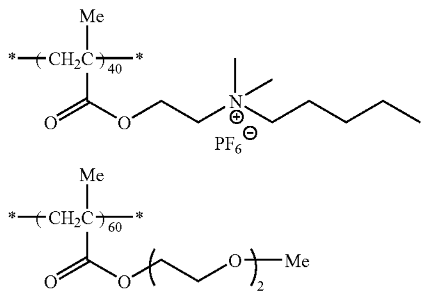
(47)
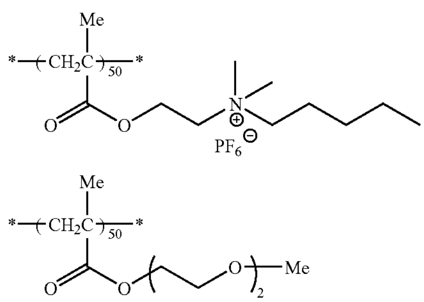
(48)
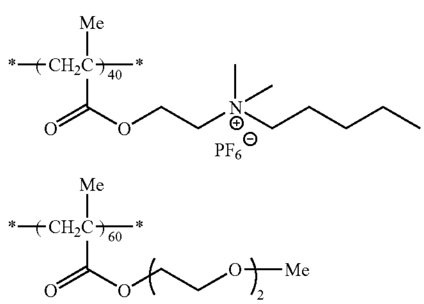
(49)
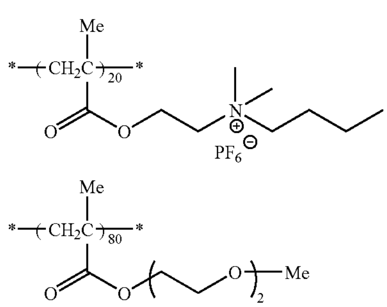
-continued
(50)
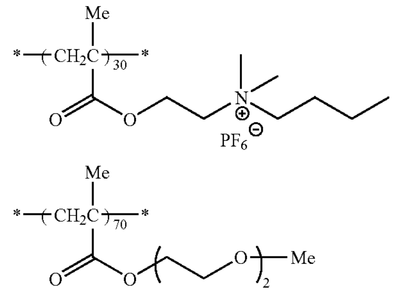
(51)
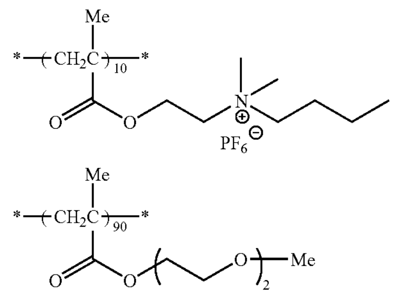
(52)
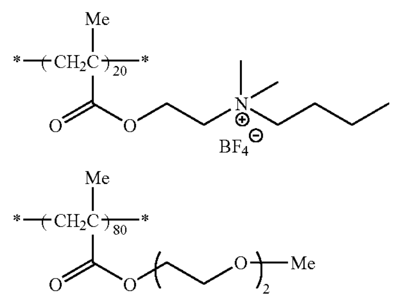
(53)
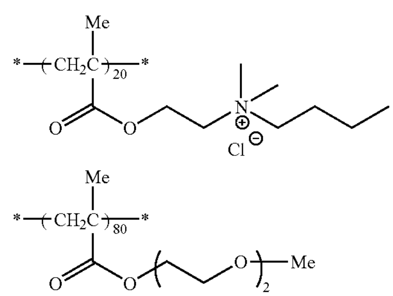
(54)
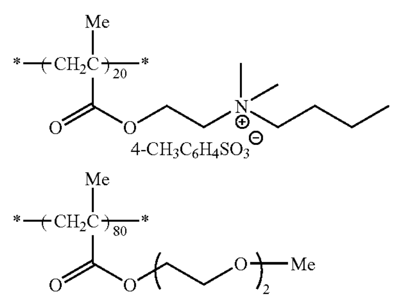
(56)
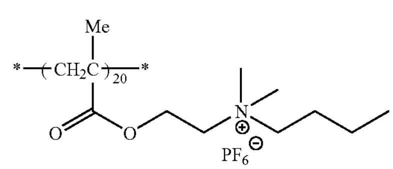

-continued
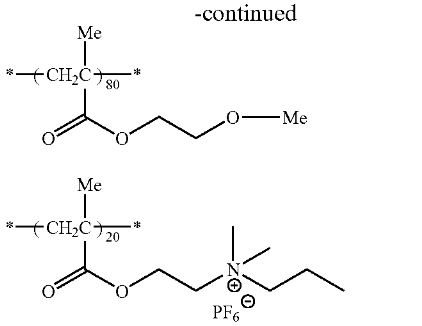
(57)
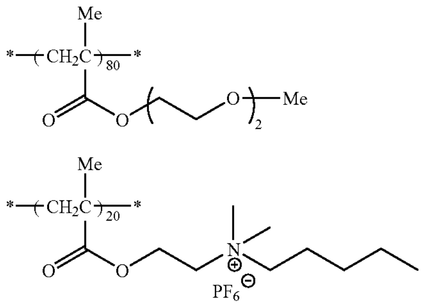
(58)
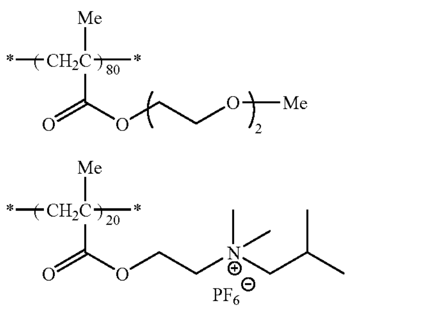
(59)
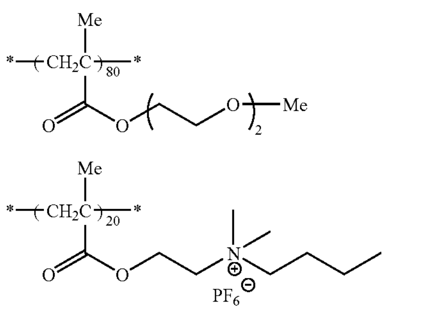
(60)
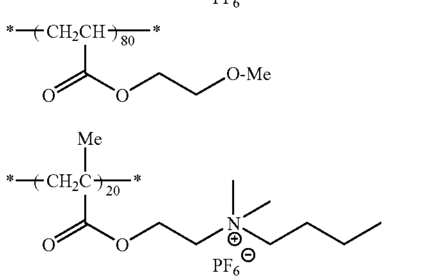
(61)
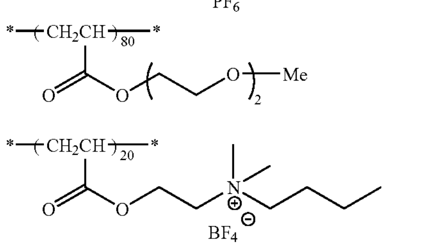
(62)
-continued
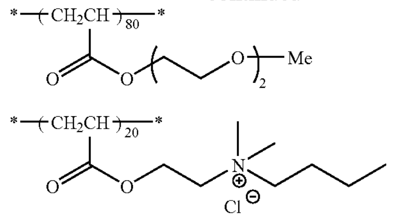
(63)
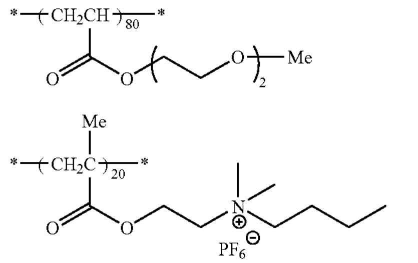
(64)
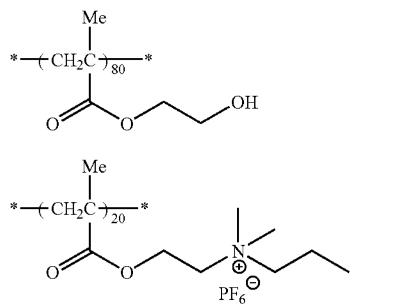
(65)
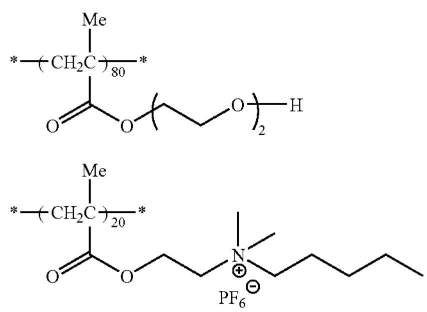
(66)
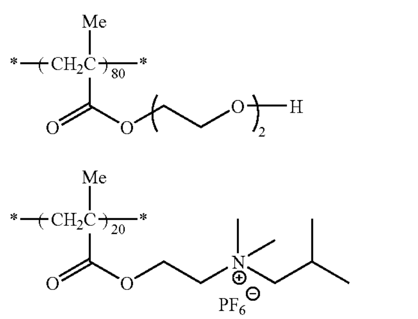
(67)
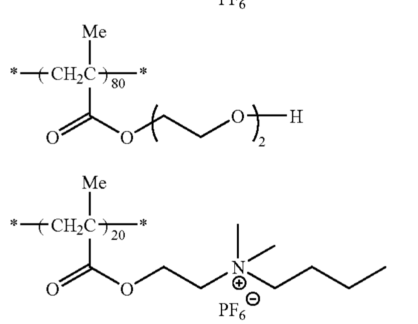
(68)

-continued
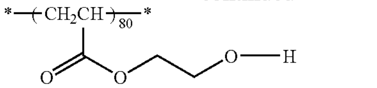
(69)
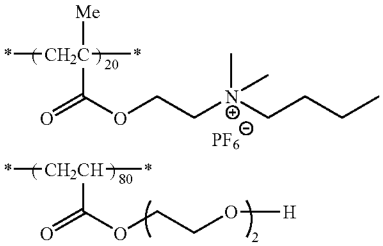
(70)
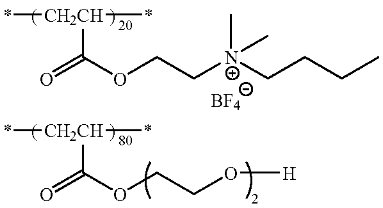
(71)
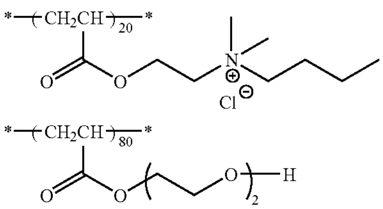
(72)
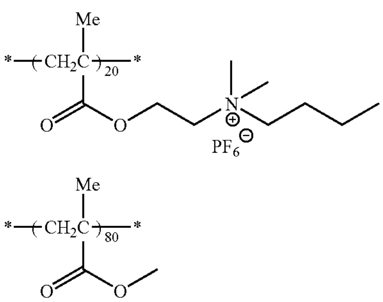
(73)
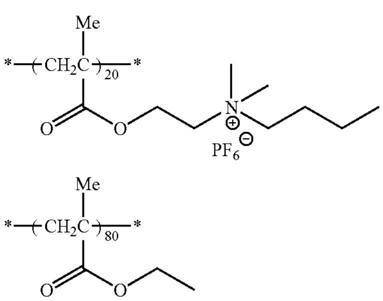
(74)
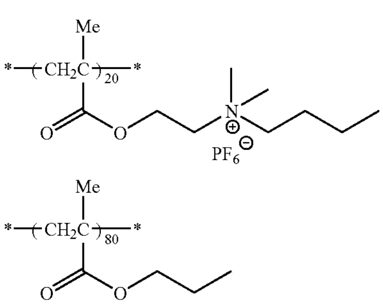
-continued
(75)
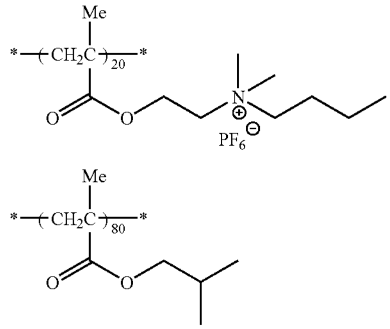
(76)
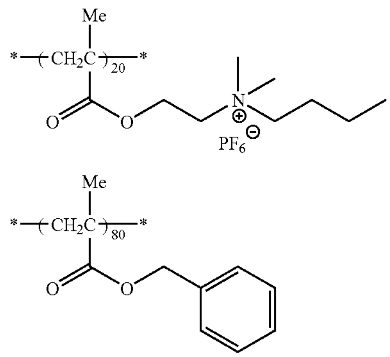
(77)
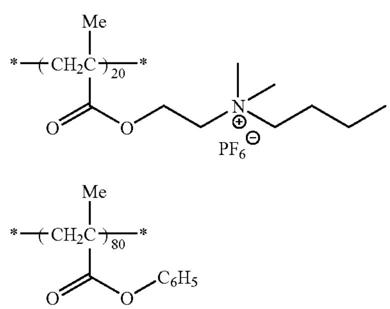
(78)
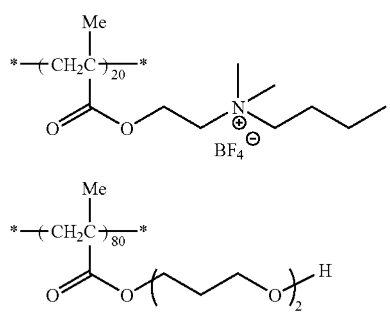
(79)
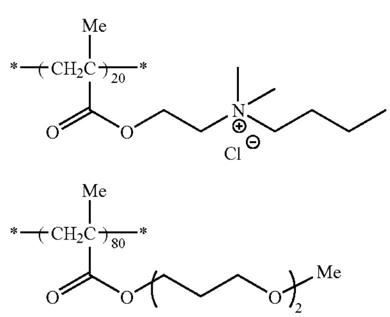

-continued
(80)
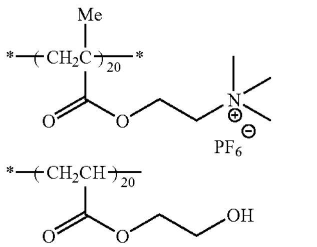
(81)
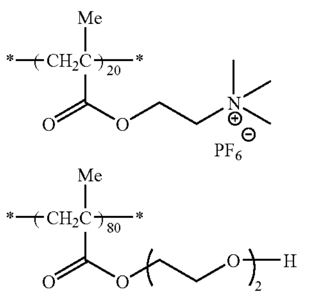
(82)
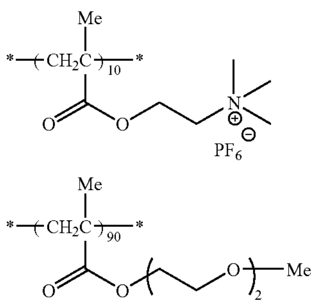
(83)
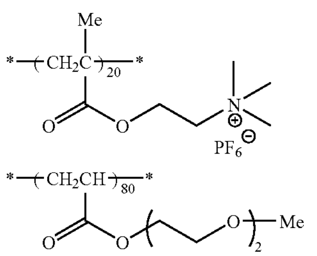
(84)
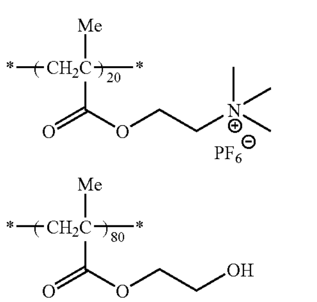
(85)
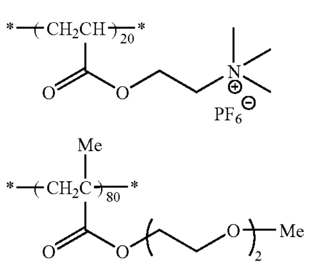
-continued
(86)
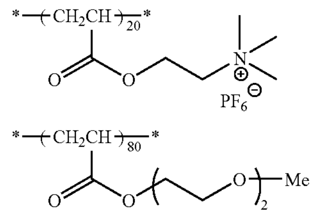
(87)
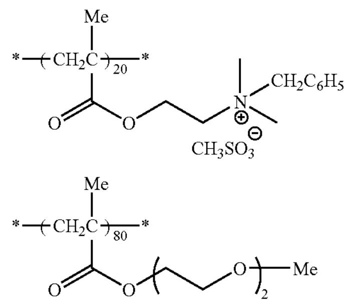
(88)
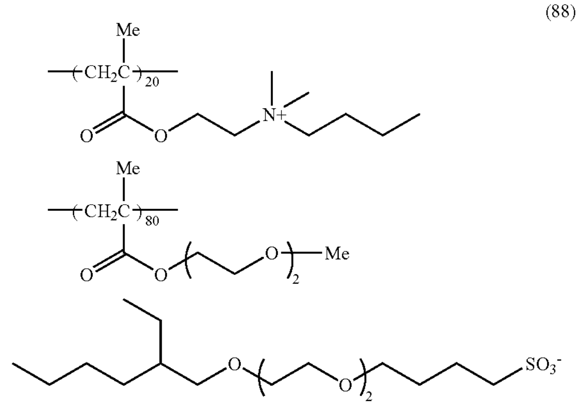
(89)
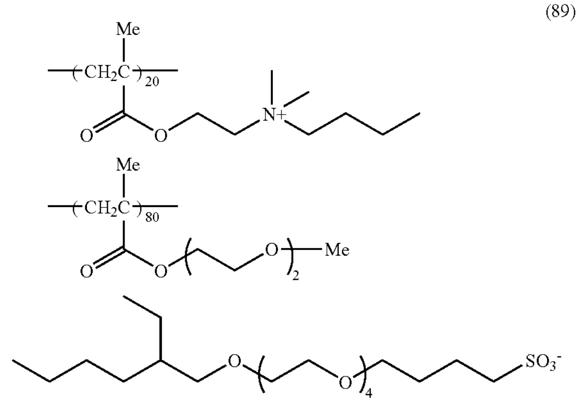
(90)
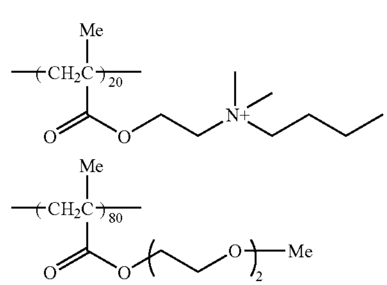
$C_8H_{17}O(CH_4CH_2O)_2(CH_2)_4SO_3$-

-continued
(91)
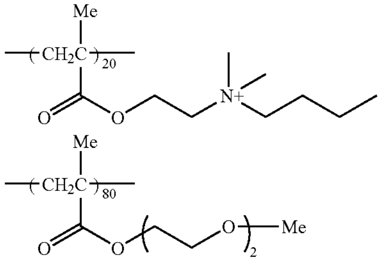
$C_8H_{17}O(CH_4CH_2O)_4(CH_2)_4SO_3$-
(92)
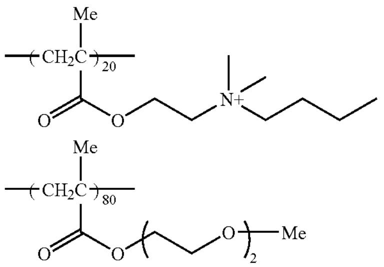
$C_{12}H_{25}O(CH_4CH_2O)_4(CH_2)_4SO_3$-
(93)
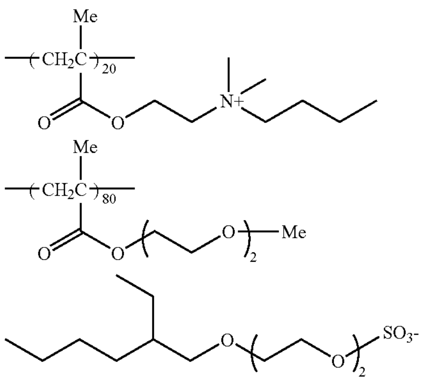
(94)
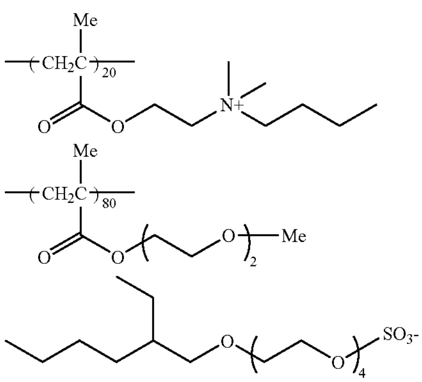
(95)
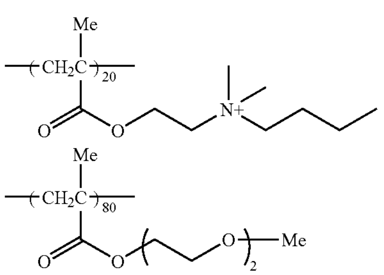
-continued
$C_8H_{17}O(CH_4CH_2O)_2(CH_2)_4OSO_3^-$
(96)
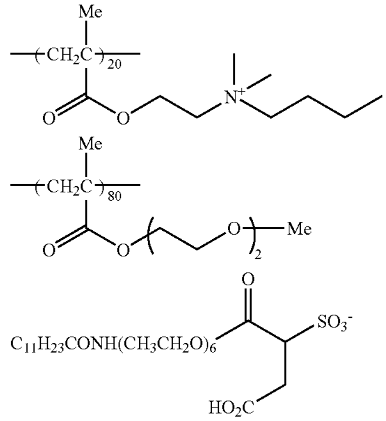
(97)
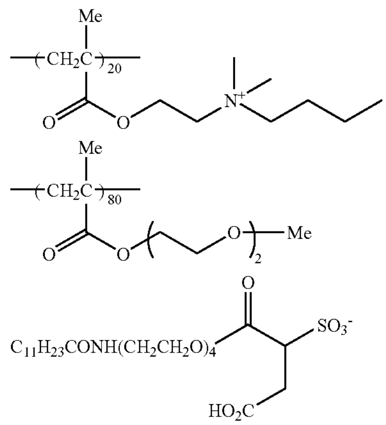
(98)
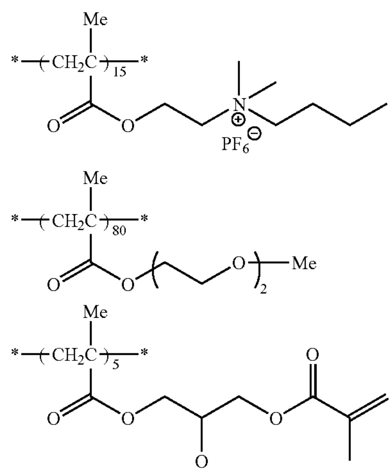
(99)
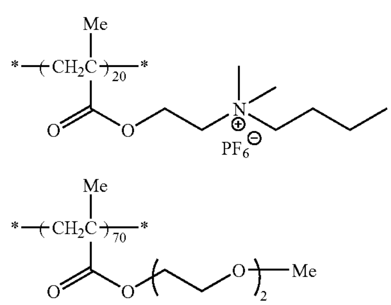

-continued
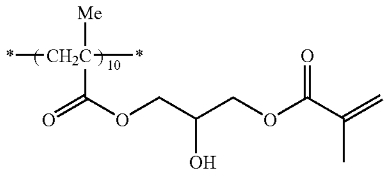
(100)
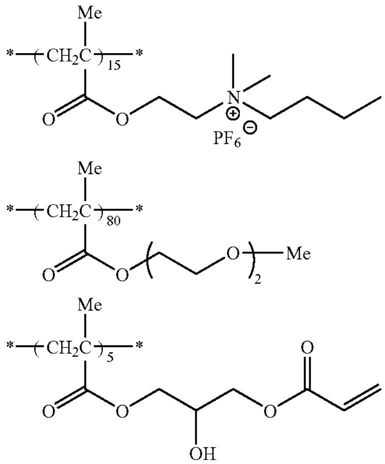
(101)
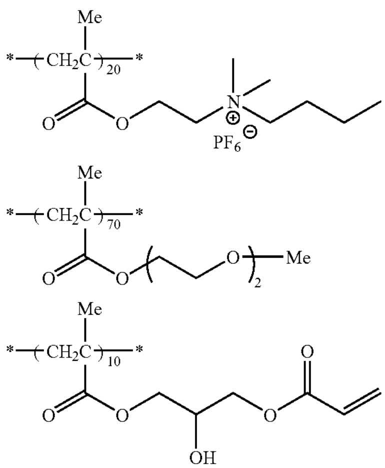
(102)
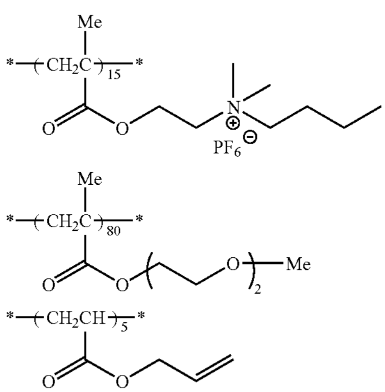
(103)
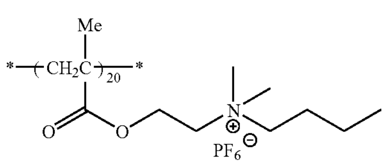
-continued
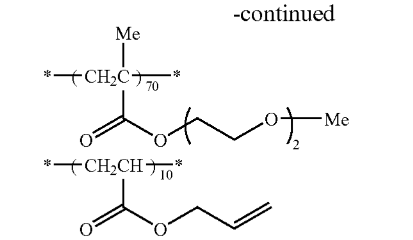
(104)
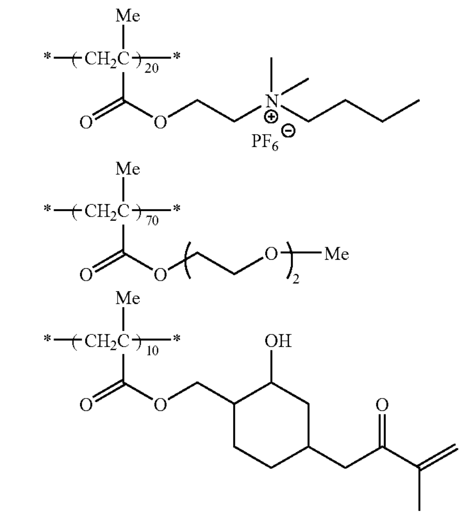
(105)
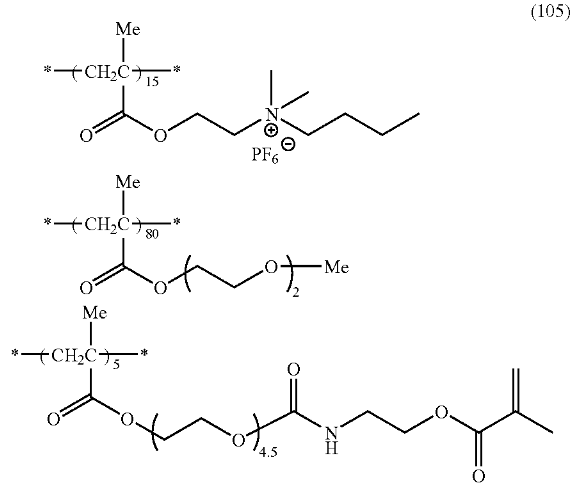
(106)
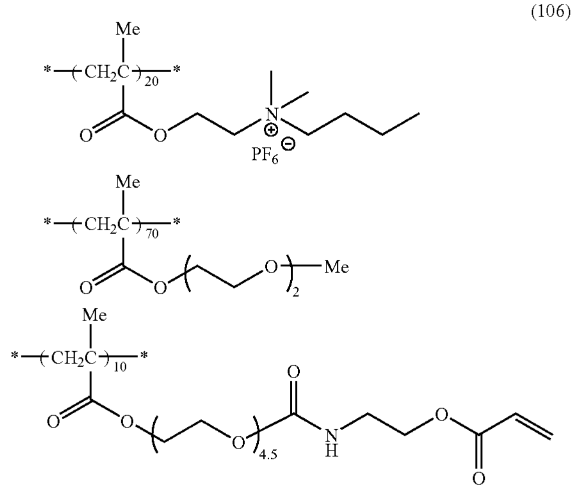

-continued
(107)
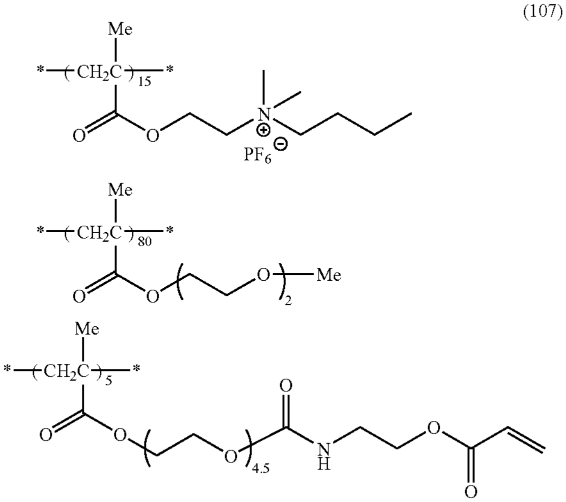
(108)
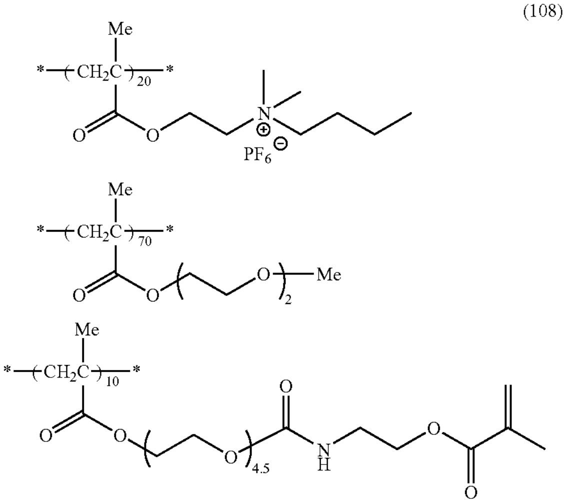
(109)
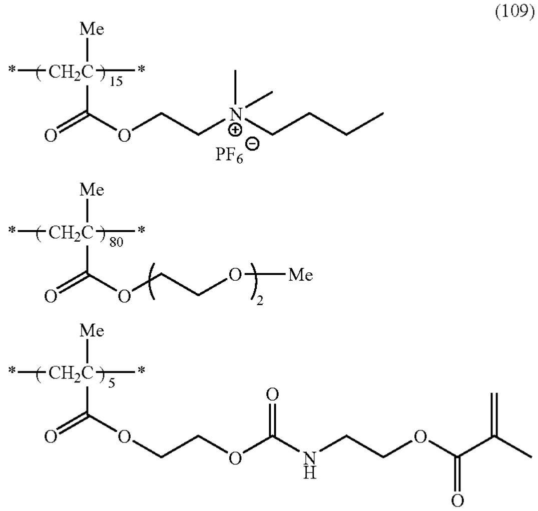
(110)
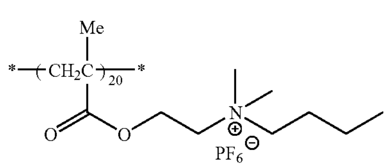
-continued
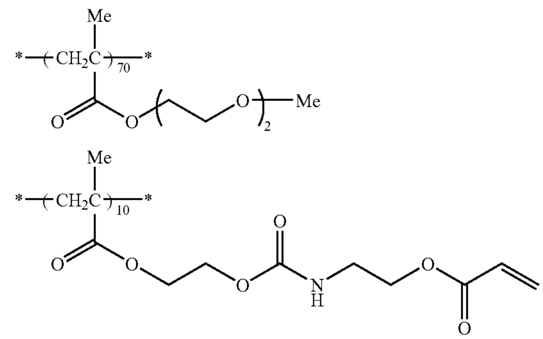
(111)
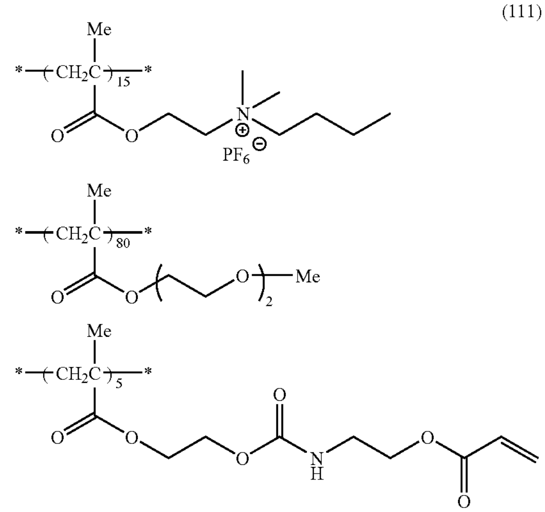
(112)
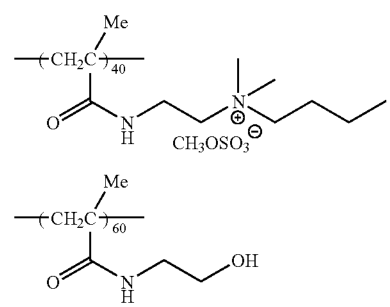
(113)
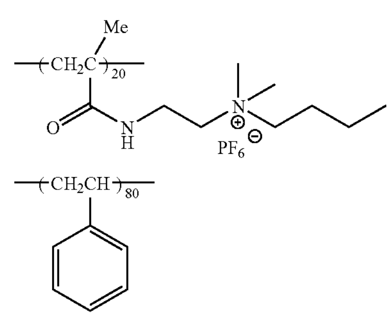
(114)
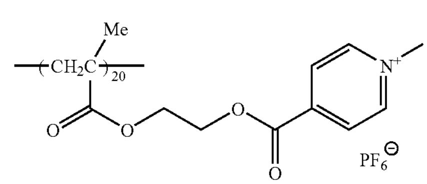

-continued

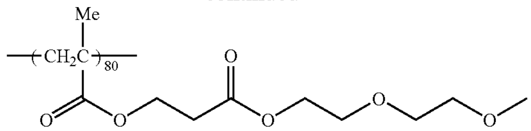

(115)

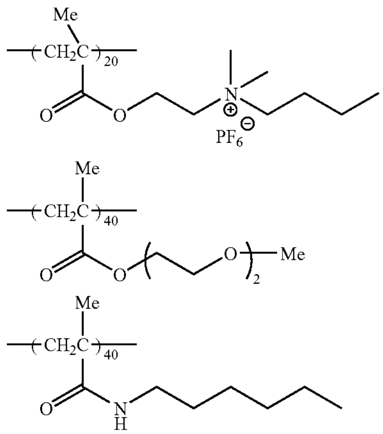

(116)

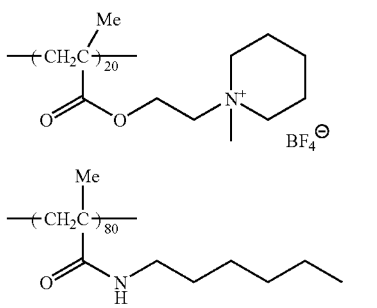

(117)

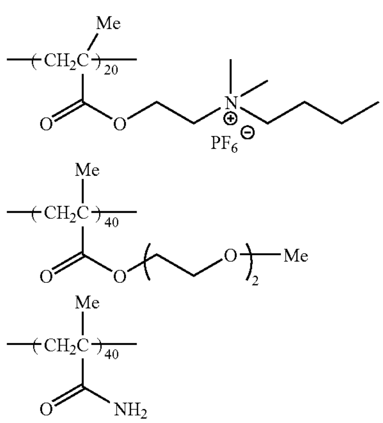

(118)

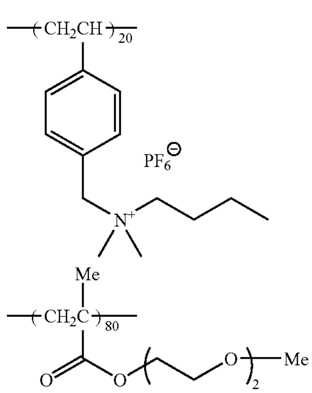

-continued (119)

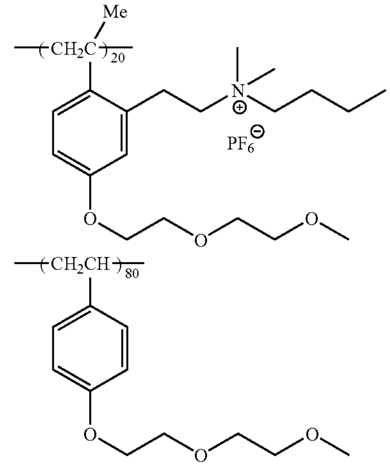

(120)

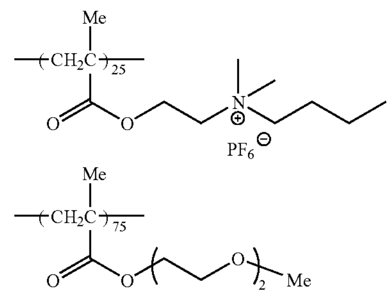

(121)

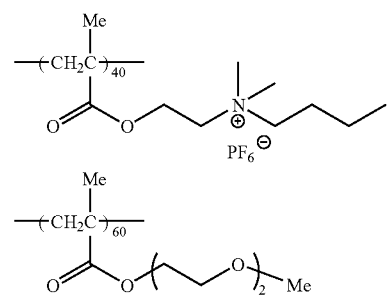

Protective Layer

The lithographic printing plate precursor according to the invention comprises a protective layer (overcoat layer) on an image-recording layer. The protective layer has functions, for example, of preventing occurrence of scratch on the image-recording layer and preventing ablation caused at the time of exposure with a high illuminance laser beam, as well as the function of restraining an image formation-inhibiting reaction by blocking oxygen. The component and the like of the protective layer will be described below.

Ordinarily, the exposure process of a lithographic printing plate precursor is performed in the air. The image-forming reaction occurred upon the exposure process in the image-recording layer may be inhibited by a low molecular compound, for example, oxygen or a basic substance present in the air. The protective layer prevents the low molecular compound, for example, oxygen or a basic substance from penetrating into the image-recording layer and as a result, the image formation-inhibiting reaction at the exposure process in the air can be avoided. Accordingly, the properties required of the protective layer include reduced permeability of the low molecular compound, for example, oxygen, and further, good transparency to light used for the exposure, excellent adhesion property to the image-recording layer, and easy removability during the on-machine development processing step after the exposure. With respect to the protective layer having such properties, there are described, for example, in U.S. Pat. No. 3,458,311 and JP-B-55-49729 (the term "JP-B" as used herein means an "examined Japanese patent publication").

The protective layer according to the invention contains a stratiform compound. The stratiform compound is a particle having a thin tabular shape and is capable of providing the oxygen blocking property in a thin layer due to a gas barrier property based on controlling a path length of gas diffusion. As the stratiform compound, an inorganic compound is preferable. For instance, mica, for example, natural mica represented by the following formula: A $(B, C)_{2-5}$ $D_4O_{10}$ $(OH, F, O)_2$, (wherein A represents any one of Li, K, Na, Ca, Mg and an organic cation, B and C each represents any one of Fe (II), Fe(III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasililic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the stratiform compounds, fluorine-based swellable mica, which is a synthetic stratiform compound, is particularly useful. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$, $Mg^{2+}$ or an organic cation, e.g., an amine salt, a quaternary ammonium salt, a phosphonium salt or a sulfonium salt is adsorbed between the lattice layers. The stratiform compound greatly swells upon contact with water. When share is applied under such condition, the stratiform crystal lattices are easily cleaved to form a stable sol in water. The bentonite and swellable synthetic mica have strongly such tendency.

With respect to the shape of the stratiform compound, the thinner the thickness or the larger the plain size as long as smoothness of coated surface and transmission of actinic radiation are not damaged, the better from the standpoint of control of diffusion. Therefore, an aspect ratio of the stratiform compound is ordinarily 20 or more, preferably 100 or more, particularly preferably 200 or more. The aspect ratio is a ratio of the thickness to the major axis of particle and can be determined, for example, from a projection drawing of particle by a microphotography. The larger the aspect ratio, the greater the effect obtained.

As for the particle diameter of the stratiform compound, an average diameter is ordinarily from 0.3 to 20 μm, preferably from 0.5 to 10 μm, particularly preferably from 1 to 5 μm. When the particle diameter is less than 0.3 μm, the inhibition of permeation of oxygen or moisture is insufficient and the effect of the stratiform compound can not be satisfactorily achieved. On the other hand, when it is larger than 20 μm, the dispersion stability of the particle in the coating solution is insufficient to cause a problem in that stable coating can not be performed. An average thickness of the particle is ordinarily 0.1 μm or less, preferably 0.05 μm or less, particularly preferably 0.01 μm or less. For example, with respect to the swellable synthetic mica that is the representative compound of the inorganic stratiform compounds, the thickness is approximately from 1 to 50 nm and the plain size is approximately from 1 to 20 μM.

When such an inorganic stratiform compound particle having a large aspect ratio is incorporated into the protective layer, strength of the coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

An example of common dispersing method for the stratiform compound when it is used in the protective layer is described below. Specifically, from 5 to 10 parts by weight of a swellable stratiform compound that is exemplified as the preferable stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

The amount of the inorganic stratiform compound contained in the protective layer is preferably from 5/1 to 1/100 in terms of a weight ratio of the stratiform compound to an amount of a binder used in the protective layer. When a plural kind of the inorganic stratiform compounds is used together, it is preferred that the total amount of the inorganic stratiform compounds is in the range of weight ratio described above.

The inorganic stratiform compound can be added to the image-recording layer in addition to the protective layer. The addition of inorganic stratiform compound to the image-recording layer is useful for improvements in the printing durability, polymerization efficiency (sensitivity) and time-lapse stability.

The amount of the inorganic stratiform compound added to the image-recording layer is preferably from 0.1 to 50% by weight, more preferably from 0.3 to 30% by weight, most preferably from 1 to 10% by weight, based on the solid content of the image-recording layer.

As a binder for use in the protective layer, any water-soluble polymer and water-insoluble polymer can be appropriately selected to use. Specifically, a water-soluble polymer, for example, polyvinyl alcohol, modified polyvinyl alcohol, polyvinyl pyrrolidone, polyvinyl imidazole, polyacrylic acid, polyacrylamide, a partially saponified product of polyvinyl acetate, ethylene-vinyl alcohol copolymer, a water-soluble cellulose derivative, gelatin, a starch derivative or gum arabic, and a polymer, for example, polyvinylidene chloride, poly(meth)acrylonitrile, polysulfone, polyvinyl chloride, polyethylene, polycarbonate, polystyrene, polyamide or cellophane are exemplified. The polymers may be used in combination of two or more thereof, if desired.

As a relatively useful material for use in the protective layer, a water-soluble polymer compound excellent in crystallinity is exemplified. Specifically, polyvinyl alcohol, polyvinyl pyrrolidone, polyvinyl imidazole, a water-soluble acrylic resin, for example, polyacrylic acid, gelatin or gum arabic is preferably used. Above all, polyvinyl alcohol, polyvinyl pyrrolidone and polyvinyl imidazole are more preferably used from the standpoint of capability of coating with water as a solvent and easy removability with dampening water at the time of printing. Among them, polyvinyl alcohol EVA) provides most preferable results on the fundamental properties, for example, oxygen blocking property or removability with development.

The polyvinyl alcohol for use in the protective layer according to the invention may be partially substituted with ester, ether or acetal as long as it contains a substantial amount of unsubstituted vinyl alcohol units necessary for maintaining water solubility. Also, the polyvinyl alcohol may partially contain other copolymerization components. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer having a various kind of modified cites, for example, the above-described anion-modified cite, cation modified cite, silanol-modified cite or thiol-modified cite, an alkoxy-modified cite, a sulfide-modified cite, an ester-modified cite of vinyl alcohol with a various kind of organic acids, an ester-modified cite of the above-described anion-modified cite with an alcohol or an epoxy-modified cite are also preferably used.

Preferable examples of the polyvinyl alcohol include those having a hydrolysis degree of 71 to 100% and a polymerization degree of 300 to 2,400. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, produced by Kuraray Co., Ltd. Specific examples of the modified polyvinyl alcohol include that having an anion-modified cite, for example, KL-318, KL-118, KM-618, KM-118 or SK-5102, that having a cation-modified cite, for example, C-318, C-118 or CM-318, that having a terminal thiol-modified cite, for example, M-205 or M-115, that having a terminal sulfide-modified cite, for example, MP-103, MP-203, MP-102 or MP-202, that having an ester-modified cite with a higher fatty acid at the terminal, for example, HL-12E or HL-1203 and that having a reactive silane-modified cite, for example, R-1130, R-2105 or R-2130.

As other additive for the protective layer, glycerol, dipropylene glycol or the like can be added in an amount corresponding to several % by weight of the water-soluble or water-insoluble polymer to impart flexibility. Further, an anionic surfactant, for example, sodium alkyl sulfate or sodium alkyl sulfonate; an amphoteric surfactant, for example, alkylamino carboxylic acid salt or alkylamino dicarboxylic acid salt; or a non-ionic surfactant, for example, polyoxyethylene alkyl phenyl ether can be added. The amount of the surfactant added is from 0.1 to 100% by weight of the water-soluble or water-insoluble polymer.

Further, for the purpose of improving the adhesion property to the image-recording layer, for example, it is described in JP-A-49-70702 and BP-A-1,303,578 that sufficient adhesion can be obtained by mixing from 20 to 60% by weight of an acrylic emulsion, a water-insoluble vinyl pyrrolidone-vinyl acetate copolymer or the like in a hydrophilic polymer mainly comprising polyvinyl alcohol and coating the mixture on the image-recording layer. In the invention, any of such known techniques can be used.

Moreover, other functions can also be provided to the protective layer. For instance, by adding a coloring agent (for example, a water-soluble dye), which is excellent in permeability for infrared ray used for the exposure and capable of efficiently absorbing light at other wavelengths, a safe light adaptability can be improved without causing decrease in the sensitivity.

The formation of protective layer is performed by coating a coating solution for protective layer prepared by dissolving or dispersing the components of protective layer in a solvent on the image-recording layer, followed by drying. The coating solvent may be appropriately selected in view of the binder used, and when a water-soluble polymer is used, distilled water or purified water is preferably used as the solvent.

To the coating solution for protective layer can be added known additives, for example, an anionic surfactant, a nonionic surfactant, a cationic surfactant or a fluorine-based surfactant for improving coating property or a water-soluble plasticizer for improving physical property of the coated layer. Examples of the water-soluble plasticizer include propionamide, cyclohexanediol, glycerin or sorbitol. Also, a water-soluble (meth)acrylic polymer can be added. Further, to the coating solution may be added known additives for increasing an adhesion property to the image-recording layer or for improving time-lapse stability of the coating solution.

A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

The coating amount of the protective layer is preferably in a range from 0.01 to 10 g/m$^2$, more preferably in a range from 0.02 to 3 g/m$^2$, most preferably in a range from 0.02 to 1 g/m$^2$ in terms of the coating amount after drying.

Image-Recording Layer

The image-recording layer according to the invention preferably contains (A) a sensitizing dye, (B) a polymerization initiator and (C) a polymerizable monomer. It is also preferred that the image-recording layer is capable of being subjected to image recording with a laser, particularly, an infrared laser or a blue laser.

The image-recording layer according to the invention may further contain other component, if desired, in addition to the above-described components.

The constituting components for the image-recording layer and formation of the image-recording layer will be described in detail below.

<(A) Sensitizing Dye>

The sensitizing dye incorporated into the image-recording layer according to the invention preferably has an absorption peak in a wavelength range of 300 to 1,200 nm, more preferably in a wavelength range of 360 to 850 nm. Such a sensitizing dye includes a spectral sensitizing dye and a dye or pigment as described below which absorbs light of a light source to cause an interaction with a polymerization initiator.

The spectral sensitizing dye or dye preferably used includes, for example, a multi-nuclear aromatic compound (for example, pyrene, peryrene or triphenylene), a xanthene (for example, Fluoresceine, Eosine, Erythrocin, Rhodamine B or Rose Bengale), a cyanine (for example, thiacarbocyanine or oxacarbocyanine), a merocyanine (for example, merocyanine or carbomerocyanine), a thiazine (for example, Thionine, Methylene Blue or Toluidine Blue), an acridine (for example, Acridine Orange, chloroflavine or acriflavine), a phthalocyanine (for example, phthalocyanine or metallo-phthalocyanine), a porphyrin (for example, tetraphenyl porphyrin or center metal-substituted porphyrin), a chlorophyll (for example, chlorophyll, chlorophyllin or center metal-substituted chlorophyll), a metal complex, an anthraquinone (for example, anthraquinone) and a squalium (for example, squalium).

In the invention, particularly, in the case of conducting the image formation using as the light source, a laser emitting an infrared ray of 760 to 1,200 nm, ordinarily, it is essential that an infrared absorbing agent is used. The infrared absorbing agent has a function of converting the infrared ray absorbed to heat and a function of being excited by the infrared ray to perform electron transfer/energy transfer to a polymerization initiator described hereinafter. The infrared absorbing agent for use in the invention includes a dye or pigment having an absorption maximum in a wavelength range of 760 to 1,200 nm. Also, in the case of conducting the image formation using as the light source, a blue laser beam having a wavelength of 360 to 450 nm, a high image-forming property is achieved by using a sensitizing dye absorbing light having a wavelength of 360 to 450 nm n.

<Infrared Absorbing Agent Having Absorption Maximum in Wavelength Range of 760 to 1,200 nm>

As the dye used for the infrared absorbing agent in the invention, commercially available dyes and known dyes described in literatures, for example, *Senryo Binran* (*Dye Handbook*) compiled by The Society of Synthetic Organic Chemistry, Japan (1970) can be utilized. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Preferable examples of the dye include cyanine dyes described, for example, in JP-A-58-125246, JP-A-59-84356 and JP-A-60-78787; methine dyes described, for example, in JP-A-58-173696, JP-A-58-181690 and JP-A-58-194595; naphthoquinone dyes described, for example, in JP-A-58-112793, JP-A-58-224793, JP-A-59-48187, JP-A-59-73996, JP-A-60-52940 and JP-A-60-63744; squarylium dyes described, for example, in JP-A-58-112792; and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferred examples of the dye include near infrared absorbing dyes represented by formulae (I) and (II) described in U.S. Pat. No. 4,756,993.

Other preferable examples of the infrared absorbing dye according to the invention include specific indolenine cyanine dyes described in JP-A-2002-278057 as illustrated below.

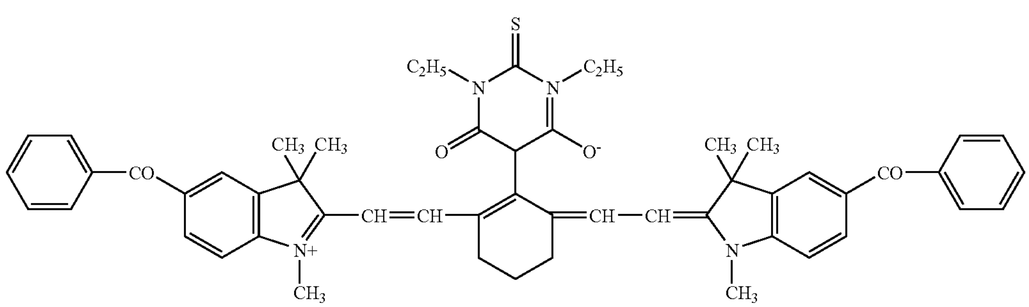

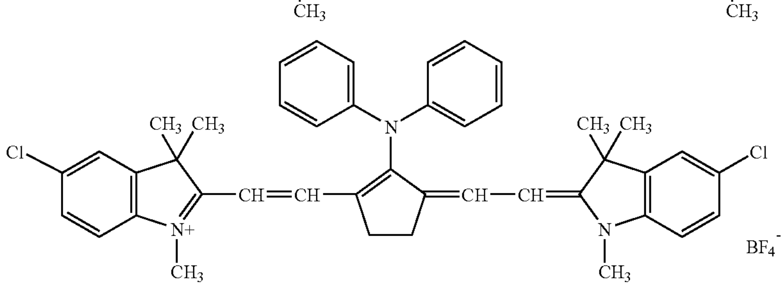

-continued

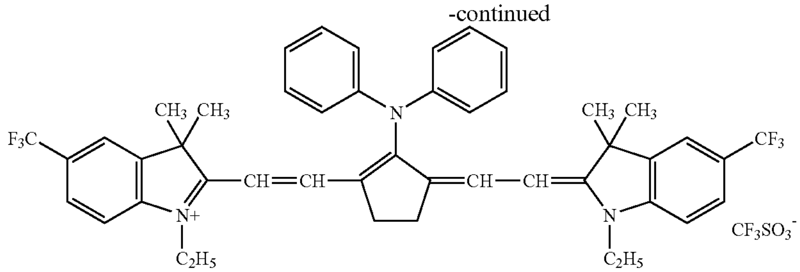

Of the dyes, cyanine dyes, squarylium dyes, pyrylium dyes, nickel thiolate complexes and indolenine cyanine dyes are preferred. As a particularly preferable example of the dye, a cyanine dye represented by formula (i) shown below is exemplified.

(i)

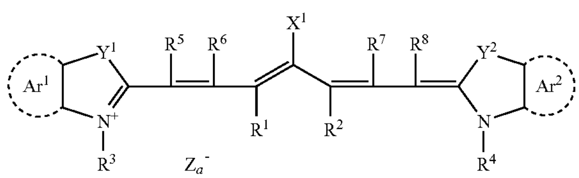

In formula (i), $X^1$ represents a hydrogen atom, a halogen atom, —$N(Ph)_2$, $X^2$-$L^1$ or a group represented by a structural formula shown below. $X^2$ represents an oxygen atom, a nitrogen atom or a sulfur atom, and $L^1$ represents a hydrocarbon group having from 1 to 12 carbon atoms, an aromatic cyclic group containing a hetero atom or a hydrocarbon group having from 1 to 12 carbon atoms and containing a hetero atom. The hetero atom means a nitrogen atom, a sulfur atom, an oxygen atom, a halogen atom or a selenium atom. In the structural formula shown below, $R^a$ represents a hydrogen atom or a substituent selected from an alkyl group, an aryl group, a substituted or unsubstituted amino group and a halogen atom, and $Xa^-$ has the same meaning as $Za^-$ defined hereinafter.

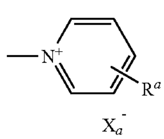

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms, and particularly preferably, $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms, and a hydrocarbon group having 12 or less carbon atoms and an alkoxy group having 12 or less carbon atoms are most preferable. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferable examples of the substituent include an alkoxy group having 12 or less carbon atoms, a carboxyl group and a sulfo group, and an alkoxy group having 12 or less carbon atoms is most preferable. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (i) has an anionic substituent in the structure thereof so that neutralization of charge is not needed. Preferable examples of the counter anion for $Za^-$ include a halogen ion, a perchlorate ion, a tetrafluoroborate ion, a hexafluorophosphate ion and a sulfonate ion, and particularly preferable examples thereof include a perchlorate ion, a tetrafluoroborate ion, a hexafluorophosphate ion and an arylsulfonate ion in view of the preservation stability of a coating solution for image-recording layer.

Specific examples of the cyanine dye represented by formula (i) which can be preferably used in the invention include those described in Paragraph Nos. [0017] to [0019] of JP-A-2001-133969.

Further, other particularly preferable examples include the specific indolenine cyanine dyes described in JP-A-2002-278057 described above.

Examples of the pigment used in the invention include commercially available pigments and pigments described in *Colour Index* (*C.I.*), *Saishin Ganryo Binran* (*Handbook of Newest Pigments*) compiled by Pigment Technology Society of Japan (1977), *Saishin Ganryo Oyou Gijutsu* (*Newest Application Technologies of Pigments*), CMC Publishing Co., Ltd. (1986) and *Insatsu Ink Gijutsu* (*Printing Ink Technology*), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of the pigment used include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after conducting the surface treatment. For the surface treatment, a method of coating a resin or wax on the pigment surface, a method of attaching a surfactant to the pigment surface and a method of bonding a reactive substance (for example, a silane coupling agent, an epoxy compound or a polyisocyanate) to the pigment surface. The surface treatment methods are described in *Kinzoku Sekken no Seishitsu to Oyo* (*Properties and Applications of Metal Soap*), Saiwai Shobo, *Insatsu Ink Gijutsu* (*Printing Ink Technology*), CMC Publishing Co., Ltd. (1984), and *Saishin Ganryo Oyo Gijutsu* (*Newest Application Technologies of Pigments*), CMC Publishing Co., Ltd. (1986).

A particle size of the pigment is preferably in a range from 0.01 to 10 μm, more preferably in a range from 0.05 to 1 μm, particularly preferably in a range from 0.1 to 1 μm. In the range described above, good stability of the pigment dispersion in a coating solution for image-recording layer and good uniformity of the image-recording layer can be obtained.

As a method for dispersing the pigment, a known dispersion technique for use in the production of ink or toner can be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing methods are described in detail in *Saishin Ganryo Oyo Gijutsu* (*Newest Application Technologies of Pigments*), CMC Publishing Co., Ltd. (1986).

The infrared absorbing agent may be added together with other components to the same image-recording layer or may be added to a different image-recording layer separately provided. With respect to an amount of the infrared absorbing agent added, in the case of preparing a negative-working lithographic printing plate precursor, the amount is so controlled that absorbance of the image-recording layer at the maximum absorption wavelength in the wavelength region of 760 to 1,200 nm measured by reflection measurement is ordinarily in a range of 0.3 to 1.2, preferably in a range of 0.4 to 1.1. In the range described above, the polymerization reaction proceeds uniformly in the thickness direction of the image-recording layer and good film strength of the image area and good adhesion property of the image area to the support are achieved.

The absorbance of the image-recording layer can be controlled depending on the amount of the infrared absorbing agent added to the image-recording layer and the thickness of the image-recording layer. The measurement of the absorbance can be carried out in a conventional manner. The method for measurement includes, for example, a method of forming an image-recording layer having a thickness appropriately determined in the range of coating amount after drying required for the lithographic printing plate precursor on a reflective support, for example, an aluminum plate, and measuring reflection density of the image-recording layer by an optical densitometer or a spectrophotometer according to a reflection method using an integrating sphere.

<Sensitizing Dye Absorbing Light Having Wavelength of 360 to 450 nm>

The sensitizing dye absorbing light having a wavelength of 360 to 450 nm for use in the invention preferably has an absorption maximum in a wavelength range of 360 to 450 nm. Such sensitizing dyes include, for example, merocyanine dyes represented by formula (I) shown below, benzopyranes or coumarins represented by formula (II) shown below, aromatic ketones represented by formula (III) shown below and anthracenes represented by formula (IV) shown below.

(I)

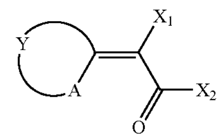

In formula (I), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

(II)

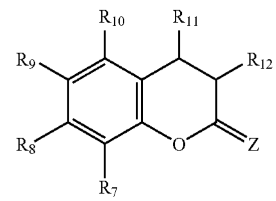

(I')

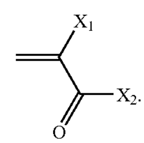

In formula (II), =Z represents an oxo group, a thioxo group, an imino group or an alkylydene group represented by the partial structural formula (I') described above, $X_1$ and $X_2$ have the same meanings as defined in formula (I) respectively, and $R_7$ to $R_{12}$ each independently represents a monovalent non-metallic atomic group.

(III)

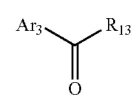

In formula (III), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

(IV)

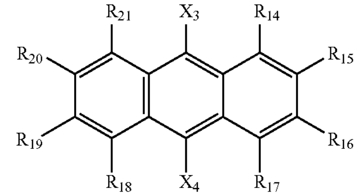

In formula (IV), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (I) to (IV), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an □-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and its conjugated base group (hereinafter referred to as a "phosphonato group"), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and its conjugated base group (hereinafter referred to as an "alkylphosphonato group"), a monoarylphosphono group ($—PO_3H(aryl)$) and its conjugated base group (hereinafter referred to as an "arylphosphonato group"), a phosphonooxy group ($—OPO_3H_2$) and its conjugated base group (hereinafter referred to as a "phosphonatooxy group"), a dialkylphosphonooxy group ($—OPO_3(alkyl)_2$), a diarylphosphonooxy group ($—OPO_3(aryl)_2$), an alkylarylphosphonooxy group ($—OPO_3(alkyl)(aryl)$), a monoalkylphosphonooxy group ($—OPO_3H(alkyl)$) and its conjugated base group (hereinafter referred to as an "alkylphosphonatooxy group"), a monoarylphosphonooxy group ($—OPO_3H(aryl)$) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (I) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc*., Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolnes (for example, thiazoline or 4-methylthiazolne); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinolne); 4-quinolnes (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolylidene group.

Of the compounds having an absorption maximum in a wavelength range of 360 to 450 nm as the sensitizing dyes, dyes represented by formula (V) shown below are more preferable in view of high sensitivity.

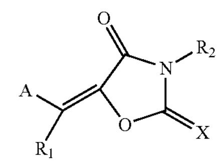

(V)

In formula (V), A represents an aromatic cyclic group which may have a substituent or a heterocyclic group which may have a substituent, X represents an oxygen atom, a sulfur atom or $=N(R_3)$, and $R_1$, $R_2$ and $R_3$ each independently represents a hydrogen atom or a monovalent non-metallic atomic group, or A and $R_1$ or $R_2$ and $R_3$ may be combined with each other to form an aliphatic or aromatic ring.

The formula (V) will be described in more detail below. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and its conjugated base group (hereinafter referred to as a "phosphonato group"), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and its conjugated base group (hereinafter referred to as an "alkylphosphonato group"), a monoarylphosphono group ($—PO_3H(aryl)$) and its conjugated base group (hereinafter referred to as an "arylphosphonato group"), a phosphonooxy group ($—OPO_3H_2$) and its conjugated base group (hereinafter referred to as a "phosphonatooxy group"), a dialkylphosphonooxy group ($—OPO_3(alkyl)_2$), a diarylphosphonooxy group ($—OPO_3(aryl)_2$), an alkylarylphosphonooxy group ($—OPO_3(alkyl)(aryl)$), a monoalkylphosphonooxy group ($—OPO_3H(alkyl)$) and its conjugated base group (hereinafter referred to as an "alkylphosphonatooxy group"), a monoarylphosphonooxy group ($—OPO_3H(aryl)$) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group represented by any one of $R_1$, $R_2$ and $R_3$ preferably include a monocyclic or polycyclic aromatic cyclic group containing at least one of a nitrogen atom, an oxygen atom and a sulfur atom. Examples of especially preferable heteroaryl group include a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group represented by any one of $R_1$, $R_2$ and $R_3$ preferably include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1CO—$) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an □-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyl-oxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropyl-sulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Preferable examples of the substituted or unsubstituted alkenyl group and the substituted or unsubstituted heteroaryl group represented by any one of $R_1$, $R_2$ and $R_3$ include those described with respect to the alkenyl group and heteroaryl group above.

Next, A in formula (V) will be described below. A represents an aromatic cyclic group which may have a substituent or heterocyclic group which may have a substituent. Specific examples of the aromatic cyclic group which may have a substituent or heterocyclic group which may have a substituent include those described for any one of $R_1$, $R_2$ and $R_3$ in formula (V).

The sensitizing dye represented by formula (V) is obtained by a condensation reaction of the above-described acidic nucleus or an active methyl group-containing acidic nucleus with a substituted or unsubstituted, aromatic ring or hetero ring and can be synthesized with reference to JP-B-59-28329.

Preferable specific examples (D1) to (D41) of the compound represented by formula (V) are set forth below. Further, when isomers with respect to a double bond connecting an acidic nucleus and a basic nucleus are present in each of the compounds, the invention should not be construed as being limited to any one of the isomers.

(D1)

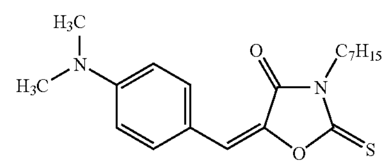

(D2)

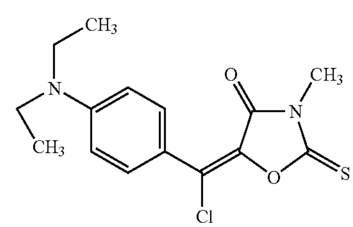

(D3)

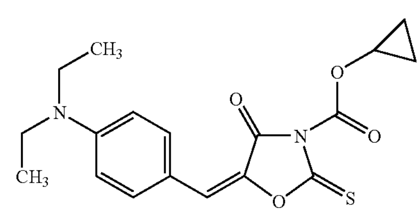

(D4)

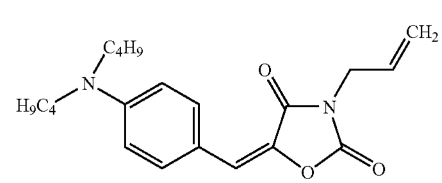

(D5)
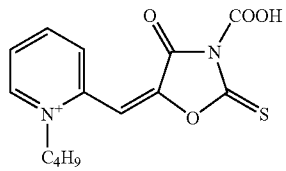
(D6)
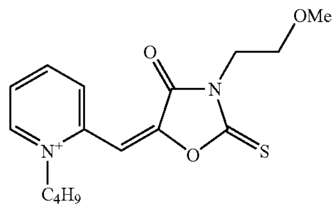
(D7)
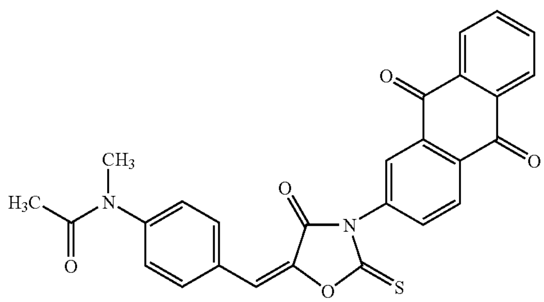
(D8)
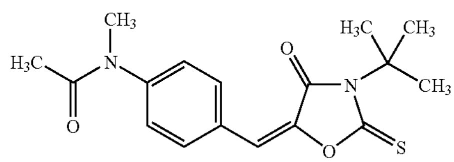
(D9)
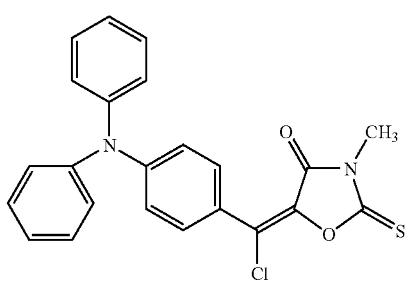
(D10)
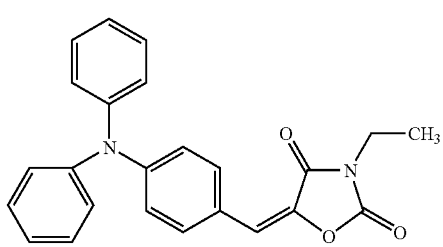
(D11)
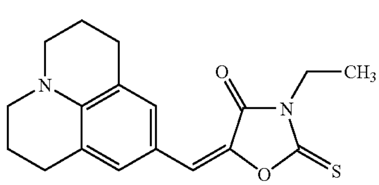
(D12)
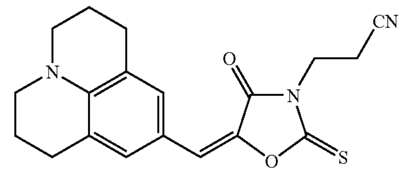
(D13)
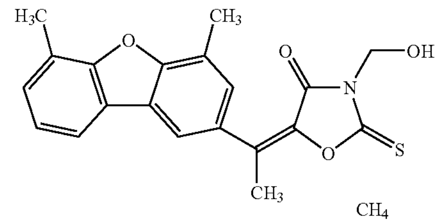
$CH_4$
(D14)
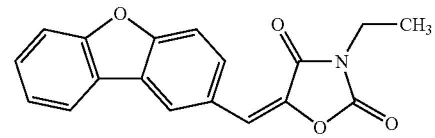
$CH_4$
(D15)
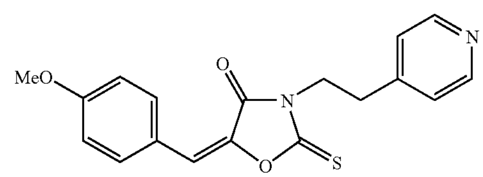
(D16)
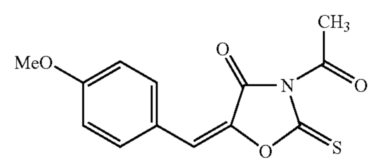
(D17)
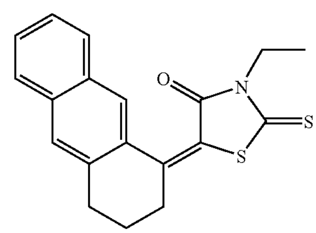
(D18)
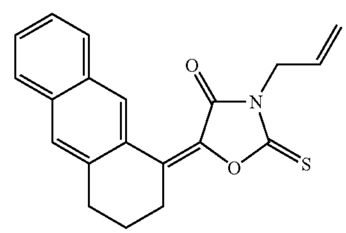
(D19)
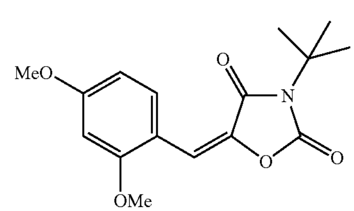

(D20)
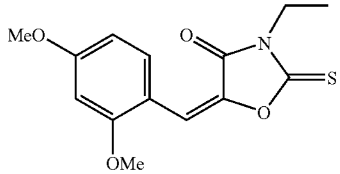
(D21)
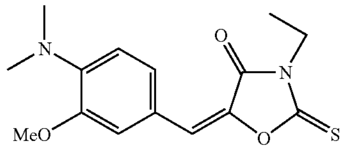
(D22)
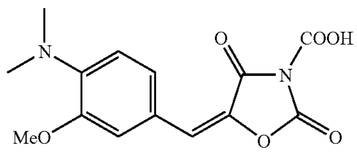
(D23)
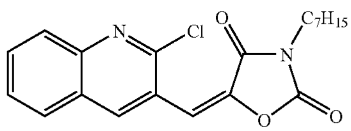
(D24)
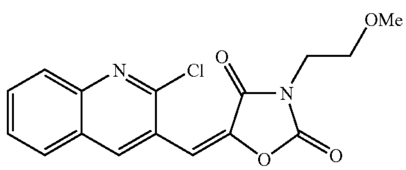
(D25)
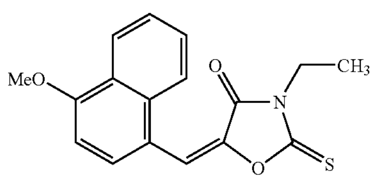
(D26)
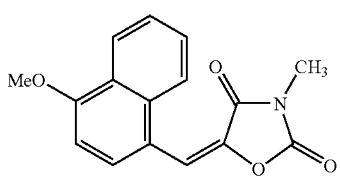
(D27)
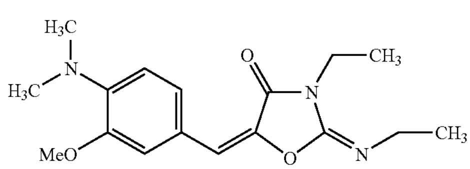
(D28)
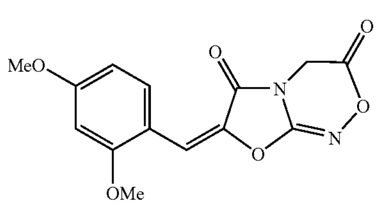
(D29)
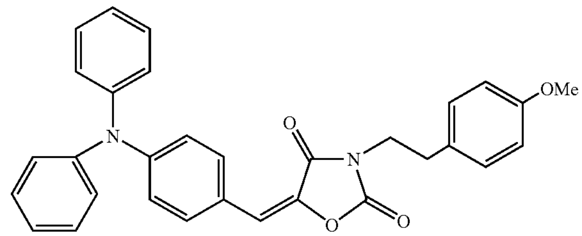
(D30)
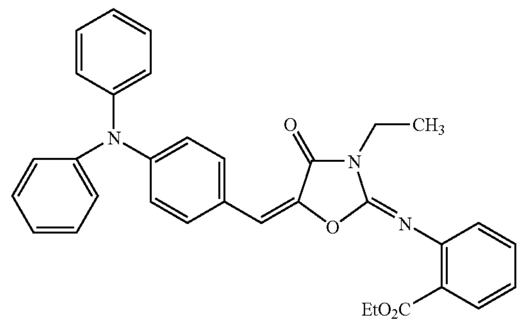
(D31)
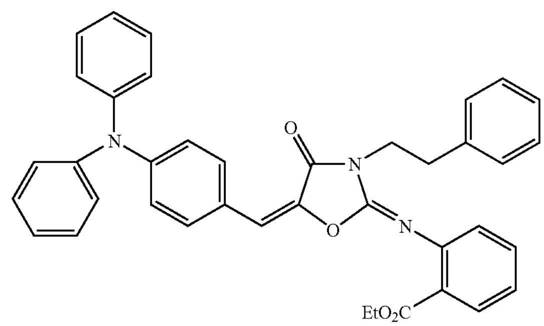
(D32)
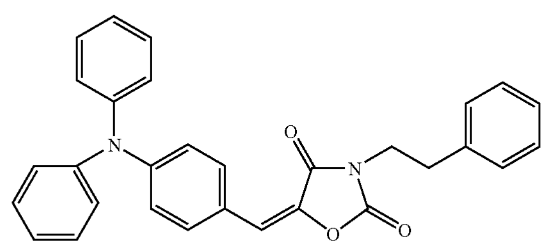
(D33)
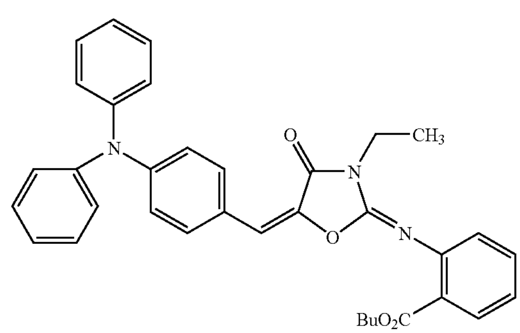

-continued (D34)

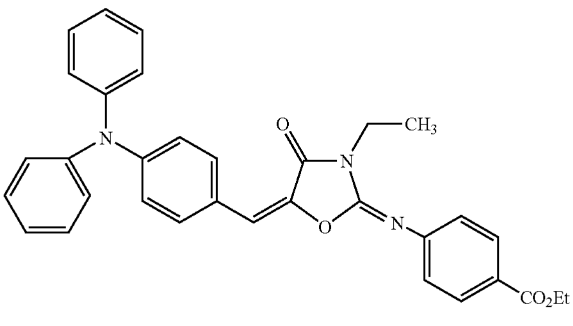

(D35)

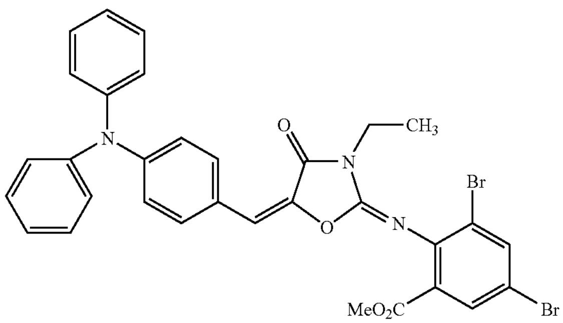

(D36)

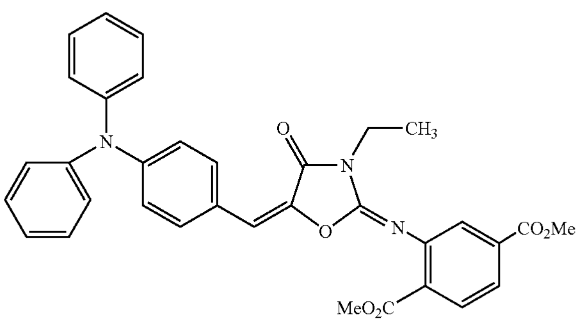

(D37)

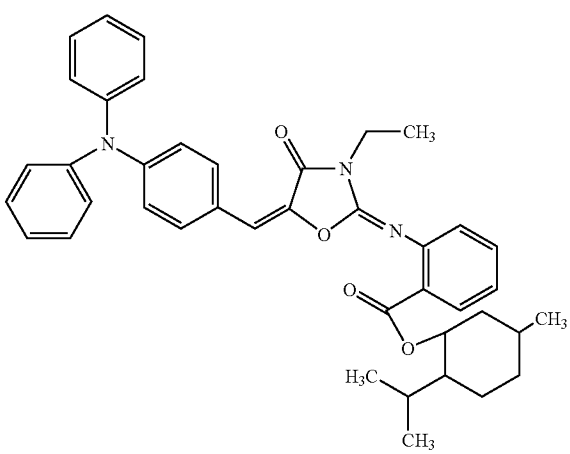

-continued (38)

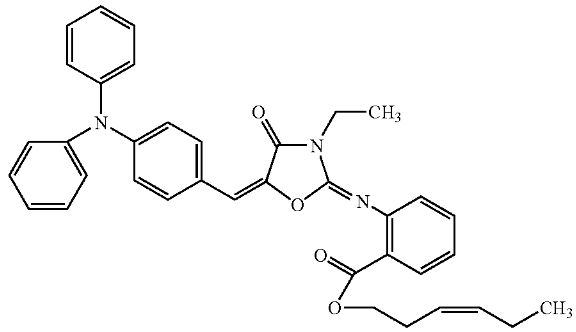

D39

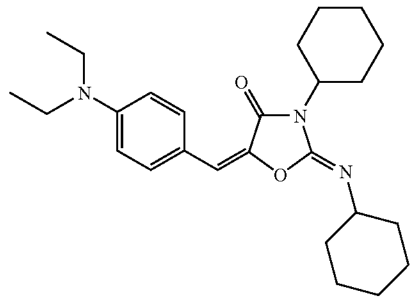

D40

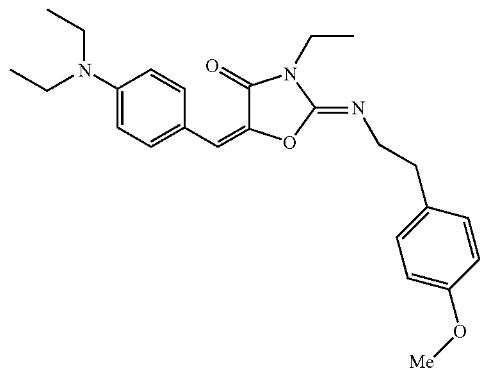

D41

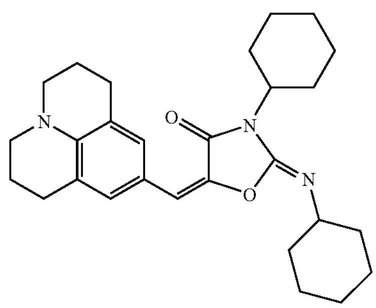

The sensitizing dye absorbing light having a wavelength of 360 to 450 nm is preferably used in a range from 1.0 to 10.0% by weight, more preferably from 1.5 to 5.0% by weight, based on the total solid content of the image-recording layer.

<(B) Polymerization Initiator>

The polymerization initiator for use in the invention is a compound that generates a radical with light energy, heat energy or both energies to initiate or accelerate polymerization of a compound having a polymerizable unsaturated group. The polymerization initiator for use in the invention includes, for example, known thermal polymerization initiators, compounds containing a bond having small bond dissociation energy and photopolymerization initiators. The compound generating a radical preferably used in the invention is a compound that generates a radical with heat energy to initiate or accelerate polymerization of a compound having a polymerizable unsaturated group. The thermal radical generator according to the invention is appropriately selected from known polymerization initiators and compounds containing a bond having small bond dissociation energy. The polymerization initiators can be used individually or in combination of two or more thereof.

The polymerization initiators include, for example, organic halides, carbonyl compounds, organic peroxides, azo compounds, azido compounds, metallocene compounds, hexaarylbiimidazole compounds, organic borate compounds, disulfone compounds, oxime ester compounds and onium salt compounds.

The organic halides described above specifically include, for example, compounds described in Wakabayashi et al., *Bull. Chem. Soc. Japan,* 42, 2924 (1969), U.S. Pat. No. 3,905,815, JP-B-46-4605, JP-A-48-35281, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry,* 1, No. 3 (1970). Particularly preferably, oxazole compounds and s-triazine compounds each substituted with a trihalomethyl group are exemplified.

More preferably, s-triazine derivatives and oxadiazole derivatives in which at least one of mono-, di- and tri-halogen substituted methyl groups is connected are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(□,□,□-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(p-bromophenyl)-4,6-bis(trichloromethyl)-s-triazine, 2-(p-fluorophenyl)-4,6-bis(trichloromethyl)-s-triazine, 2-(p-trifluoromethylphenyl)-4,6-bis(trichloromethyl)-s-triazine, 2-(2,6-dichlorophenyl)-4,6-bis(trichloromethyl)-s-triazine, 2-(2,6-difluorophenyl)-4,6-bis(trichloromethyl)-s-triazine, 2-(2,6-dibromophenyl)-4,6-bis(trichloromethyl)-s-triazine, 2-(4-biphenylyl)-4,6-bis(trichloromethyl)-s-triazine, 2-(4'-chloro-4-biphenylyl)-4,6-bis(trichloromethyl)-s-triazine, 2-(p-cyanophenyl)-4,6-bis(trichloromethyl)-s-triazine, 2-(p-acetylphenyl)-4,6-bis(trichloromethyl)-s-triazine, 2-(p-ethoxycarbonylphenyl)-4,6-bis(trichloromethyl)-s-triazine, 2-(p-phenoxycarbonylphenyl)-4,6-bis(trichloromethyl)-s-triazine, 2-(p-methylsulfonylphenyl)-4,6-bis(trichloromethyl)-s-triazine, 2-(p-dimethylsulfoniumphenyl)-4,6-bis(trichloromethyl)-s-triazine tetrafluoroborate, 2-(2,4-difluorophenyl)-4,6-bis(trichloromethyl)-s-triazine, 2-(p-diethoxyphosphorylphenyl)-4,6-bis(trichloromethyl)-s-triazine, 2-[4-(4-hydroxyphenylcarbonylamino)phenyl]-4,6-bis(trichloromethyl)-s-triazine, 2-[4-(p-methoxyphenyl)-1,3-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, 2-(o-methoxystyryl)-5-trichloromethyl-1,3,4-oxadiazole, 2-(3,4-epoxystyryl)-5-trichloromethyl-1,3,4-oxadiazole, 2-[1-phenyl-2-(4-methoxyphenyl)vinyl]-5-trichloromethyl-1,3,4-oxadiazole, 2-(p-hydroxystyryl)-5-trichloromethyl-1,3,4-oxadiazole, 2-(3,4-dihydroxystyryl)-5-trichloromethyl-1,3,4-oxadiazole and 2-(p-tert-butoxystyryl)-5-trichloromethyl-1,3,4-oxadiazole.

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, □-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, e.g., thioxantone, 2-ethylthioxantone, 2-isopropylthioxantone, 2-chlorothioxantone, 2,4-dimethylthioxantone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, dicyclopentadienyl-Ti-bis-2,6-difluoro-3-(pyrol-1-yl)phen-1-yl, and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetrakis(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole or 2,2'-bis(o-trifluoromethylphenyl)-4,4',5,5'-tetraphenylbiimidazole.

The organic borate compounds described above include, for example, organic borates described in JP-A-62-143044, JP-A-62-150242, JP-A-9-188685, JP-A-9-188686, JP-A-9-188710, JP-A-2000-131837, JP-A-2002-107916, Japanese Patent 2,764,769, JP-A-2002-116539 and Martin Kunz, *Rad Tech '98*, *Proceeding*, Apr. 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in *J. C. S. Perkin II,* 1653-1660 (1979), *J. C. S. Perkin* II, 156-162 (1979), Journal of Photopolymer Science and Technology, 202-232 (1995) and JP-A-2000-66385, and compounds described in JP-A-2000-80068. Specific examples thereof include compounds represented by the following structural formulae:

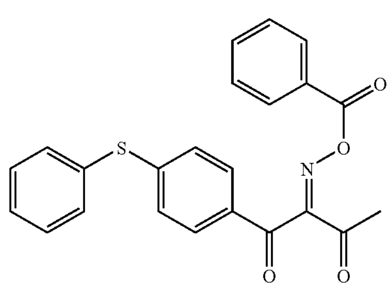

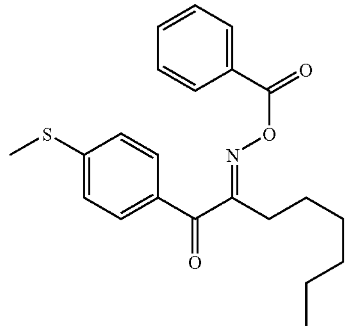

-continued

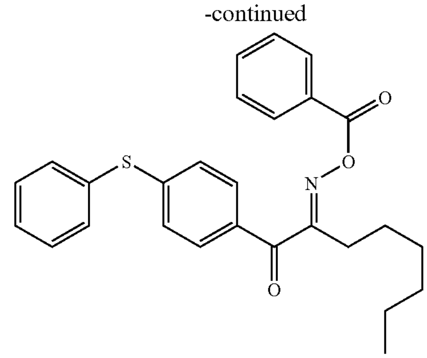

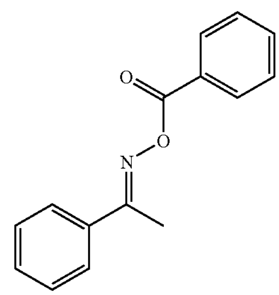

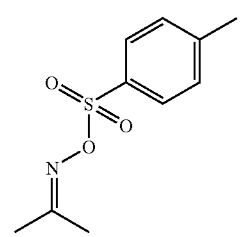

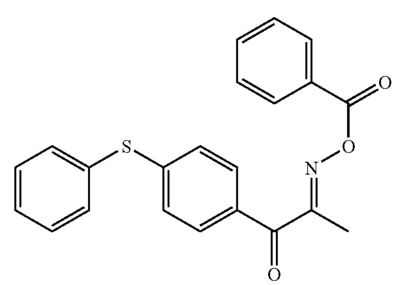

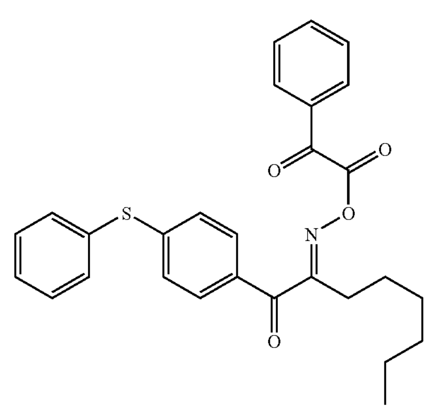

-continued
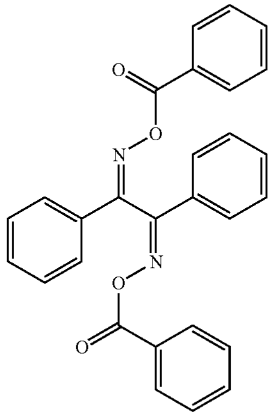
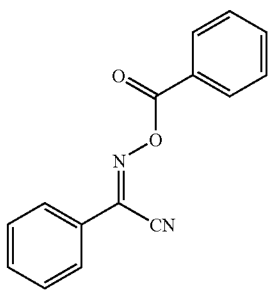
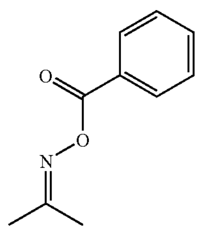
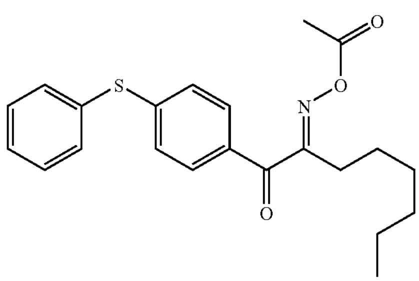
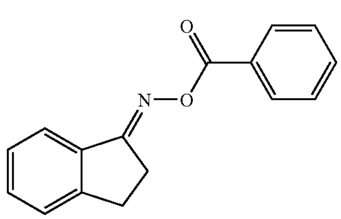
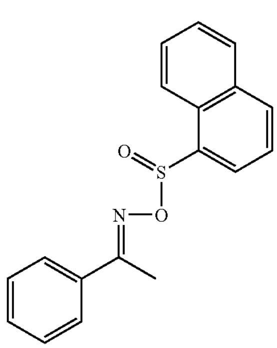
-continued
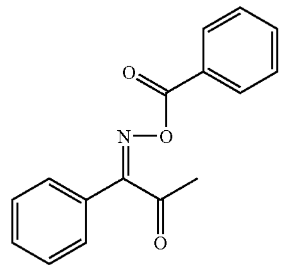
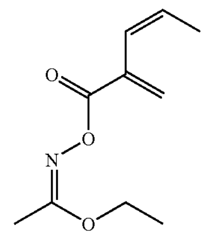
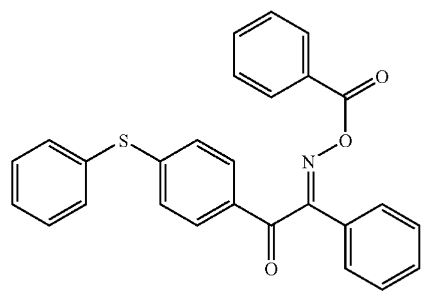
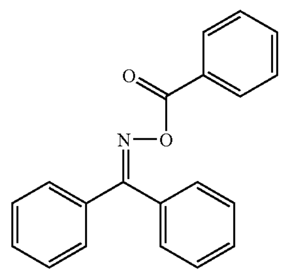
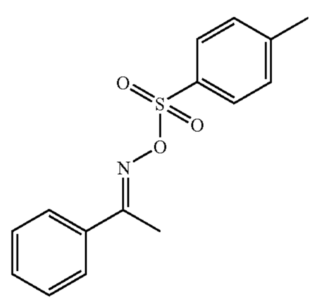
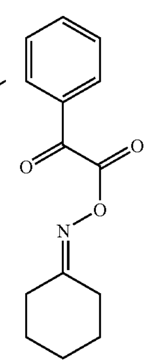
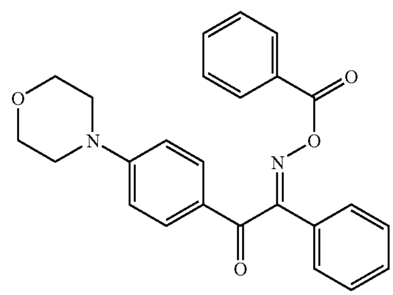

-continued

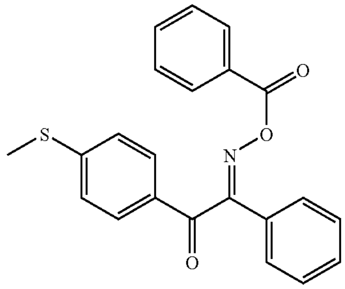

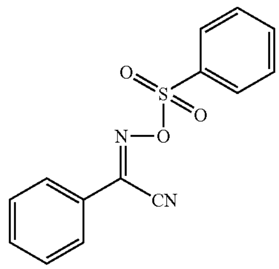

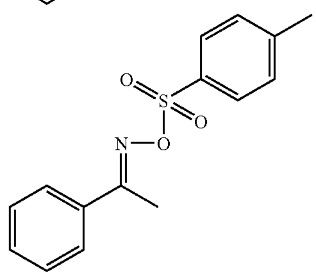

The onium salt compounds described above include, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci. Polymer Chem. Ed.,* 17, 1047 (1979), and arsonium salts described in C. S. Wen et al., *Teh, Proc. Conf. Rad. Curing ASIA*, p. 478, Tokyo, October (1988).

Particularly, in view of reactivity and stability, the oxime ester compounds and diazonium salts, iodonium salts and sulfonium salts described above are preferable.

The onium salts preferably used in the invention include onium salts represented by the following formulae (RI-I) to (RI-III):

$$Ar^{11}—N^{+}\equiv N \quad Z^{11-} \qquad \text{(RI-I)}$$

$$Ar^{21}—I^{+}—Ar^{22} \quad Z^{21-} \qquad \text{(RI-II)}$$

-continued $$R^{33}—S^{+}(R^{31})—R^{32} \quad Z^{31-} \qquad \text{(RI-III)}$$

In formula (RI-I), $Ar^{11}$ represents an aryl group having 20 or less carbon atoms, which may have 1 to 6 substituents. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{11-}$ represents a monovalent anion and specifically includes a halogen ion, a perchlorate ion, a hexafluorophosphate ion, a tetrafluoroborate ion, a sulfonate ion, a sulfinate ion, a thosulfonate ion and a sulfate ion. From the standpoint of stability and visibility of print-out image, a perchlorate ion, a hexafluorophosphate ion, a tetrafluoroborate ion, a sulfonate ion or a sulfinate ion is preferable.

In the formula (RI-II), $Ar^{21}$ and $Ar^{22}$ each independently represents an aryl group having 20 or less carbon atoms, which may have 1 to 6 substituents. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{21-}$ represents a monovalent anion and specifically includes a halogen ion, a perchlorate ion, a hexafluorophosphate ion, a tetrafluoroborate ion, a sulfonate ion, a sulfinate ion, a thosulfonate ion, a sulfate ion and a carboxylate ion. From the standpoint of stability and visibility of print-out image, a perchlorate ion, a hexafluorophosphate ion, a tetrafluoroborate ion, a sulfonate ion, a sulfinate ion or a carboxylate ion is preferable.

In the formula (RI-III), $R^{31}$, $R^{32}$ and $R^{33}$ each independently represents an aryl group having 20 or less carbon atoms, which may have 1 to 6 substituents, an alkyl group, an alkenyl group or an alkynyl group and is preferably an aryl group from the standpoint of reactivity and stability. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{31-}$ represents a monovalent anion and specifically includes a halogen ion, a perchlorate ion, a hexafluorophosphate ion, a tetrafluoroborate ion, a sulfonate ion, a sulfinate ion, a thosulfonate ion, a sulfate ion and a carboxylate ion. From the standpoint of stability and visibility of print-out image, a perchlorate ion, a hexafluorophosphate ion, a tetrafluoroborate ion, a sulfonate ion, a sulfinate ion or a carboxylate ion is preferable. Carboxylate ions described in JP-A-2001-343742 are more preferable, and carboxylate ions described in JP-A-2002-148790 are particularly preferable.

Specific examples of the onium salt compound preferably used as the polymerization initiator in the invention are set forth below, but the invention should not be construed as being limited thereto.

(N-1)

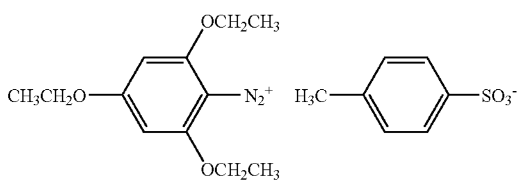

(N-2)

$PF_6^-$ (N-3)

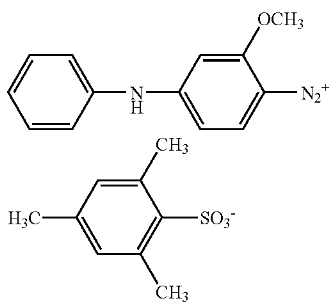

(N-4)

$ClO_4^-$ (N-5)

$PF_6^-$ (N-6)

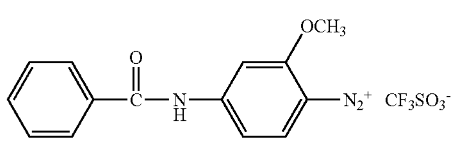

(N-7)

$BF_4^-$ (N-8)

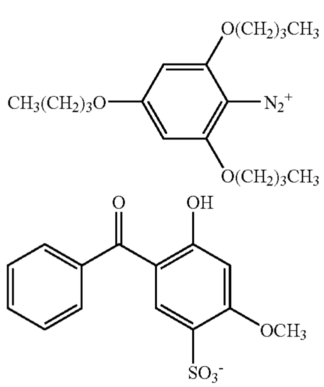

-continued (N-9)

$ClO_4^-$ (N-10)

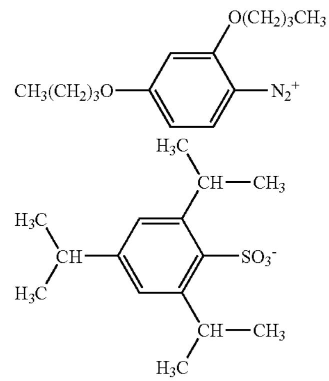

(N-11)

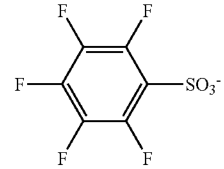

(N-12)

$PF_6^-$ (N-13)

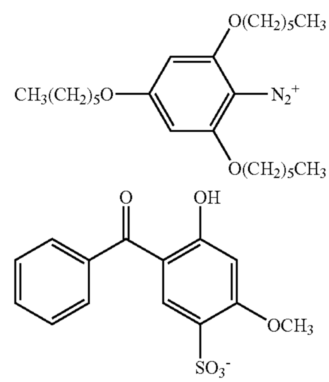

(N-14)

$ClO_4^-$ (N-15)

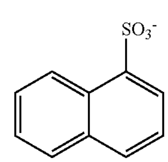

(N-16)

$PF_6^-$ (N-17)

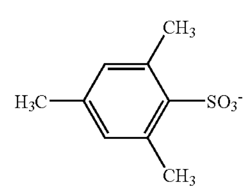

(I-1)

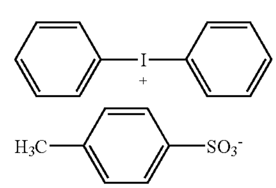

-continued
(I-2)
$PF_6^-$
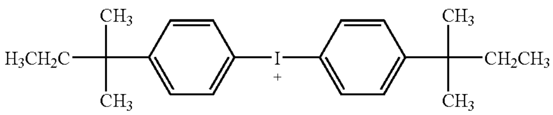
(I-3)
$PF_6^-$
(I-4)
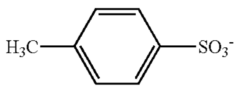
(I-5)
$ClO_4^-$
(I-6)
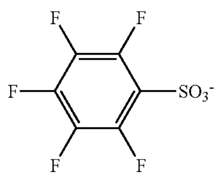
(I-7)
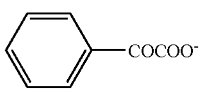
(I-8)
$CF_3SO_3^-$
(I-9)
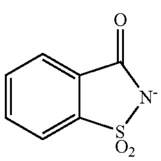
(I-10)
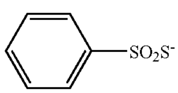
(I-11)
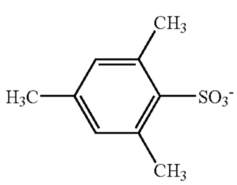
(I-12)
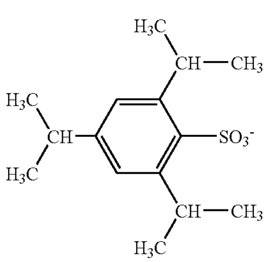
(I-13)
$BF_4^-$
(I-14)
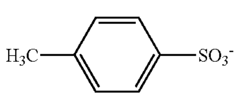
(I-15)
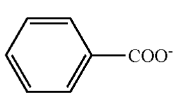
-continued
(I-16)
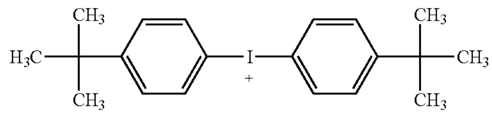
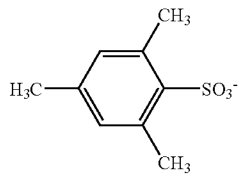
(I-17)
$ClO_4^-$
(I-18)
$PF_6^-$
(I-19)
$C_4F_9SO_3^-$
(I-20)
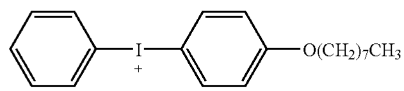
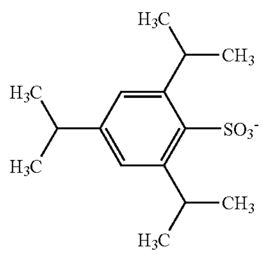
(I-21)
$CF_3COO^-$
(I-22)
$CF_3SO_3^-$
(I-23)
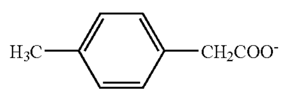
(I-24)
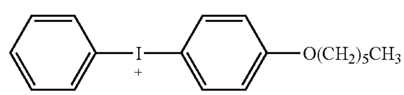
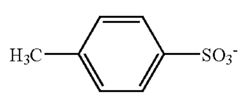
(I-25)
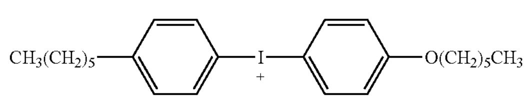
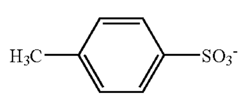
(I-26)
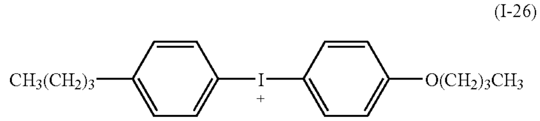
$C_4F_9COO^-$ -continued
(I-27)
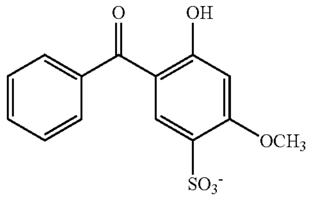
(I-28)
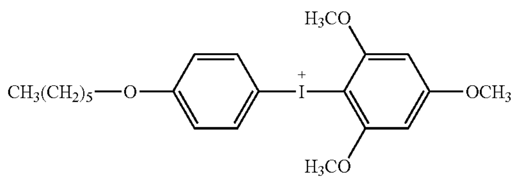
$PF_6^-$
(I-29)
$ClO_4^-$
(I-30)
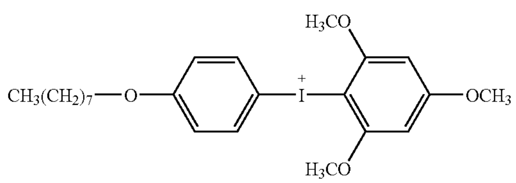
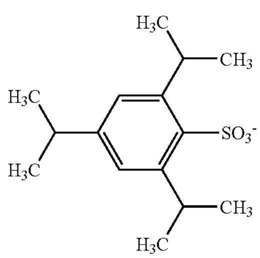
(I-31)
$PF_6^-$
(I-32)
$C_4F_9SO_3^-$
(I-33)
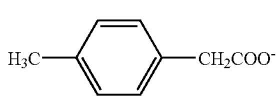
(I-34)
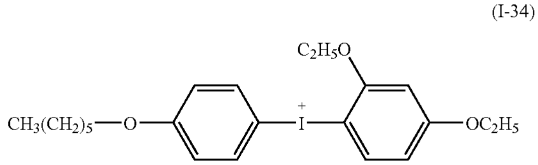
$BF_4^-$
(I-35)
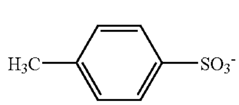
(I-36)
$PF_6^-$
-continued
(I-37)
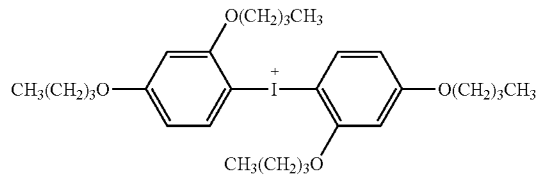
$PF_6^-$
(I-38)
$C_4F_9SO_3^-$
(I-39)
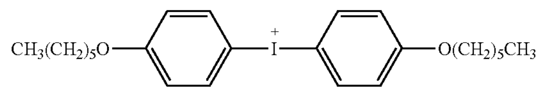
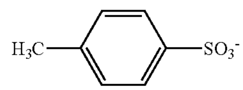
(S-1)
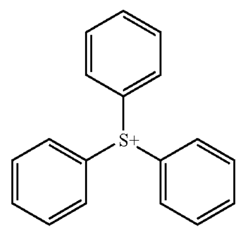
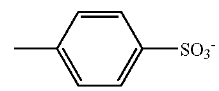
(S-2)
$PF_6^-$
(S-3)
$ClO_4^-$
(S-4)
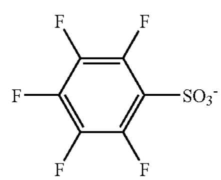
(S-5)
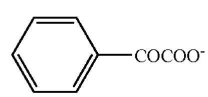
(S-6)
$CF_3SO_3^-$
(S-7)
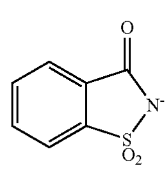
(S-8)
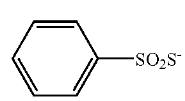
(S-9)
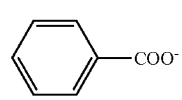

-continued (S-10)

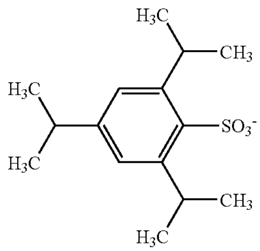

(S-11)

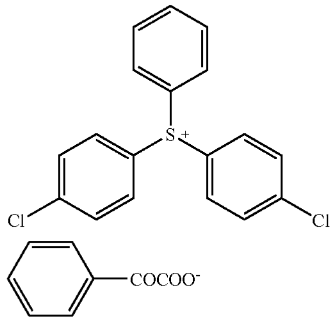

(S-12)

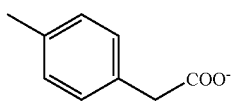

(S-13)

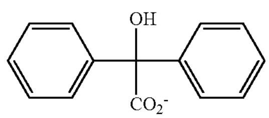

(S-14)

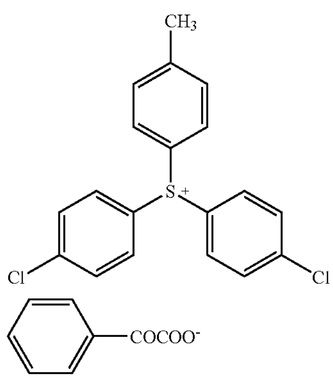

(S-15)

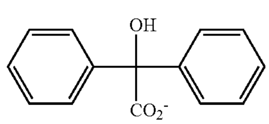

(S-16)

$BF_4^-$ (S-17)

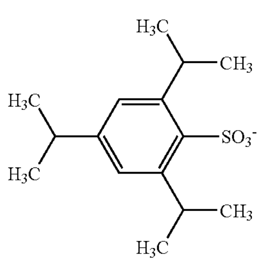

-continued (S-18)

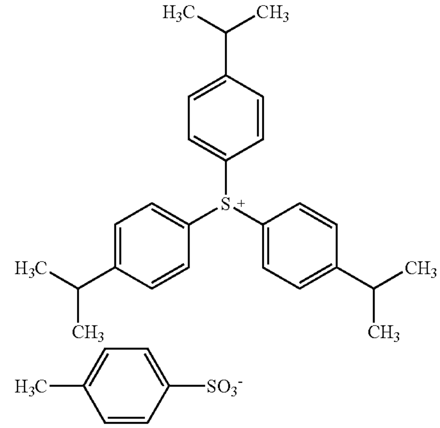

(S-19)

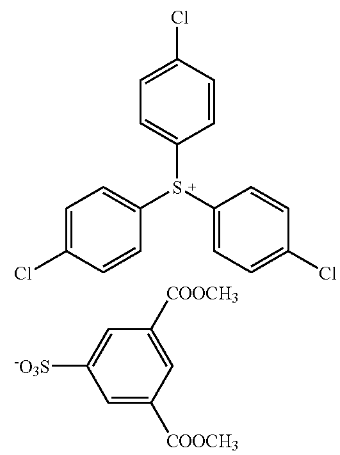

Also, a polymerization initiator having an azinium structure represented by formula (RI-IV) shown below may be used. In formula (RI-IV), $R^1$, $R^2$, $R^3$, $R^4$, $R^5$ and $R^6$ each independently represents a hydrogen atom, a halogen atom or a monovalent substituent, and $X^-$ represents an anion.

(RI-IV)

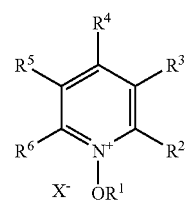

The monovalent substituent described above includes, for example, a halogen atom, an ammo group, a substituted amino group, substituted carbonyl group, a hydroxy group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonato group, a substituted sulfinyl group, a phosphono group, a substituted phosphono group, a phosphonato group and a substituted phosphonato group, and when it is possible to introduce a substituent, the monovalent substituent may further have a substituent.

The compound represented by formula (RI-IV) also includes a compound (multimer type) which contains in its molecule two or more of the skeletons (cation portions) of the specific structure in the compound represented by formula (R-IV) connected through $R^1$, and such a compound is also preferably used.

Moreover, the compound represented by formula (RI-IV) may be a compound (polymer type) in which the skeletons are introduced into a polymer side chain through any one of $R^1$ to $R^6$ and such an embodiment is also preferable.

Specific examples [Compounds A-1 to A-34] of the compound represented by formula (RI-IV) are set forth below, but the invention should not be construed as being limited thereto.

| | | logP |
|---|---|---|
| A-1 | 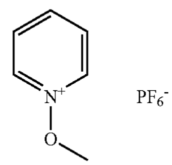 | 0.916 |
| A-2 | 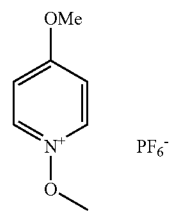 | 0.835 |
| A-3 | 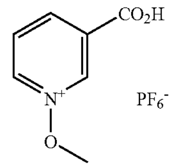 | 0.659 |
| A-4 | 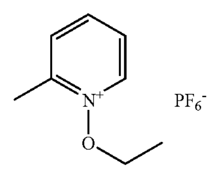 | 1.415 |
| A-5 | 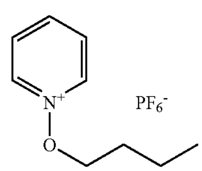 | 2.503 |
| A-6 | 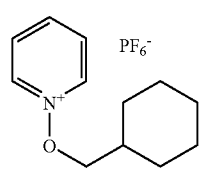 | 3.566 |
| A-7 | 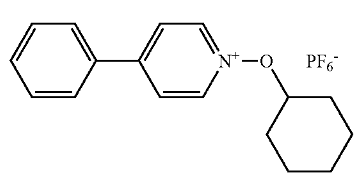 | 5.545 |
| A-8 | 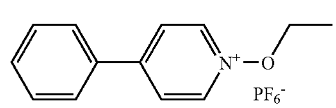 | 3.333 |

-continued
| | | logP |
|---|---|---|
| A-9 | 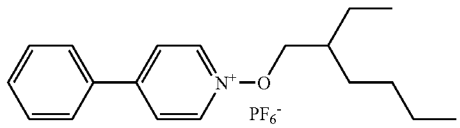 | 6.377 |
| A-10 | 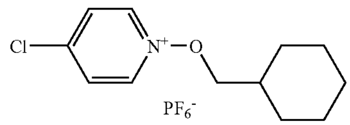 | 4.279 |
| A-11 | 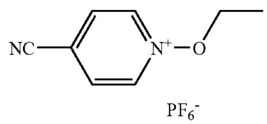 | 0.878 |
| A-12 | 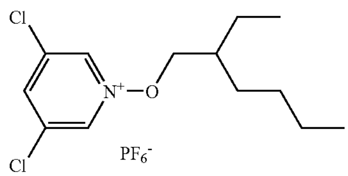 | 5.915 |
| A-13 | 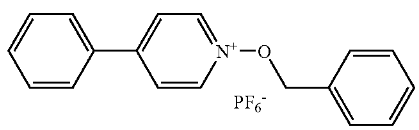 | 4.752 |
| A-14 | 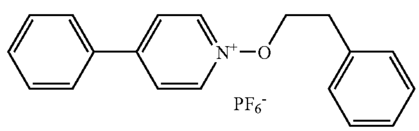 | 4.901 |
| A-15 | 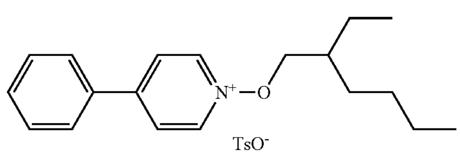 | 6.377 |
| A-16 | 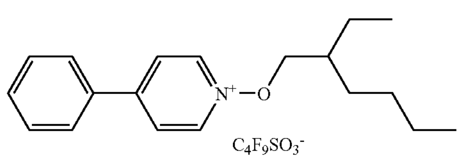 | 6.377 |
| A-17 | 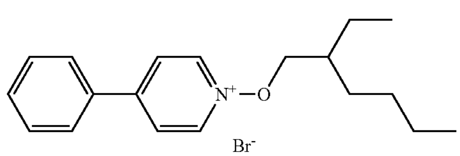 [SMILES: CCCCC(CC)CO[n+]1ccc(-c2ccccc2)cc1 ; [Br-]] | 6.377 |
| A-18 | 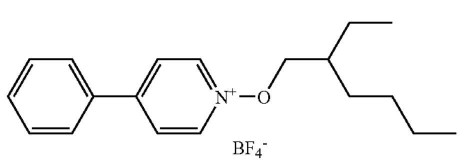 | 6.377 |

-continued
| | | logP |
|---|---|---|
| A-19 | 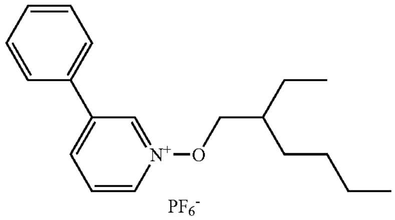 | 6.377 |
| A-20 | 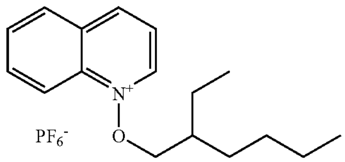 | 6.223 |
| A-21 | 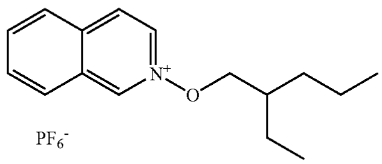 | 5.663 |
| A-22 | 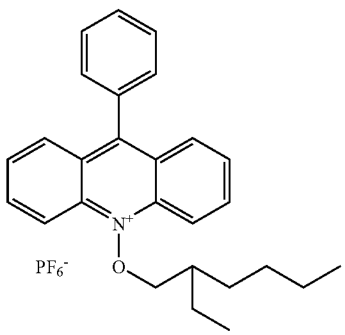 | 9.441 |
| A-23 | 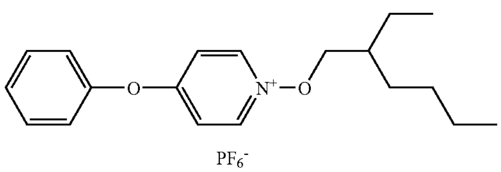 | 6.587 |
| A-24 | 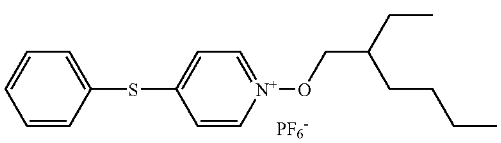 | 6.827 |
| A-25 | 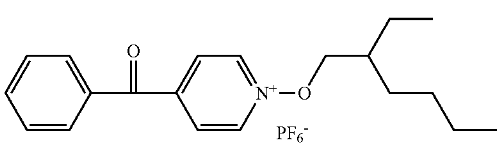 | 5.527 |
| A-26 | 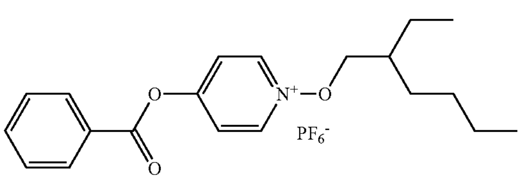 | 5.967 |

-continued
| | | logP |
|---|---|---|
| A-27 | 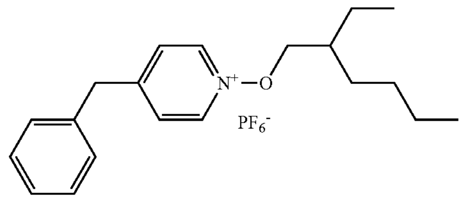 | 6.556 |
| A-28 | 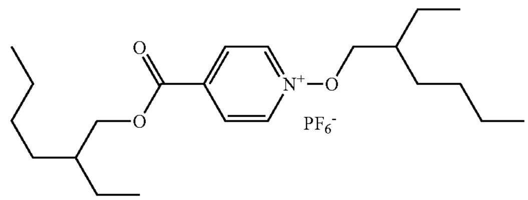 | 8.031 |
| A-29 | 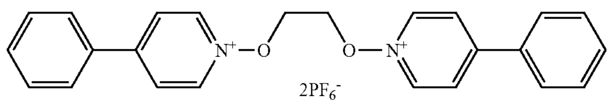 | 5.821 |
| A-30 | 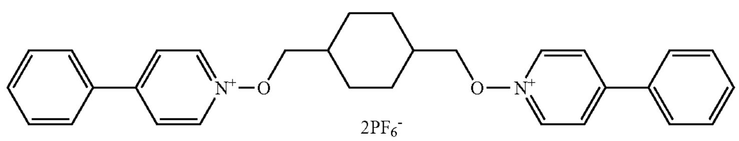 | 6.935 |
| A-31 | 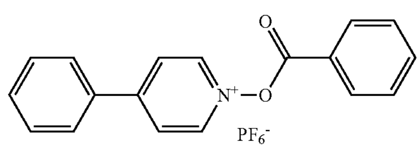 | 4.668 |
| A-32 | 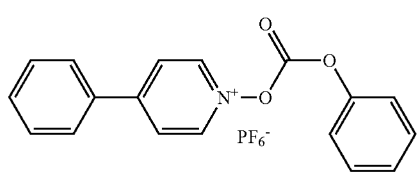 | 4.239 |
| A-33 | 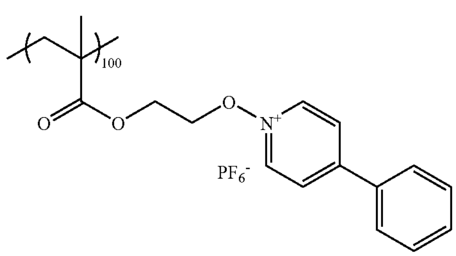 | |
| A-34 | 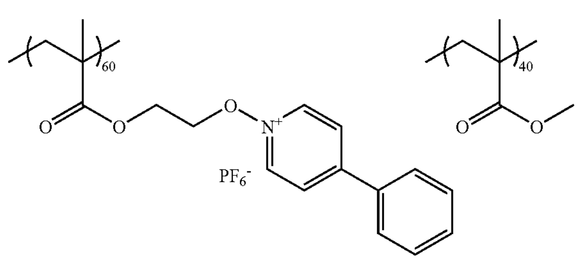 | |

The polymerization initiator is not limited to those described above. In particular, the triazine type initiators, organic halogen compounds, oxime ester compounds, diazonium salts, iodonium salts and sulfonium salts are more preferable from the standpoint of reactivity and stability. Of the polymerization initiators, onium salt compounds including as a counter ion, an inorganic anion, for example, $PF_6^-$ or $BF_4^-$ are preferable in combination with the infrared absorbing agent from the standpoint of improvement in the visibility of print-out image. Further, in view of excellence in the color-forming property, an diaryl iodonium is preferable as the onium.

The polymerization initiator can be added preferably in an amount from 0.1 to 50% by weight, more preferably from 0.5 to 30% by weight, particularly preferably from 0.8 to 20% by weight, based on the total solid content of the image-recording layer. In the range described above, good sensitivity and good stain resistance in the non-image area at the time of printing are obtained. The polymerization initiators may be used individually or in combination of two or more thereof. Further, the polymerization initiator may be added together with other components to the same layer or may be added to a different layer separately provided.

<(C) Polymerizable Monomer>

The polymerizable monomer for use in the invention is a compound having at least one addition-polymerizable ethylenically unsaturated double bond, and it is selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer or isocyanuric acid EO modified triacrylate;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane or bis[p-(methacryloxyethoxy)phenyl] dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonic acid esters, for example, ethylene glycol dicrotonate, tetramethylene glycol dicrotonate, pentaerythritol dicrotonate or sorbitol tetradicrotonate; isocrotonic acid esters, for example, ethylene glycol diisocrotonate, pentaerythritol diisocrotonate or sorbitol tetraisocrotonate; and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition polymerizable monomers produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (a) shown below to a polyisocyanate compound having two or more isocyanate groups per molecule, described in JP-B-48-41708.

$$CH_2{=}C(R^4)COOCH_2CH(R^5)OH \qquad (a)$$

wherein $R^4$ and $R^5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Furthermore, a photopolymerizable composition having remarkably excellent photosensitive speed can be obtained by using an addition polymerizable monomer having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with acrylic acid or methacrylic acid, described in JP-A48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photo-curable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable monomer, for example, selection of the structure, individual or combination use, or an amount added, can be appropriately arranged depending on the characteristic design of the final lithographic printing plate precursor. For instance, the compound is selected from the following standpoints.

In view of the sensitivity, a structure having a large content of unsaturated groups per molecule is preferred and in many cases, a bifunctional or more functional compound is preferred. In order to increase the strength of image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the image-recording layer. For instance, the compatibility may be improved in some cases by using the compound of low purity or using two or more kinds of the compounds in combination. A specific structure may be selected for the purpose of improving an adhesion property to a support or a protective layer described hereinafter. [0230]

The polymerizable monomer is preferably used in an amount from 5 to 80% by weight, more preferably from 25 to 75% by weight, based on the nonvolatile component of the image-recording layer. The polymerizable monomers may be used individually or in combination of two or more thereof. In the method of using the polymerizable monomer, the structure, blend and amount added can be appropriately selected by taking account of the extent of polymerization inhibition due to oxygen, resolution, fogging property, change in refractive index, surface tackiness and the like. Further, depending on the case, a layer construction, for example, an undercoat layer or an overcoat layer, and a coating method, may also be considered.

<Other Components of Image-Recording Layer>

The image-recording layer according to the invention may further contain various additives, if desired. Such additives will be described blow.

<1> Microcapsule and Microgel

In the invention, several embodiments can be employed in order to incorporate the above-described constituting components of the image-recording layer and other constituting components described hereinafter into the image-recording layer. One embodiment is an image-recording layer of molecular dispersion type prepared by dissolving the constituting components in an appropriate solvent to coat as described, for example, in JP-A-2002-287334. Another embodiment is an image-recording layer of microcapsule type prepared by encapsulating all or part of the constituting components into microcapsule to incorporate into the image-recording layer as described, for example, in JP-A-2001-277740 and JP-A-2001-277742. In the image-recording layer of microcapsule type, the constituting components may be present outside the microcapsules. It is a more preferable embodiment of the image-recording layer of microcapsule type that hydrophobic constituting components are encapsulated in microcapsules and hydrophilic components are present outside the microcapsules.

A still another embodiment is an image-recording layer containing a crosslinked resin particle, that is, a microgel. The microgel can contain a part of the constituting components inside and/or on the surface thereof. Particularly, an embodiment of a reactive microgel containing the polymerizable monomer (C) on the surface thereof is preferable in view of the image-forming sensitivity and printing durability.

In order to achieve more preferable on-machine development property, the image-recording layer is preferably the image-recording layer of microcapsule type or microgel type.

As a method of microencapsulation or microgelation of the constituting components of the image-recording layer, known methods can be used.

Methods of producing the microcapsule include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and polyurea and polyurethane are particularly preferred. Further, a compound having a crosslinkable functional group, for example, an ethylenically unsaturated bond, capable of being introduced into the binder polymer described hereinafter may be introduced into the microcapsule wall.

On the other hand, methods of preparing the microgel include, for example, a method of utilizing granulation by interfacial polymerization described in JP-B-38-19574 and JP-B-42-446 and a method of utilizing granulation by dispersion polymerization in a non-aqueous system described in JP-A-5-61214, but the invention should not be construed as being limited thereto.

To the method utilizing interfacial polymerization, known production methods of microcapsule can be applied.

The microgel preferably used in the invention is granulated by interfacial polymerization and has three-dimensional crosslinking. From this point of view, a preferable material to be used includes polyurea, polyurethane, polyester, polycarbonate, polyamide and a mixture thereof, and polyurea and polyurethane are particularly preferred.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time-lapse stability can be achieved.

<2> Binder Polymer

In the image-recording layer according to the invention, a binder polymer can be used for the purpose of improving a film strength of the image-recording layer. The binder polymer which can be used in the invention can be selected from those heretofore known without restriction, and polymers having a film-forming property are preferable. Examples of the binder polymer include acrylic resins, polyvinyl acetal resins, polyurethane resins, polyurea resins, polyimide resins, polyamide resins, epoxy resins, methacrylic resins, polystyrene resins, novolac type phenolic resins, polyester resins, synthesis rubbers and natural rubbers.

The binder polymer may have a crosslinkable property in order to improve the film strength of the image area. In order to impart the crosslinkable property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include $—(CH_2)_nCR^1═CR^2R^3$, $—(CH_2O)_nCH_2CR^1═CR^2R^3$, $—(CH_2CH_2O)_nCH_2CR^1═CR^2R^3$, $—(CH_2)_nNH—CO—O—CH_2CR^1═CR^2R^3$, $—(CH_2)_n—O—CO—CR^1═CR^2R^3$ and $—(CH_2CH_2O)_2—X$ (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include $—CH_2CH═CH_2$ (described in JP-B-7-21633), $—CH_2CH_2O—CH_2CH═CH_2$, $—CH_2C(CH_3)═CH_2$, $—CH_2CH═CH—C_6H_5$, $—CH_2CH_2OCOCH═CH—C_6H_5$, $—CH_2CH_2—NHCOO—CH_2CH═CH_2$ and $—CH_2CH_2O—X$ (wherein X represents a dicyclopentadienyl residue).

Specific examples of the amide residue include $—CH_2CH═CH_2$, $—CH_2CH_2—Y$ (wherein Y represents a cyclohexene residue) and $—CH_2CH_2—OCO—CH═CH_2$.

The binder polymer having crosslinkable property is cured, for example, by addition of a free radical (a polymerization initiating radical or a growing radical of a polymerizable compound during polymerization) to the crosslinkable functional group of the polymer and undergoing addition polymerization between the polymers directly or through a polymerization chain of the polymerizable compound to form crosslinkage between the polymer molecules. Alternately, it is cured by generation of a polymer radical upon extraction of an atom (for example, a hydrogen atom on a carbon atom adjacent to the functional crosslinkable group) in the polymer by a free radial and connecting the polymer radicals with each other to form cross-linkage between the polymer molecules.

The content of the crosslinkable group in the binder polymer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the binder polymer. In the range described above, good sensitivity and good preservation stability can be obtained.

From the standpoint of improvement in the on-machine development property in the unexposed area of the image-recording layer, it is preferred that the binder polymer has high solubility or high dispersibility in ink and/or dampening water. In order to increase the solubility or dispersibility in the ink, the binder polymer is preferably oleophilic and in order to increase the solubility or dispersibility in the dampening water, the binder polymer is preferably hydrophilic. Therefore, it is effective in the invention that an oleophilic binder polymer and a hydrophilic binder polymer are used in combination.

The hydrophilic binder polymer preferably includes, for example, a polymer having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group or a phosphoric acid group.

Specific examples the hydrophilic binder polymer include gum arabic, casein, gelatin, a starch derivative, carboxy methyl cellulose and a sodium salt thereof cellulose acetate, sodium alginate, a vinyl acetate-maleic acid copolymer, a styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or copolymer of acrylamide, a homopolymer or polymer of methacrylamide, a homopolymer or copolymer of N-methylolacrylamide, polyvinyl pyrrolidone, an alcohol-soluble nylon, a polyether of 2,2-bis-(4-hydroxyphenyl)propane and epichlorohydrin.

The weight average molecular weight of the binder polymer is preferably 5,000 or more, more preferably from 10,000 to 300,000. The number average molecular weight of the binder polymer is preferably 1,000 or more, more preferably from 2,000 to 250,000. The polydispersity (weight average molecular weight/number average molecular weight) thereof is preferably from 1.1 to 10.

The binder polymer is available by purchasing a commercial product or synthesizing according to a known method.

The content of the binder polymer is ordinarily from 5 to 90% by weight, preferably from 5 to 80% by weight, more preferably from 10 to 70% by weight, based on the total solid content of the image-recording layer. In the range described above, good strength of the image area and good image-forming property can be obtained.

It is preferred that the polymerizable monomer (C) and the binder polymer are used in a weight ratio of 0.5/1 to 4/1.

<3> Surfactant

In the image-recording layer according to the invention, a surfactant can be used in order to promote the on-machine development property and to improve the state of coated surface. The surfactant used includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and those hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and those hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxyethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and those hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and those hitherto known can be used. Examples of the amphoteric surfactant include carboxybetaines, aminocarboxylic acids, sulfobetaines, aminosulfuric esters, and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferable surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants can be used individually or in combination of two or more thereof.

The content of the surfactant is preferably from 0.001 to 10% by weight, more preferably from 0.01 to 5% by weight, based on the total solid content of the image-recording layer.

<4> Coloring Agent

In the image-recording layer according to the invention, a dye having a large absorption in the visible region can be used as a coloring agent of the image formed. Specifically, the dye includes Oil yellow #101, Oil yellow #103, Oil pink #312, Oil green BG, Oil blue BOS, Oil blue #603, Oil black BY, Oil black BS, Oil black T-505 (produced by Orient Chemical Industries, Ltd.), Victoria pure blue, Crystal violet (CI42555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily conducted after the formation of image. The amount of the coloring agent added is preferably from 0.01 to 10% by weight based on the total solid content of the image-recording layer.

<5> Print-Out Agent

To the image-recording layer according to the invention, a compound undergoing discoloration with an acid or radical can be added in order to form a print-out image. As a compound used for such a purpose, various dyes, for example, of diphenylmethane type, triphenylmethane type, thiazine type, oxazine type, xanthene type, anthraquinone type, iminoquinone type, azo type and azomethine type are effectively used.

Specific examples thereof include dyes, for example, Brilliant green, Ethyl violet, Methyl green, Crystal violet, basic Fuchsine, Methyl violet 2B, Quinaldine red, Rose Bengal, Methanyl yellow, Thimol sulfophthalein, Xylenol blue, Methyl orange, Paramethyl red, Congo red, Benzo purpurin 4B, □-Naphthyl red, Nile blue 2B, Nile blue A, Methyl violet, Malachite green, Parafuchsine, Victoria pure blue BOH (produced by Hodogaya Chemical Co., Ltd.), Oil blue #603 (produced by Orient Chemical Industries, Ltd.), Oil pink #312 (produced by Orient Chemical Industries, Ltd.), Oil red 5B (produced by Orient Chemical Industries, Ltd.), Oil scarlet #308 (produced by Orient Chemical Industries, Ltd.), Oil red OG (produced by Orient Chemical Industries, Ltd.), Oil red RR (produced by Orient Chemical Industries, Ltd.), Oil green #502 (produced by Orient Chemical Industries, Ltd.), Spiron Red BEH special (produced by Hodogaya Chemical Co., Ltd.), m-Cresol purple, Cresol red, Rhodamine B, Rhodamine 6G, Sulfo rhodamine B, Auramine, 4-p-diethylaminophenylaminonaphthoquione, 2-carboxyanilino-4-p-diethylaminophenyliminonaphthoquinone, 2-carboxystearylamino-4-p-N,N-bis(hydroxyethyl)aminophenylimino-naphthoquinone, 1-phenyl-3-methyl-4-p-diethylaminophenylimino-5-pyrazolon or 1-□-naphtyl-4-p-diethylaminophenylimino-5-pyrazolon, and a leuco dye, for example, p, p', p"-hexamethyltriaminotriphenylmethane (leuco crystal violet) or Pergascript Blue SRB (produced by Ciba Geigy Ltd.).

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(n-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N—N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-pipelidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The amount of the dye undergoing discoloration with an acid or radical is preferably from 0.01 to 10% by weight based on the solid content of the image-recording layer.

<6> Polymerization Inhibitor

It is preferred to add a small amount of a thermal polymerization inhibitor to the image-recording layer according to the invention in order to inhibit undesirable thermal polymerization of the polymerizable monomer (C) during the production or preservation of the image-recording layer.

The thermal polymerization inhibitor preferably includes, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt. The amount of the thermal polymerization inhibitor added is preferably from about 0.01 to about 5% by weight based on the total solid content of the image-recording layer.

<7> Higher Fatty Acid Derivative

To the image-recording layer according to the invention, a higher fatty acid derivative, for example, behenic acid or behenic acid amide may be added to localize on the surface of the image-recording layer during a drying step after coating in order to avoid polymerization inhibition due to oxygen. The amount of the higher fatty acid derivative added is preferably from about 0.1 to about 10% by weight based on the total solid content of the image-recording layer.

<8> Plasticizer

The image-recording layer according to the invention may contain a plasticizer in order to improve the on-machine development property.

The plasticizer preferably includes, for example, a phthalic acid ester, e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, e.g., dimethylglycol phthalate, ethylphthalylethyl glycolate, methylphthalylethyl glycolate, butylphthalylbutyl glycolate or triethylene glycol dicaprylate ester; a phosphoric acid ester, e.g., tricresyl phosphate or triphenyl phosphate; an aliphatic dibasic acid ester, e.g., diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate.

The amount of the plasticizer is preferably about 30% by weight or less based on the total solid content of the image-recording layer.

<9> Fine Inorganic Particle

The image-recording layer according to the invention may contain fine inorganic particle in order to increase the strength of cured film and to improve the on-machine development property.

The fine inorganic particle preferably includes, for example, silica, alumina, magnesium oxide, titanium oxide, magnesium carbonate, calcium alginate and a mixture thereof. The fine inorganic particle can be used, for example, for strengthening the film or enhancing interface adhesion property due to surface roughening.

The fine inorganic particle preferably has an average particle size from 5 nm to 10 μm, more preferably from 0.5 to 3 μm. In the range described above, it is stably dispersed in the image-recording layer, sufficiently maintains the film strength of the image-recording layer and can form the non-imaging area excellent in hydrophilicity and prevented from stain at the time of printing.

The fine inorganic particle described above is easily available as a commercial product, for example, colloidal silica dispersion.

The amount of the fine inorganic particle added is preferably 40% by weight or less, more preferably 30% by weight or less, based on the total solid content of the image-recording layer.

<10> Hydrophilic Low Molecular Weight Compound

The image-recording layer according to the invention may contain a hydrophilic low molecular weight compound in order to improve the on-machine development property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof.

Of the compounds, sodium salt or lithium salt of an organic sulfonic acid, organic sulfamic acid or organic sulfuric acid is preferably used. By incorporating such a compound into the image-recording layer, it is possible to improve the on-machine development property without degrading the printing durability.

Specific examples of the salt of organic sulfonic acid include sodium n-butylsulfonate, sodium isobutylsulfonate, sodium sec-butylsulfonate, sodium tert-butylsulfonate, sodium n-pentylsulfonate, sodium 1-ethylpropylsulfonate, sodium n-hexylsulfonate, sodium 1,2-dimethylpropylsulfonate, sodium 2-ethylbutylsulfonate, sodium cyclohexylsulfonate, sodium n-heptylsulfonate, sodium n-octylsulfonate, sodium tert-octylsulfonate, sodium n-nonylsulfonate, sodium allylsulfonate, sodium 2-methylallylsulfonate, sodium benzenesulfonate, sodium p-toluenesulfonate, sodium p-hydroxybenzenesulfonate, sodium p-styrenesulfonate, sodium isophthalic acid dimethyl-5-sulfonate, disodium 1,3-benzenedisulfonate, trisodium 1,3,5-benzenetrisulfonate, sodium p-chlorobenzenesulfonate, sodium 3,4-dichlorobenzenesulfonate, sodium 1-naphtylsulfonate, sodium 2-naphtylsulfonate, sodium 4-hydroxynaphtylsulfonate, disodium 1,5-naphtyldisulfonate, disodium 2,6-naphtyldisulfonate, trisodium 1,3,6-naphtyltrisulfonate and lithium salts of these compounds wherein the sodium is exchanged with lithium.

Specific examples of the salt of organic sulfamic acid include sodium n-butylsulfamate, sodium isobutylsulfamate, sodium tert-butylsulfamate, sodium n-pentylsulfamate, sodium 1-ethylpropylsulfamate, sodium n-hexylsulfamate, sodium 1,2-dimethylpropylsulfamate, sodium 2-ethylbutylsulfamate, sodium cyclohexylsulfamate and lithium salts of these compounds wherein the sodium is exchanged with lithium.

The hydrophilic low molecular weight compound has the hydrophobic part of a small structure and almost no surface active function so that it can be clearly distinguished from the surfactant described hereinbefore in which a long-chain alkylsulfonate or a long-chain alkylbenzenesulfonate is preferably used.

As the salt of organic sulfuric acid, a compound represented by formula (VI) shown below is particularly preferably used.

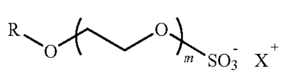

(VI)

In formula (VI), R represents a substituted or unsubstituted alkyl group, a substituted or unsubstituted alkenyl group, a substituted or unsubstituted alkynyl group, a substituted or unsubstituted aryl group or a substituted or unsubstituted heterocyclic group, m represents an integer of 1 to 4, and X represents sodium, potassium or lithium.

R in formula (VI) preferably represents a substituted or unsubstituted, straight-chain, branched or cyclic alkyl group having from 1 to 12 carbon atoms, a substituted or unsubstituted alkenyl group having from 1 to 12 carbon atoms, a substituted or unsubstituted alkynyl group having from 1 to 12 carbon atoms or a substituted or unsubstituted aryl group having 20 or less carbon atoms. Examples of the substituent include a straight-chain, branched or cyclic alkyl group having from 1 to 12 carbon atoms, an alkenyl group having from 1 to 12 carbon atoms, an alkynyl group having from 1 to 12 carbon atoms, a halogen atom and an aryl group having 20 or less carbon atoms.

Preferable examples of the compound represented by formula (VI) include sodium oxyethylene 2-ethylhexyl ether sulfate, sodium dioxyethylene 2-ethylhexyl ether sulfate, potassium dioxyethylene 2-ethylhexyl ether sulfate, lithium dioxyethylene 2-ethylhexyl ether sulfate, sodium trioxyethylene 2-ethylhexyl ether sulfate, sodium tetraoxyethylene 2-ethylhexyl ether sulfate, sodium dioxyethylene hexyl ether sulfate, sodium dioxyethylene octyl ether sulfate and sodium dioxyethylene lauryl ether sulfate. Most preferable examples thereof include sodium dioxyethylene 2-ethylhexyl ether sulfate, potassium dioxyethylene 2-ethylhexyl ether sulfate and lithium dioxyethylene 2-ethylhexyl ether sulfate.

The amount of the hydrophilic low molecular weight compound added to the image-recording layer is preferably from 0.5 to 20% by weight, more preferably from 1 to 10% by weight, still more preferably from 2 to 8% by weight, based on the total solid content of the image-recording layer. In the range described above, good on-machine development property and good printing durability are achieved.

The hydrophilic low molecular weight compounds may be used individually or as a mixture of two or more thereof.

<11> Oil-Sensitizing Agent

In the invention, a phosphonium compound may be used together with the specific polymer according to the invention in order to improve the ink-receptive property. The phosphonium compound functions as a surface covering agent (oil-sensitizing agent) for the inorganic stratiform compound to prevent degradation of the ink-receptive property due to the inorganic stratiform compound during printing. As preferable examples of the phosphonium compound, phosphonium compounds described in JP-A-2006-297907 and a compound represented by formula (VII) shown below are exemplified.

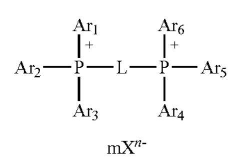

(VII)

In formula (VII), $Ar_1$ to $Ar_6$ each independently represents an aryl group or a heterocyclic group, L represents a divalent connecting group, $X^{n-}$ represents a n-valent counter anion, n represents an integer of 1 to 3, and m represents a number satisfying n×m=2.

In formula (VI), the aryl group preferably includes, for example, a phenyl group, a naphthyl group, a tolyl group, a xylyl group, a fluorophenyl group, a chlorophenyl group, a bromophenyl group, a methoxyphenyl group, an ethoxyphenyl group, a dimethoxyphenyl group, a methoxycarbonylphenyl group and a dimethylaminophenyl group. The heterocyclic group preferably includes, for example, a pyridyl group, a quinolyl group, a pyrimidinyl group, a thienyl group and a furyl group. L is preferably a connecting group having from 6 to 15 carbon atoms, more preferably a connecting group having from 6 to 12 carbon atoms.

Preferable examples of the counter anion represented by $X^{n-}$ include a halogen anion, for example, $Cl^-$, $Br^-$ or $I^-$, a sulfonate anion, a carboxylate anion, a sulfate ester anion, $PF_6^-$, $BF_4^-$ and a perchlorate anion. Among them, a halogen anion, for example, $Cl^-$, $Br^-$ or $I^-$, a sulfonate anion and a carboxylate anion are particularly preferable.

Specific examples of the phosphonium compound represented by formula (VII) are set forth below.

-continued
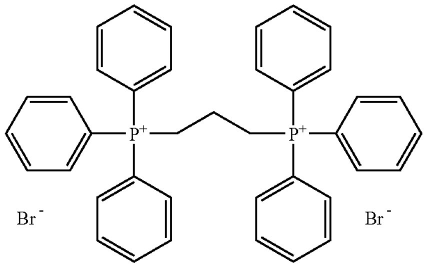
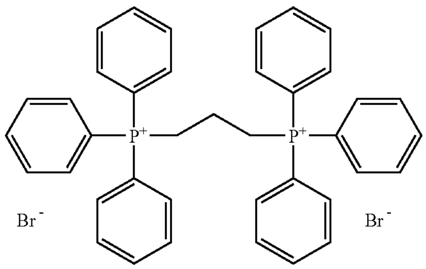
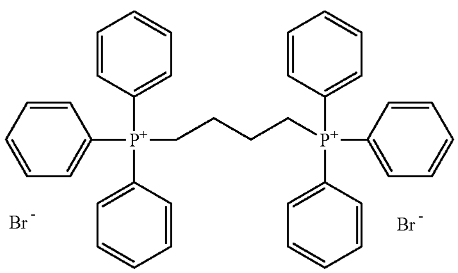
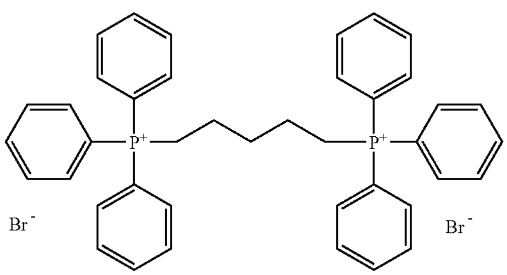
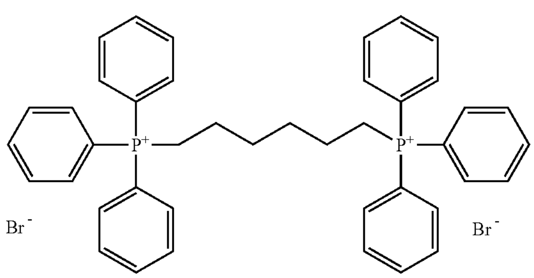
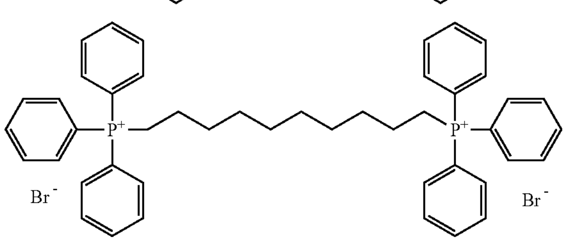
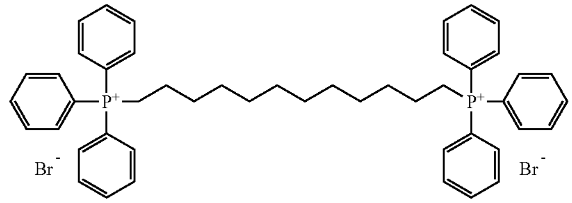
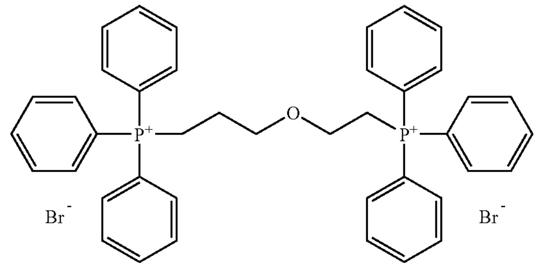
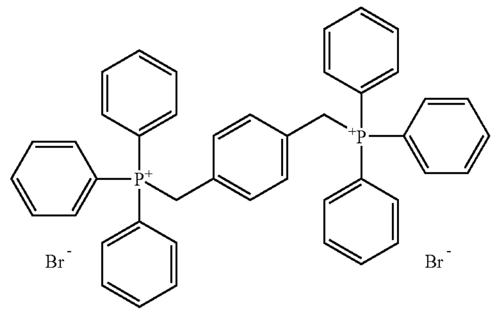
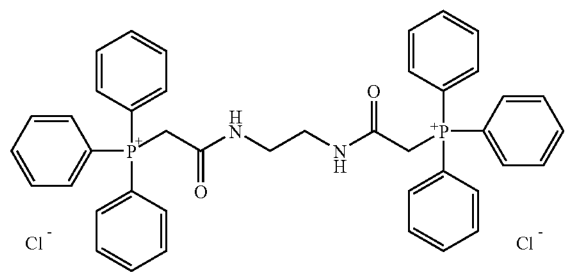
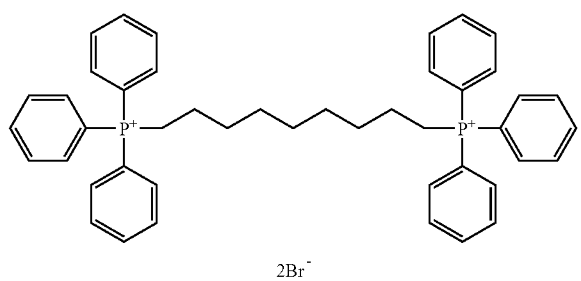
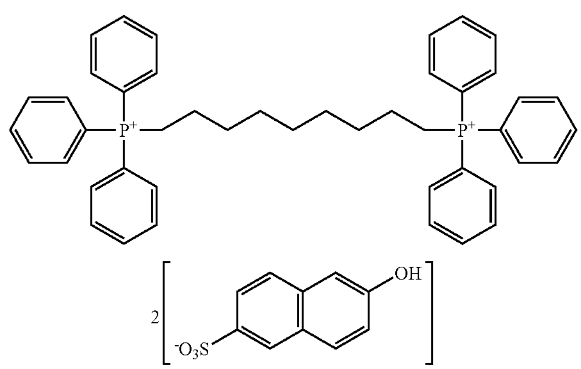

-continued

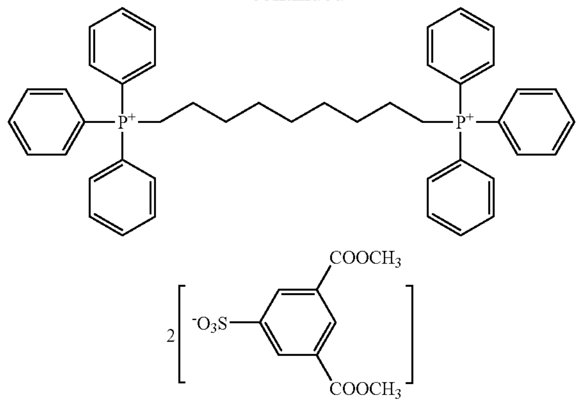

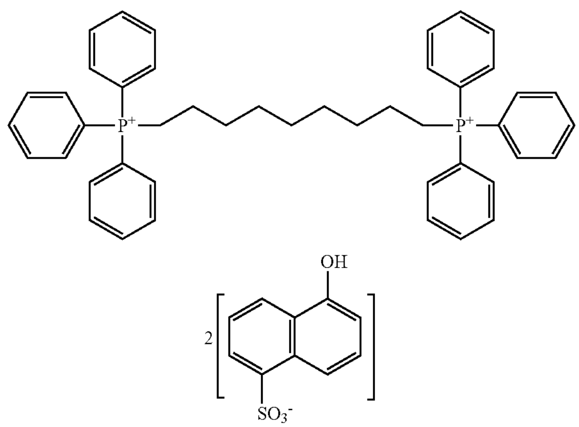

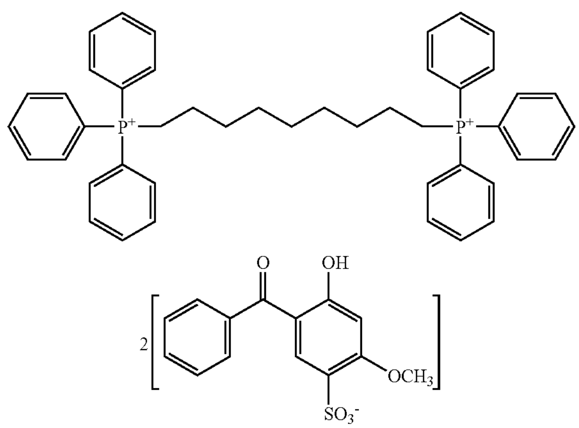

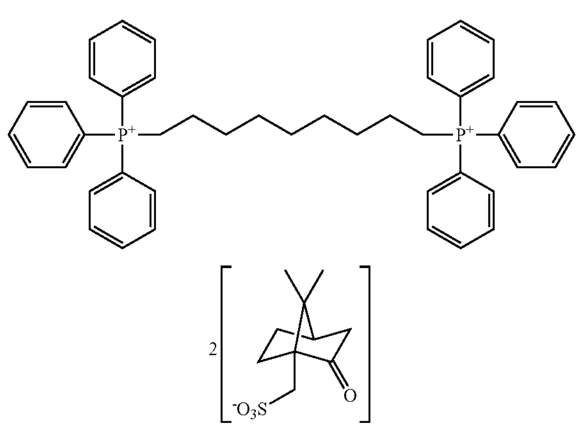

-continued

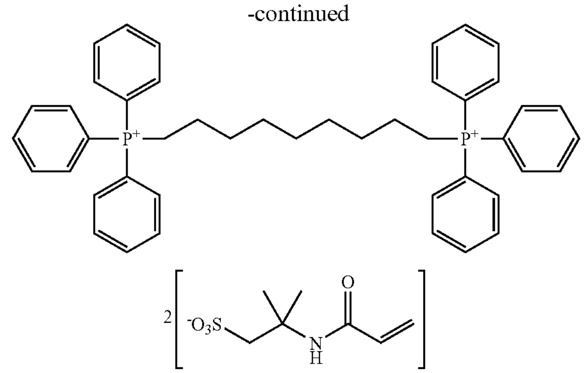

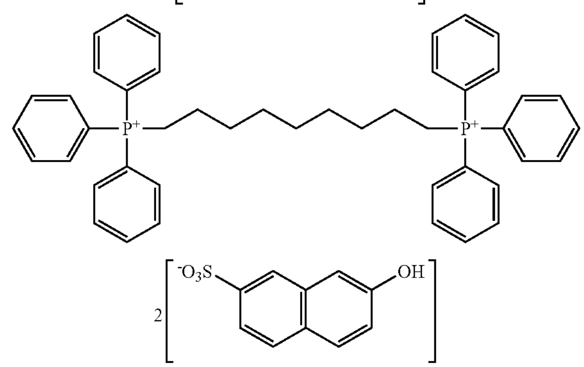

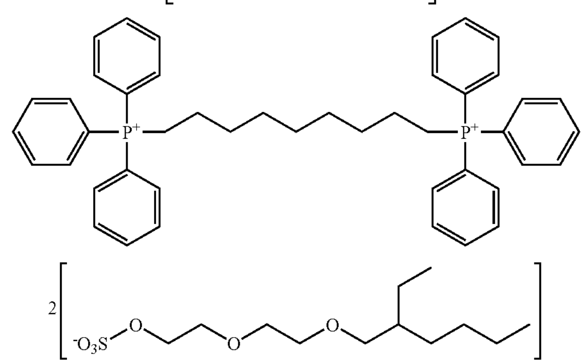

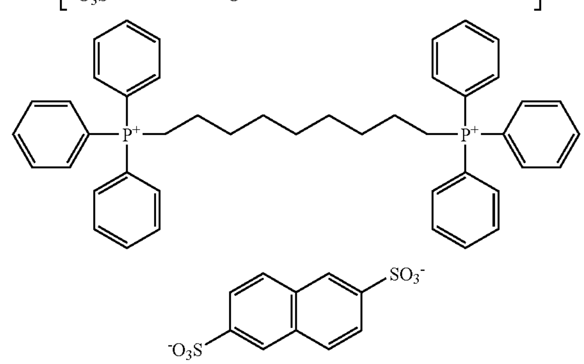

The amount of the phosphonium compound added to the image-recording layer is preferably from 0.01 to 20% by weight, more preferably from 0.05 to 10% by weight, most preferably from 0.1 to 5% by weight, based on the solid content of the image-recording layer. In the range described above, good ink-receptive property is obtained.

The oil-sensitizing agent may be added not only to the image-recording layer but also to the protective layer.

<12> Co-Sensitizer

To the image-recording layer according to the invention may be added a known compound referred to as a co-sensitizer or chain transfer agent, which has a function, for example, of further increasing sensitivity or of preventing polymerization inhibition due to oxygen. It is preferred to use the co-sensitizer in the case of a lithographic printing plate precursor for blue laser beam having a wavelength of 360 to 450 nm, which is particularly demanded high sensitivity.

Examples of such a compound include amines, for example, compounds described in M. R. Sander et al, *Journal of Polymer Society*, Vol., 10, page 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825, and specifically, for example, triethanolamine, ethyl p-dimethylaminobenzoate, p-formyldimethylaniline and p-methylthiodimethylaniline.

As another example of the compound acting as a chain transfer agent, a compound having SH, PH, SiH or GeH in its molecule is exemplified. The compound donates hydrogen to a low active radical species to generate a radical or is oxidized and deprotonized to generate a radical.

In the image-recording layer according to the invention, a thiol compound, for example, a 2-mercaptobenzimidazole, 2-mercaptobenzothiazole, 2-mercaptobenzoxazole, a 3-mercaptotriazole or a 5-mercaptotetrazole) is particularly preferably used as the chain transfer agent.

Particularly, a thiol compound described in JP-A-2006-91479, which is represented by formula (VIII) shown below is preferably used. By using the thiol compound as the chain transfer agent, the problem of the odor and the decrease in sensitivity due to the evaporation from the image-recording layer or diffusion into other layers are avoided and a lithographic printing plate precursor which is excellent in preservation stability and exhibits high sensitivity and good printing durability is obtained.

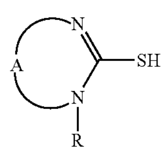

(VIII)

In formula (VIII), R represents an alkyl group which may have a substituent or an aryl group which may have a substituent, and A represents an atomic group necessary for forming a 5-membered or 6-membered hetero ring containing a carbon atom together with the N═C—N linkage, and A may have a substituent.

A compound represented by formula (VIIIA) or (VIIIB) shown below is more preferably used.

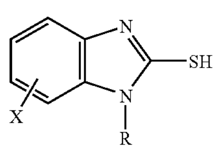

(VIIIA)

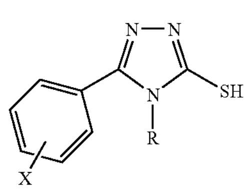

(VIIIB)

In formulae (VIIIA) and (VIIIB), R represents an alkyl group which may have a substituent or an aryl group which may have a substituent, and X represents a hydrogen atom, a halogen atom, an alkoxy group which may have a substituent, an alkyl group which may have a substituent or an aryl group which may have a substituent.

Specific examples of the thiol compound include 1-methyl-2-mercaptobenzimidazole, 1-propyl-2-mercaptobenzimidazole, 1-hexyl-2-mercaptobenzimidazole, 1-hexyl-2-mercapto-5-chlorobenzimidazole, 1-pentyl-2-mercaptobenzimidazole, 1-octyl-2-mercaptobenzimidazole, 1-octyl-2-mercapto-5-methoxybenzimidazole, 1-cyclohexyl-2-mercaptobenzimidazole, 1-phenyl-2-mercaptobenzimidazole, 1-phenyl-2-mercapto-5-methylsulfonylbenzimidazole, 1-(p-tolyl)-2-mercaptobenzimidazole, 1-methoxyethyl-2-mercaptobenzimidazole, 1-butyl-2-mercaptonaphthimidazole, 1-methyl-2-mercapro-5-phenyl-1,3,5-triazole, 1-butyl-2-mercapro-5-phenyl-1,3,5-triazole, 1-heptyl-2-mercapro-5-phenyl-1,3,5-triazole, 1-phenyl-2-mercapro-5-phenyl-1,3,5-triazole, 1-benzyl-2-mercapro-5-phenyl-1,3,5-triazole, 1-phenetyl-2-mercapro-5-phenyl-1,3,5-triazole, 1-cyclohexyl-2-mercapro-5-phenyl-1,3,5-triazole, 1-phenetyl-2-mercapro-5-(3-fluorophenyl)-1,3,5-triazole, 1-phenetyl-2-mercapro-5-(3-trifluoromethylphenyl)-1,3,5-triazole, 1-benzyl-2-mercapro-5-(p-tolyl)-1,3,5-triazole, 1-benzyl-2-mercapro-5-(4-methyoxyphenyl)-1,3,5-triazole, 1-benzyl-2-mercapro-5-(p-trifluoromethylphenyl)-1,3,5-triazole, 1-benzyl-2-mercapro-5-(3,5-dichlorophenyl)-1,3,5-triazole, 1-phenyl-2-mercapro-5-(p-tolyl)-1,3,5-triazole, 1-phenyl-2-mercapro-5-(4-methoxyphenyl)-1,3,5-triazole, 1-(1-naphthyl)-2-mercapro-5-phenyl-1,3,5-triazole, 1-(4-bromophenyl)-2-mercapro-5-phenyl-1,3,5-triazole and 1-(4-fluorophenyl)-2-mercapro-5-phenyl-1,3,5-triazole.

The amount of the co-sensitizer used is preferably from 0.01 to 20% by weight, more preferably from 0.1 to 15% by weight, still more preferably from 1.0 to 10% by weight, based on the total solid content of the image-recording layer.

<Formation of Image-Recording Layer>

The image-recording layer according to the invention is formed by dispersing or dissolving each of the necessary constituting components described above in a solvent to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, □-butyrolactone, toluene and water, but the invention should not be construed as being limited thereto. The solvents may be used individually or as a mixture. The solid content concentration of the coating solution is preferably from 1 to 50% by weight.

The image-recording layer according to the invention may also be formed by preparing plural coating solutions by dispersing or dissolving the same or different components described above into the same or different solvents and conducting repeatedly the coating and drying plural times.

The coating amount of the image-recording layer (solid content) formed on a support after drying may be varied according to the intended purpose but is preferably from 0.3 to 3.0 g/$m^2$. In the range described above, good sensitivity and good film property of the image-recording layer can be achieved.

Various methods can be used for the coating. Examples of the coating method include bar coater coating, spin coating, spray coating, curtain coating, dip coating, air knife coating, blade coating and roll coating.

Support

The support for use in the lithographic printing plate precursor according to the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. A preferable support includes a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials conventionally known and used can be appropriately utilized.

The thickness of the support is preferably from 0.1 to 0.6 mm, more preferably from 0.15 to 0.4 mm.

In advance of the use of aluminum plate, a surface treatment, for example, roughening treatment or anodizing treatment is preferably performed. The surface treatment facilitates improvement in the hydrophilic property and ensure for adhesion property between the image-recording layer and the support. Prior to the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball graining, brush graining, blast graining or buff graining can be used. Also, a transfer method can be employed wherein using a roll having concavo-convex shape the concavo-convex shape is transferred to the surface of aluminum plate during a rolling step of aluminum plate.

The electrochemical roughening treatment method includes, for example, a method of conducting by passing alternating current or direct current in an electrolytic solution containing an acid, for example, hydrochloric acid or nitric acid. Also, a method of using a mixed acid described in JP-A-54-63902 can be exemplified.

The aluminum plate subjected to the roughening treatment is subjected, if desired, to an alkali etching treatment using an aqueous solution, for example, of potassium hydroxide or sodium hydroxide and further subjected to a neutralizing treatment, and then subjected to an anodizing treatment for improving the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions for the anodizing treatment are varied depending on the electrolyte used, they cannot be defined commonly. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$, more preferably from 1.5 to 4.0 g/m$^2$. In the range described above, good printing durability and good scratch resistance in the non-image area of lithographic printing plate can be achieved.

The aluminum plate subjected to the surface treatment and having the anodized film is used as it is as the support in the invention. However, in order to more improve the adhesion property to a layer provided thereon, hydrophilicity, stain resistance, heat insulating property or the like, other treatment, for example, an enlarging treatment of micropores or a sealing treatment of micropores of the anodized film described in JP-A-2001-253181 and JP-A-2001-322365, or a surface hydrophilizing treatment by immersing in an aqueous solution containing a hydrophilic compound may be appropriately conducted. Needless to say, the enlarging treatment and sealing treatment are not limited to those described in the above-described patents and any conventionally known method may be employed. For instance, as the sealing treatment, as well as a sealing treatment with steam, a sealing treatment with fluorozirconic acid alone, a sealing treatment with sodium fluoride or a sealing treatment with steam having added thereto lithium chloride may be employed.

The sealing treatment for use in the invention is not particularly limited and conventionally known methods can be employed. Among them, a sealing treatment with an aqueous solution containing an inorganic fluorine compound, a sealing treatment with water vapor and a sealing treatment with hot water are preferred. The sealing treatment is described in more detail below.

<1> Sealing Treatment with Aqueous Solution Containing Inorganic Fluorine Compound As the inorganic fluorine compound used in the sealing treatment with an aqueous solution containing an inorganic fluorine compound, a metal fluoride is preferably exemplified.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among them, sodium fluorozirconate, sodium fluorotitanate, fluorozirconic acid and fluorotitanic acid are preferred.

The concentration of the inorganic fluorine compound in the aqueous solution is preferably 0.01% by weight or more, more preferably 0.05% by weight or more, in view of performing satisfactory sealing of micropores of the anodized film, and it is preferably 1% by weight or less, more preferably 0.5% by weight or less, in view of stain resistance.

The aqueous solution containing an inorganic fluorine compound preferably further contains a phosphate compound. When the phosphate compound is contained, the hydrophilicity on the anodized film surface is increased and thus, the on-machine development property and stain resistance can be improved.

Preferable examples of the phosphate compound include phosphates of metal, for example, an alkali metal or an alkaline earth metal.

Specific examples of the phosphate compound include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferred.

The combination of the inorganic fluorine compound and the phosphate compound is not particularly limited, but it is preferred that the aqueous solution contains at least sodium fluorozirconate as the inorganic fluorine compound and at least sodium dihydrogen phosphate as the phosphate compound.

The concentration of the phosphate compound in the aqueous solution is preferably 0.01% by weight or more, more preferably 0.1% by weight or more, in view of improvement in the on-machine development property and stain resistance, and it is preferably 20% by weight or less, more preferably 5% by weight or less, in view of solubility.

The ratio of respective compounds in the aqueous solution is not particularly limited, and the weight ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and it is preferably 100° C. or less, more preferably 80° C. or less.

The pH of the aqueous solution is preferably 1 or more, more preferably 2 or more, and it is preferably 11 or less, more preferably 5 or less.

A method of the sealing treatment with the aqueous solution containing an inorganic fluorine compound is not particularly limited, and examples thereof include a dipping method and a spray method. One of the treatments may be used alone once or multiple times, or two or more thereof may be used in combination.

In particular, the dipping method is preferred. In the case of performing the treatment using the dipping method, the treating time is preferably one second or more, more preferably 3 seconds or more, and it is preferably 100 seconds or less, more preferably 20 seconds or less.

<2> Sealing Treatment with Water Vapor

Examples of the sealing treatment with water vapor include a method of continuously or discontinuously bringing water vapor under applied pressure or normal pressure into contact with the anodized film.

The temperature of the water vapor is preferably 80° C. or more, more preferably 95° C. or more, and it is preferably 105° C. or less.

The pressure of the water vapor is preferably in a range from (atmospheric pressure−50 mmAq) to (atmospheric pressure+300 mmAq) (from $1.008\times10^5$ to $1.043\times10^5$ Pa).

The time period for which water vapor is contacted is preferably one second or more, more preferably 3 seconds or more, and it is preferably 100 seconds or less, more preferably 20 seconds or less.

<3> Sealing Treatment with Hot Water

Examples of the sealing treatment with hot water include a method of dipping the aluminum plate having formed thereon the anodized film in hot water.

The hot water may contain an inorganic salt (for example, a phosphate) or an organic salt.

The temperature of the hot water is preferably 80° C. or more, more preferably 95° C. or more, and it is preferably 100° C. or less.

The time period for which the aluminum plate is dipped in hot water is preferably one second or more, more preferably 3 seconds or more, and it is preferably 100 seconds or less, more preferably 20 seconds or less.

The hydrophilizing treatment describe above includes an alkali metal silicate method described in U.S. Pat. Nos. 2,714,066, 3,181,461, 3,280,734 and 3,902,734. In the method, the support is subjected to immersion treatment or electrolytic treatment in an aqueous solution containing, for example, sodium silicate. In addition, the hydrophilizing treatment includes, for example, a method of treating with potassium fluorozirconate described in JP-B-36-22063 and a method of treating with polyvinyl phosphonic acid described in U.S. Pat. Nos. 3,276,868, 4,153,461, and 4,689,272.

In the case of using a support having a surface of insufficient hydrophilicity, for example, a polyester film, in the invention, it is desirable to coat a hydrophilic layer thereon to make the surface sufficiently hydrophilic. The hydrophilic layer preferably includes a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate and a hydrophilic layer comprising an inorganic thin layer having a surface containing a metal oxide. Among them, the hydrophilic layer formed by coating a coating solution containing a colloid of an oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion property to the image-recording layer, good printing durability and good stain resistance can be achieved.

[Backcoat Layer]

After applying the surface treatment to the support or forming an undercoat layer described hereinafter on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-34174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Undercoat Layer]

In the lithographic printing plate precursor according to the invention, particularly in the lithographic printing plate precursor of on-machine development type, an undercoat layer is provided between the support and the image-recording layer, if desired. The undercoat layer makes removal of the image-recording layer from the support in the unexposed area easy so that the on-machine development property can be improved. Further, it is advantageous that in the case of infrared laser exposure, since the undercoat layer acts as a heat insulating layer, heat generated upon the exposure does not diffuse into the support and is efficiently utilized so that increase in sensitivity can be achieved.

As a compound (undercoat compound) for the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferable compound for undercoat layer, a polymer resin obtained by copolymerization of a monomer having an adsorbing group, a monomer having a hydrophilic group and a monomer having a crosslinkable group is exemplified.

The essential component in the polymer resin for undercoating is an adsorbing group to the hydrophilic surface of the support. Whether adsorptivity to the hydrophilic surface of the support is present or not can be judged, for example, by the following method.

A test compound is dissolved in an easily soluble solvent to prepare a coating solution, and the coating solution is coated and cried on a support so as to have the coating amount after drying of 30 mg/m$^2$. After thoroughly washing the support coated with the test compound using the easily soluble solvent, the residual amount of the test compound that has not been removed by the washing is measured to calculate the adsorption amount of the test compound to the support. For measuring the residual amount, the residual amount of the test compound may be directly determined, or may be calculated by determining the amount of the test compound dissolved in the washing solution. The determination for the test compound can be performed, for example, by X-ray fluorescence spectrometry measurement, reflection absorption spectrometry measurement or liquid chromatography measurement. The compound having the adsorptivity to support is a compound that remains by 1 mg/m$^2$ or more even after conducting the washing treatment described above.

The adsorbing group to the hydrophilic surface of the support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the hydrophilic surface of the support. The adsorbing group is preferably an acid group or a cationic group.

The acid group preferably has an acid dissociation constant (pKa) of 7 or less. Examples of the acid group include a phenolic hydroxy group, a carboxyl group, $—SO_3H$, $—OSO_3H$, $—PO_3H_2$, $—OPO_3H_2$, $—CONHSO_2—$, $—SO_2NHSO_2—$ and $—COCH_2COCH_3$. Among them, $—OPO_3H_2$ and $—PO_3H_2$ are particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Particularly preferable examples of the monomer having the adsorbing group include a compound represented by the following formula (U1) or (U2):

(U1)

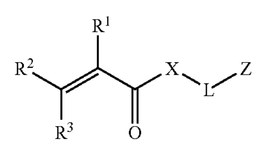

(U2)

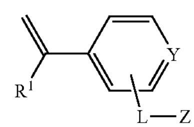

In the above formulae, $R^1$, $R^2$ and $R^3$ each independently represents a hydrogen atom, halogen atom or an alkyl group having from 1 to 6 carbon atoms. $R^1$, $R^2$ and $R^3$ each independently represents preferably a hydrogen atom or an alkyl group having from 1 to 6 carbon atoms, more preferably a hydrogen atom or an alkyl group having from 1 to 3 carbon atoms, most preferably a hydrogen atom or a methyl group. It is particularly preferred that $R^2$ and $R^3$ each represents a hydrogen atom. Z represents a functional group adsorbing to the hydrophilic surface of the support.

In formula (U1), X represents an oxygen atom (—O—) or imino group (—NH—). Preferably, X represents an oxygen atom. In the formula (U1), L represents a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of the groups described above with an oxygen atom (—O—), a sulfur atom (—S—), an imino group (—NH—), a substituted imino group (—NR—, where R represents an aliphatic group, an aromatic group or a heterocyclic group) or a carbonyl group (—CO—).

The aliphatic group may form a cyclic structure or a branched structure. The number of carbon atoms of the aliphatic group is preferably from 1 to 20, more preferably from 1 to 15, most preferably from 1 to 10. It is preferred that the aliphatic group is a saturated aliphatic group rather than an unsaturated aliphatic group. The aliphatic group may have a substituent Examples of the substituent include a halogen atom, a hydroxy group, an aromatic group and a heterocyclic group.

The number of carbon atoms of the aromatic group is preferably from 6 to 20, more preferably from 6 to 15, most preferably from 6 to 10. The aromatic group may have a substituent. Examples of the substituent include a halogen atom, a hydroxy group, an aliphatic group, an aromatic group and a heterocyclic group.

It is preferred that the heterocyclic group has a 5-membered or 6-membered ring as the hetero ring. Other heterocyclic ring, an aliphatic ring or an aromatic ring may be condensed to the heterocyclic ring. The heterocyclic group may have a substituent. Examples of the substituent include a halogen atom, a hydroxy group, an oxo group (=O), a thioxo group (=S), an imino group (=NH), a substituted imino group (=N—R, where R represents an aliphatic group, an aromatic group or a heterocyclic group), an aliphatic group, an aromatic group and a heterocyclic group.

It is preferred that L represents a divalent connecting group containing a plurality of polyoxyalkylene structures. It is more preferred that the polyoxyalkylene structure is a polyoxyethylene structure. Specifically, it is preferred that L contains —$(OCH_2CH_2)_n$— (n is an integer of 2 or more).

In formula (U2), Y represents a carbon atom or a nitrogen atom. In the case where Y is a nitrogen atom and L is connected to Y to form a quaternary pyridinium group, Z is not mandatory and may represents a hydrogen atom because the quaternary pyridinium group itself exhibits the adsorptivity. L represents a divalent connecting group same as in formula (U1) or a single bond.

The adsorbing functional group includes those described above.

Representative examples of the compound represented by formula (U1) or (U2) are set forth below.

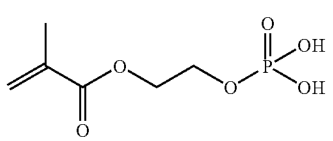

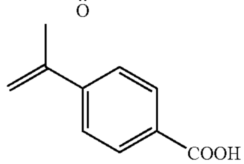

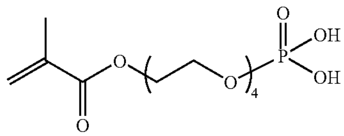

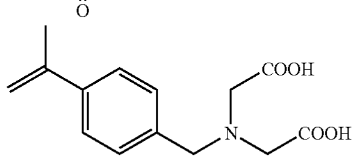

-continued

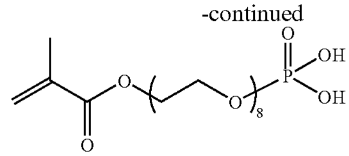

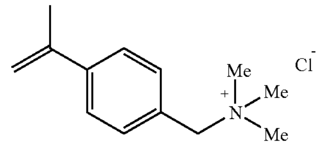

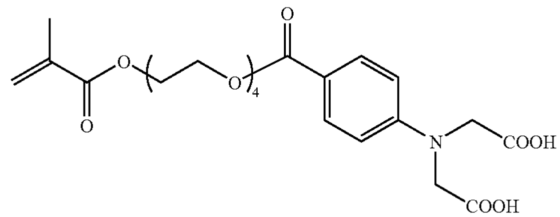

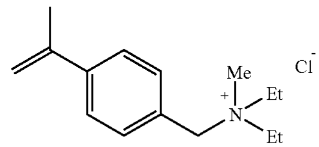

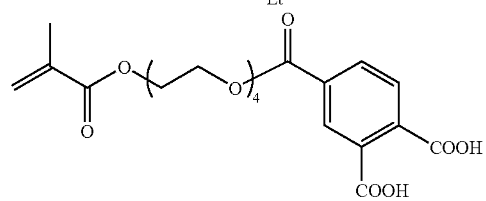

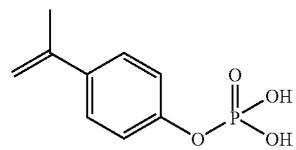

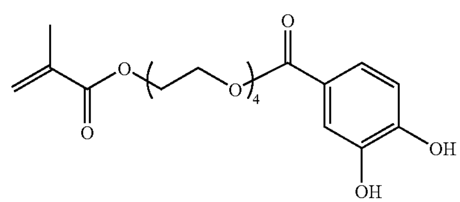

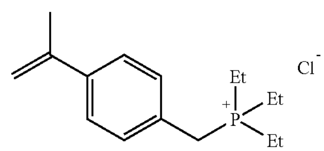

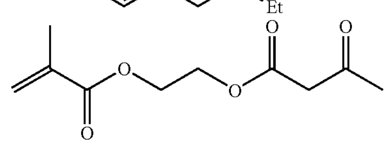

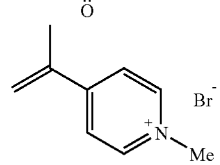

The hydrophilic group included in the polymer resin for undercoat layer for use in the invention preferably includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group and a phosphoric acid group. Among them, a sulfonic acid group exhibiting a highly hydrophilic property is preferable. Specific examples of the monomer having a sulfo group include a sodium salt or amine salt of methallyloxybenzenesulfonic acid, allyloxybenzenesulfonic acid, allylsulfonic acid, vinylsulfonic acid, p-styrenesulfonic acid, methallylsulfonic acid, acrylamido-tert-butylsulfonic acid, 2-acrylamido-2-methylpropanesulfonic acid or (3-acryloyloxypropyl)buthylsulfonic acid. Among them, from the standpoint of the hydrophilic property and handling property in the synthesis thereof, sodium salt of 2-acrylamido-2-methylpropanesulfonic acid is preferable.

It is preferred that the water-soluble polymer resin for undercoat layer according to the invention has a crosslinkable group. The crosslinkable group acts to improve the adhesion property to the image area. In order to impart the crosslinking property to the polymer resin for undercoat layer, introduction of a crosslinkable functional group, for example, an ethylenically unsaturated bond into the side chain of the polymer or introduction by formation of a salt structure between a polar substituent of the polymer resin and a compound containing a substituent having a counter charge to the polar substituent of the polymer resin and an ethylenically unsaturated bond is used.

Examples of the polymer having the ethylenically unsaturated bond in the side chain thereof include a polymer of an ester or amide of acrylic acid or methacrylic acid, wherein the ester or amide residue (R in —COOR or —CONHR) has the ethylenically unsaturated bond.

Examples of the residue (R described above) having an ethylenically unsaturated bond include $—(CH_2)_nCR_1═CR_2R_3$, $—(CH_2O)_nCH_2CR_1═CR_2R_3$, $—(CH_2CH_2O)_nCH_2CR_1═CR_2R_3$, $—(CH_2)_nNH—CO—O—CH_2CR_1═CR_2R_3$, $—(CH_2)_n—O—CO—CR_1═CR_2R_3$ and $—(CH_2CH_2O)_2—X$ (wherein $R_1$ to $R_3$ each represents a hydrogen atom, a halogen atom or an alkyl group having from 1 to 20 carbon atoms, an aryl group, alkoxy group or aryloxy group, or $R_1$ and $R_2$ or $R_1$ and $R_3$ may be combined with each other to form a ring. n represents an integer of 1 to 10. X represents a dicyclopentadienyl residue).

Specific examples of the ester residue include $—CH_2CH═CH_2$ (described in JP-B-7-21633) $—CH_2CH_2O—CH_2CH═CH_2$, $—CH_2C(CH_3)═CH_2$, $—CH_2CH═CH—C_6H_5$, $—CH_2CH_2OCOCH═CH—C_6H_5$, $—CH_2CH_2—NHCOO—CH_2CH═CH_2$ and $—CH_2CH_2O—X$ (wherein X represents a dicyclopentadienyl residue).

Specific examples of the amide residue include $—CH_2CH═CH_2$, $—CH_2CH_2O—Y$ (wherein Y represents a cyclohexene residue) and $—CH_2CH_2OCO—CH═CH_2$.

As a monomer having a crosslinkable group for the polymer compound for undercoat layer, an ester or amide of acrylic acid or methacrylic acid having the crosslinkable group described above is preferably used.

The content of the crosslinkable group in the polymer resin for undercoat layer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the polymer resin. In the range described above, preferable compatibility between the sensitivity and stain resistance and good preservation stability can be achieved.

The weight average molecular weight of the polymer resin for undercoat layer is preferably 5,000 or more, more preferably from 10,000 to 300,000. The number average molecular weight of the polymer resin is preferably 1,000 or more, more preferably from 2,000 to 250,000. The polydispersity (weight average molecular weight/number average molecular weight) thereof is preferably from 1.1 to 10.

The polymer resin for undercoat layer may be any of a random polymer, a block polymer, a graft polymer and the like, and is preferably a random polymer.

The polymer resins for undercoat layer may be used individually or in a mixture of two or more thereof. A coating solution for undercoat layer is obtained by dissolving the polymer resin for undercoat layer in an organic solvent (for example, methanol, ethanol, acetone or methyl ethyl ketone) and/or water. The coating solution for undercoat layer may contain an infrared absorbing agent.

In order to coat the coating solution for undercoat layer on the support, various methods can be used. Examples of the method include bar coater coating, spin coating, spray coating, curtain coating, dip coating, air knife coating, blade coating and roll coating.

The coating amount (solid content) of the undercoat layer is preferably from 0.1 to 100 mg/m$^2$, more preferably from 1 to 30 mg/m$^2$.

[Lithographic Printing Method]

The lithographic printing plate precursor according to the invention is after imagewise exposure subjected to on-machine development by supplying printing ink and dampening water without undergoing the development processing step to conduct printing as it is, or subjected to development by the development processing step and then provided for printing. The printing method according to the invention will be described in detail below.

[Exposure]

As a light source for use in the imagewise exposure according to the invention, a laser is preferable. The laser for use in the invention is not particularly restricted and, for example, a solid laser or semiconductor laser emitting an infrared ray having a wavelength of 760 to 1,200 nm or a semiconductor laser emitting light having a wavelength of 250 to 420 nm is preferably exemplified.

With respect to the infrared laser, the output is preferably 100 mW or more, the exposure time per pixel is preferably within 20 microseconds, and the irradiation energy is preferably from 10 to 300 mJ/cm$^2$. With respect to the semiconductor laser emitting light having a wavelength of 250 to 420 nm, the output is preferably 0.1 mW or more. In case of using any of lasers, it is preferred to use a multibeam laser device in order to shorten the exposure time.

[On-Machine Development]

The imagewise exposed lithographic printing plate precursor is mounted on a plate cylinder of a printing machine. In case of using a printing machine equipped with a laser exposure device, the lithographic printing plate precursor is mounted on a plate cylinder of the printing machine and then imagewise exposed.

After the imagewise exposure of the lithographic printing plate precursor, for example, by an infrared laser, when printing ink and dampening water are supplied to perform printing without undergoing the development processing step, for example, a wet development processing step, in the exposed area of the image-recording layer, the image-recording layer cured by the exposure forms the printing ink receptive area having an oleophilic surface. On the other hand, in the unexposed area, the uncured image-recording layer is removed by dissolution or dispersion with the dampening and/or printing ink supplied to reveal a hydrophilic surface of support in the area. As a result, the dampening water adheres on the revealed hydrophilic surface, the printing ink adheres on the exposed area of the image-recording layer, and thus printing is initiated.

While either the dampening water or the printing ink may be supplied at first to the plate surface, it is preferred to supply the printing ink at first in view of preventing the dampening water from contamination with the constituting component of the image-recording layer removed. As the dampening water and printing ink, dampening water and printing ink for conventional lithographic printing are used respectively.

Thus, the lithographic printing plate precursor is subjected to the on-machine development on an offset printing machine and used as it is for printing a large number of sheets.

In the case wherein the lithographic printing plate precursor according to the invention is unable to undergo the on-machine development as described above and the development processing step, for example, a wet development processing step is required, the development processing is conducted between the exposure step and the printing step.

The development processing applied to the present invention is decided according to the image-recording layer and the lithographic printing plate precursor according to the invention is preferably subjected to the development processing described below.

[Development Processing]

The developer preferably used in the invention is an aqueous solution having pH of 2 to 10. For example, water alone or an aqueous solution containing water as a main component (containing 60% by weight or more of water) is preferable. Particularly, an aqueous solution having the composition similar to that of conventionally known dampening water, an aqueous solution containing a surfactant (for example, an anionic, nonionic or cationic surfactant) and an aqueous solution containing a water-soluble polymer compound are preferable. An aqueous solution containing both a surfactant and a water-soluble polymer compound is especially preferable. The pH of the developer is more preferably from 3 to 8, still more preferably weakly acidic from 4 to 6.9.

Components capable of being included in the developer are described in greater detail below.

The anionic surfactant used in the developer includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant used in the developer is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant used in the developer includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

The nonionic surfactants may be used individually or as a mixture of two or more thereof.

In the invention, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer according to the invention, the HLB (hydrophile-lipophile balance) value thereof is preferably 6 or more, more preferably 8 or more. The content of the nonionic surfactant in the developer is preferably from 0.01 to 10% by weight, more preferably from 0.01 to 5% by weight.

Furthermore, an oxyethylene adduct of acetylene glycol type or acetylene alcohol type or a surfactant, for example, a fluorine-based surfactant or a silicon-based surfactant can also be used.

Of the surfactants used in the developer, the nonionic surfactant is particularly preferable in view of foam depressing property.

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereof, pullulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound in the developer is preferably from 0.1 to 20% by weight, more preferably from 0.5 to 10% by weight.

The developer according to the invention may contain an organic solvent. The organic solvent that can be contained in the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

When the organic solvent is insoluble in water, it may be employed by being solubilized in water using a surfactant or the like. In the case where the developer contains the organic solvent, the concentration of the organic solvent is desirably less than 40% by weight in view of safety and inflammability.

Into the developer according to the invention, an antiseptic agent, a chelating agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof; aminotri(methylenephosphonic acid), potassium salt thereof, sodium salt thereof; and phosphonoalkanetricarboxylic acids are illustrated. A salt of an organic amine is also effectively used in place of the sodium salt or potassium salt in the chelating agents.

As the defoaming agent, for example, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer described above can be used as a developer and a development replenisher for the exposed lithographic printing plate precursor, and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image exposure is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of a support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-UM-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl (meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

It is preferred to use a plurality, that is, two or more of the rotating brush rollers.

The rotary direction of the rotating brush roller for use in the invention may be the same direction or the opposite direction with respect to the transporting direction of the lithographic printing plate precursor according to the invention, but when two or more rotating brush rollers are used in an automatic processor, it is preferred that at least one rotating brush roller rotates in the same direction and at least one rotating brush roller rotates in the opposite direction with respect to the transporting direction. By such arrangement, the image-recording layer in the non-image area can be more steadily removed. Further, a technique of rocking the rotating brush roller in the rotation axis direction of the brush roller is also effective.

The developer at the development processing can be used at an appropriate temperature, and is preferably used from 10 to 50° C.

In the invention, the lithographic printing plate after the rubbing treatment described above may be subsequently subjected to water washing, a drying treatment and an oil-desensitization treatment, if desired. In the oil-desensitization treatment, a known oil-desensitizing solution can be used.

In a plate making process of the lithographic printing plate precursor according to the invention, the entire surface of the lithographic printing plate precursor may be heated, if desired, before or during the exposure or between the exposure and the development. By the heating, the image-forming reaction in the image-recording layer is accelerated and advantages, for example, improvement in the sensitivity and printing durability and stabilization of the sensitivity are obtained. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that undesirable fog occurs in the non-image area. On the other hand, the heating after the development can be performed using a very strong condition. Ordinarily, the heat treatment is carried out in a temperature range of 200 to 500° C. When the temperature is too low, the sufficient effect of strengthening the image may not be obtained, whereas when it is excessively high, problems of deterioration of the support and thermal decomposition of the image area may occur.

The lithographic printing plate obtained according to the development processing described above is mounted on an offset printing machine and used for printing a large number of sheets.

As a plate cleaner used for removing stain on the printing plate at the printing, a plate cleaner for PS plate conventionally known is used. Examples thereof include CL-1, CL-2, CP, CN-4, CN, CG-1, PC-1, SR and IC (produced by Fuji Film Co., Ltd.).

EXAMPLES

The present invention will be described in more detail with reference to the following examples, but the invention should not be construed as being limited thereto.

Preparation of Lithographic Printing Plate Precursor (1) of on-Machine Development Type

Example 1

(1) Preparation of Support 1

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C./dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C./dm$^2$ in terms of the quantity of electricity when the aluminum plate functioned as an anode. The plate was then washed with water by spraying. The plate was subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried, thereby preparing Support 1. The center line average roughness (Ra) of Support 1 was measured using a stylus having a diameter of 2 μm and found to be 0.51 μm.

Undercoat solution (1) shown below was coated on Support 1 and dried at 100° C. for 3 minutes. The dry coating amount of the undercoat layer was 6 mg/m$^2$.

| <Undercoat solution (1)> | |
|---|---|
| Undercoat compound (1) shown below (molecular weight: 60,000) | 0.017 g |
| Methanol | 9.00 g |
| Water | 1.00 g |

Undercoat compound (1)

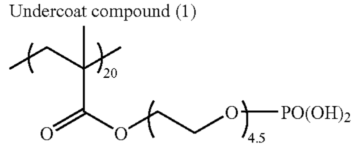

-continued

<Undercoat solution (1)>

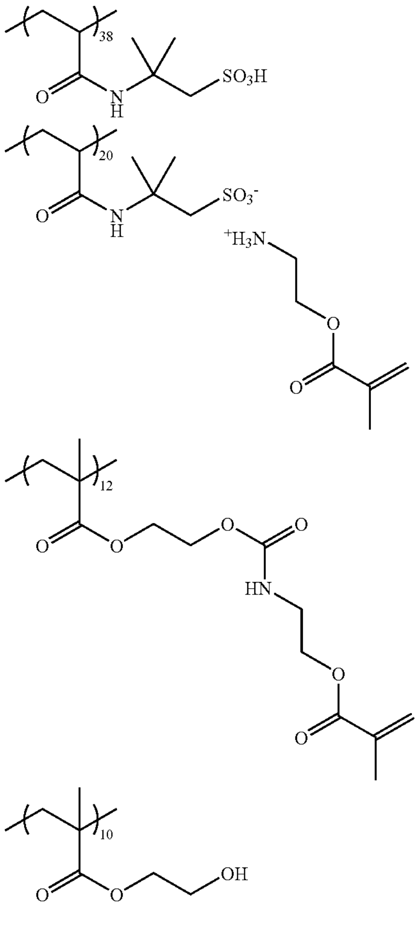

(2) Formation of Image-Recording Layer and Protective Layer

Coating solution 1 for image-recording layer having the composition shown below was coated on the above-described support provided with the undercoat layer by a bar and dried in an oven at 100° C. for 60 seconds to form an image-recording layer having a dry coating amount of 1.0 g/m$^2$. Subsequently, Coating solution 1 for protective layer having the composition shown below was coated on the image-recording layer by a bar and dried in an oven at 120° C. for 60 seconds to form a protective layer having a dry coating amount of 0.160 g/m$^2$, thereby preparing Lithographic printing plate precursor (1).

The coating solution for image-recording layer was prepared by mixing Photosensitive solution shown below with Microgel solution shown below just before the coating, followed by stirring.

<Photosensitive solution>

| | |
|---|---|
| Binder polymer (1) shown below | 0.177 g |
| (B) Polymerization initiator (Compound I-28 shown hereinbefore) | 0.142 g |
| (A) Infrared absorbing agent (1) shown below | 0.0308 g |
| (C) Polymerizable monomer (Aronics M-215, produced by Toagosei Co., Ltd.) | 0.319 g |
| Specific polymer (Compound (11) shown hereinbefore, reduced specific viscosity: 40.7 cSt/g/ml)) | 0.035 g |
| Fluorine-based surfactant (1) shown below | 0.004 g |
| Anionic surfactant (Pionine A-24-EA, produced by Takemoto Oil and Fat Co., Ltd., an aqueous 40% by weight solution) | 0.125 g |
| Methyl ethyl ketone | 2.554 g |
| 1-Methoxy-2-propanol | 7.023 g |

<Microgel solution>

| | |
|---|---|
| Microgel dispersion (1) | 1.800 g |
| Water | 1.678 g |

Synthesis methods of the specific polymers used in the photosensitive solution, preparation of Microgel dispersion (1) used in the microgel solution and structures of the other compounds used in the photosensitive solution are described below.

<Synthesis of Specific Polymer (Compound (11))>

(Synthesis of Intermediate Monomer (1))

Intermediate monomer (1)

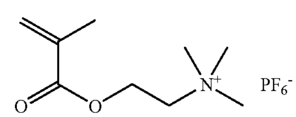

In 191.29 g of water was dissolved 260.96 g (0.92 mol) of 2-(N,N,N-trimethylammonium)ethyl methacrylate sulfate and the resulting solution was dropwise added to a solution previously prepared by dissolving 338.97 g (1.84 mol) of $KPF_6$ in 4.8 liters of water over a period of 15 minutes. The crystals deposited were collected by filtration and washed by throwing 2 liters of water to obtain white powder. The powder was dissolved in 800 ml of acetone and the solution was dropwise added to a solution prepared by dissolving 169.49 g (0.92 mol) of $KPF_6$ in 3 liters of water over a period of 15 minutes. The crystals deposited were collected by filtration, washed by throwing 2 liters of water and dried under a reduced pressure at room temperature to obtain 262.72 g (yield: 90.0%) of Intermediate monomer (1) as white powder.

(Synthesis of Compound (11))

In a 500-ml three-necked flask equipped with a condenser and a stirring blade (rotation speed: 250 rpm) was put 69.87 g of N-methylpyrrolidone (NMP) and the inner temperature was adjusted to 70° C. A monomer solution composed of 19.03 g (0.06 mol) of Intermediate monomer (1), 40.86 g (0.24 mol) of n-hexyl methacrylate, 1.382 g (0.012 mol) of V-601 (radical polymerization initiator, produced by Wako Pure Chemical Industries, Ltd.) and 69.87 g of NMP was prepared and dropwise added to the reaction vessel over a period of 2 hours. After the completion of the dropwise addition of the monomer solution, the stirring was continued for 2 hours and then, the initiator (0.691 g of V-601) was further added. Just after the addition of the initiator, the temperature was raised to 85° C. and the stirring was continued for 2 hours and then the reaction mixture was allowed to stand and cool to obtain a solution of a polymer of Compound (11). The solution exhibited the reduced specific viscosity of 40.7 cSt/g/ml and the solid content concentration of 30% by weight.

<Synthesis of Specific Polymer (Compounds (49) and (120))>

(Synthesis of Intermediate Monomer (2))

Intermediate monomer (2)

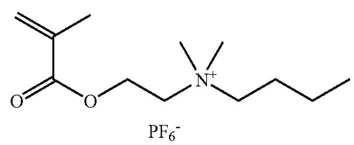

A mixture of 361.58 g (2.3 mol) of N,N-dimethylaminoethyl methacrylate, 0.1647 g of p-methoxyphenol and 1,150 ml of acetonitrile was stirred at room temperature. To the mixture was dropwise added 525.11 g (2.3 mol) of n-butyl tosylate over a period of 30 minutes. The mixture was stirred at 80° C. for 8 hours and then allowed to stand and cool. The reaction solution was dropwise added to a solution prepared by dissolving 846.68 g of $KPF_6$ in 12.6 liters of water to obtain white crystals. After stilling 30 minutes, the crystals were collected by filtration and washed by throwing 5 liters of water. Further, the crystals were washed with 5 liters of water and collected by filtration. The resulting crystals were washed with 3 liters of ethyl acetate/hexane (50/50 in volume ratio), collected by filtration, washed by throwing one liter of ethyl acetate/hexane (50/50 in volume ratio) and dried. The crystals were dried under a reduced pressure at room temperature to obtain 561.4 g of Intermediate monomer (2) as white powder.

(Synthesis of Compound (49))

In a 3,000-ml three-necked flask equipped with a condenser and a stirring blade (rotation speed: 250 rpm) was put 743.07 g of N-methylpyrrolidone (NMP) and the inner temperature was adjusted to 70° C. A monomer solution composed of 208.4 g (0.58 mol) of Intermediate monomer (2), 436.67 g (2.32 mol) of diethylene glycol monomethyl ether methacrylate, 13.3551 g (2% by mole based on the total molar amount of the monomers) of V-601 (radical polymerization initiator, produced by Wako Pure Chemical Industries, Ltd.) and 743.07 g of NMP was prepared and dropwise added to the reaction vessel over a period of 2 hours. After the completion of the dropwise addition of the monomer solution, the stirring was continued for 2 hours and then, the initiator (6.678 g of V-601) was further added. Just after the addition of the initiator, the temperature was raised to 85° C. and the stirring was continued for 2 hours and then the reaction mixture was allowed to stand and cool to obtain a solution of a polymer of Compound (49). The solution exhibited the reduced specific viscosity of 31.0 cSt/g/ml and the solid content concentration of 30% by weight.

(Synthesis of Compound (120))

In a 3,000-ml three-necked flask equipped with a condenser and a stirring blade (rotation speed: 250 rpm) were put 371.54 g of methyl ethyl ketone (MEK) and 371.54 g of 1-methoxy-2-propanol and the inner temperature was adjusted to 70° C. A monomer solution composed of 260.5 g (0.725 mol) of Intermediate monomer (2), 409.4 g (2.175 mol) of diethylene glycol monomethyl ether methacrylate, 13.3551 g (2% by mole based on the total molar amount of the monomers) of V-601 (radical polymerization initiator, produced by Wako Pure Chemical Industries, Ltd.), 371.54 g of methyl ethyl ketone (MEK) and 371.54 g of 1-methoxy-2-propanol was prepared and dropwise added to the reaction vessel over a period of 2 hours. After the completion of the dropwise addition of the monomer solution, the stirring was continued for 2 hours and then, the initiator (6.678 g of V-601) was further added. Just after the addition of the initiator, the temperature was raised to 85° C. and the stirring was continued for 2 hours and then the reaction mixture was allowed to stand and cool to obtain a solution of a polymer of Compound (120). The solution exhibited the reduced specific viscosity of 31.5 cSt/g/ml and the solid content concentration of 30% by weight.

Other specific polymers according to the invention were synthesized in a similar manner with reference to the methods described above and known synthesis methods.

<Preparation of Microgel Dispersion (1)>

An oil phase component was prepared by dissolving 10.0 g of adduct of trimethylol propane and xylene diisocyanate (Takenate D-110N, produced by Mitsui Takeda Chemical Co., Ltd., a 75% by weight ethyl acetate solution), 6.00 g of a polymerizable monomer (Aronics M-215, produced by Toagosei Co., Ltd.) and 0.12 g of Pionine A-41C (produced by Takemoto Oil and Fat Co., Ltd.) in 16.67 g of ethyl acetate. As an aqueous phase component, 37.5 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 40° C. for 2 hours. The microgel dispersion thus-obtained was diluted using distilled water so as to have the solid concentration of 21% by weight to prepare Microgel dispersion (1). The average particle size of the particle in Microgel dispersion (1) was 0.23 μm.

Infrared absorbing agent (1)

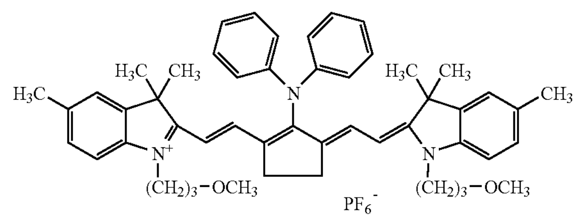

Binder polymer (1)

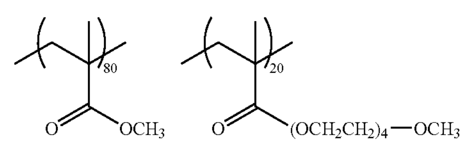

Fluorine-based surfactant (1)

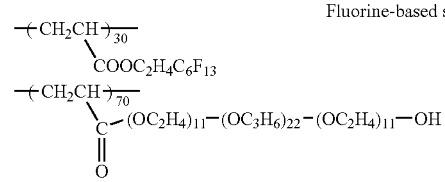

| <Coating solution 1 for protective layer> | |
|---|---|
| Dispersion of stratiform compound (1) shown below | 1.5 g |
| Polyvinyl alcohol (PVA-105, saponification degree: 98.5% by mole, polymerization degree: 500, produced by Kuraray Co., Ltd.) | 0.06 g |
| Polyvinylpyrrolidone (K30, molecular weight Mw: 40,000, produced by Tokyo Chemical Industry Co., Ltd.) | 0.01 g |

-continued

| <Coating solution 1 for protective layer> | |
|---|---|
| Copolymer of vinylpyrrolidone and vinyl acetate (LUVITEC VA64W, copolymerization ratio = 6/4, produced by ISP Co., Ltd.) | 0.01 g |
| Nonionic surfactant (EMALEX 710, produced by Nihon-Emulsion Co., Ltd.) | 0.013 g |
| Ion-exchanged water | 6.0 g |

<Preparation of Dispersion of Stratiform Compound (1)>

Synthetic mica (Somasif ME-100, produced by CO-OP Chemical Co., Ltd.) was added to ion-exchanged water in the proportion of 6.4 g of the synthetic mica to 193.6 g of the ion-exchanged water and the mixture was dispersed using a homogenizer until an average particle size (according to a laser scattering method) became 3 μm to prepare Dispersion of stratiform compound (1). The aspect ratio of the inorganic particle thus-dispersed was 100 or more.

Examples 2 to 23, 26 and 27

Lithographic printing plate precursors (2) to (23), (26) and (27) were prepared in the same manner as in Example 1 except that the kind and amount of the specific polymer in the photosensitive solution for image-recording layer used in Example 1 were changed as shown in Table 1 below, respectively.

Examples 24 to 25

Lithographic printing plate precursors (24) to (25) were prepared in the same manner as in Example 1 except that the kind and amount of the specific polymer in the photosensitive solution for image-recording layer and coating solution 1 for protective layer used in Example 1 were changed as shown in Table 1, respectively.

Comparative Examples 1 to 3

Lithographic printing plate precursors (R1) to (R3) for comparison were prepared in the same manner as in Example 1 except that the specific polymer according to the invention used in Example 1 was replaced with the compound for comparison as shown below, respectively.

Compound for comparison C-1

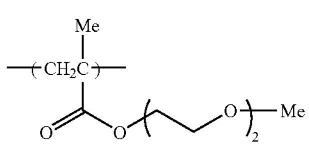

Compound for comparison C-2

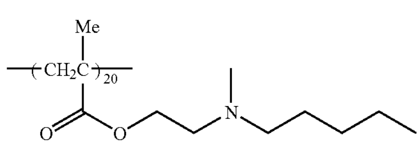

-continued

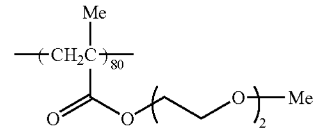

Compound for comparison C-3

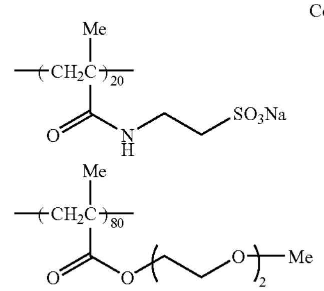

[Evaluation of Lithographic Printing Plate Precursor]

Each of Lithographic printing plate precursors (1) to (27) and (R1) to (R3) obtained was exposed by Trendsetter 3244VX (produced by Creo Co.) equipped with a water-cooled 40 W infrared semiconductor laser under the conditions of output of 11.7 W, a rotational number of an outer surface drum of 250 rpm and resolution of 2,400 dpi., and then the on-machine development property, ink-receptive property and printing durability were evaluated in the manner described below. The results obtained are shown in Table 1.

(Evaluation of on-Machine Development Property)

The exposed lithographic printing plate precursor was mounted on a plate cylinder of a printing machine (SOR-M, produced by Heidelberg Co.) without undergoing development processing. After supplying dampening water (EU-3 (etching solution, produced by Fuji Film Co., Ltd.)/water/isopropyl alcohol=1/89/10 (volume ratio)) and ink (TRANS-G (N) black ink, produced by Dainippon Ink & Chemicals, Inc.), printing was conducted at a printing speed of 6,000 sheets per hour. A number of printing papers required until reaching a state where the ink was not transferred in the unexposed area (non-image area) of the image-recording layer was determined to evaluate the on-machine development property. It is evaluated that as the number of printing papers is small, the on-machine development property is more excellent.

(Evaluation of Ink-Receptive Property)

The printing was continued and as increase in a number of printing papers, the ink receptivity of the image-recording layer gradually deteriorated to decrease ink density on the printing paper. A number of the printing papers obtained until the ink density (reflection density) decreased by 0.01 from that at the initiation of printing was determined to evaluate the ink-receptive property. It is evaluated that as the number of the printing papers is large, the ink-receptive property is more excellent.

(Evaluation of Printing Durability)

The printing was further continued and as increase in the number of printing papers, the image-recording layer was gradually abraded to cause degradation of the ink receptivity, resulting in further decrease of ink density on the printing paper. A number of the printing papers obtained until the ink density (reflection density) decreased by 0.1 from that at the initiation of printing was determined to evaluate the printing durability. It is evaluated that as the number of the printing papers is large, the printing durability is more excellent.

TABLE 1

Performance Evaluation of Examples 1 to 27 and Comparative Examples 1 to 3

| | Specific Polymer | | | Evaluation Result | | |
|---|---|---|---|---|---|---|
| | Compound | Reduced Specific Viscosity (cSt/g/ml) | Amount Used (g) | On-machine Development Property (sheet) | Ink-receptive Property (sheet) | Printing Durability (sheet) |
| Example 1 | 11 | 40.7 | 0.035 | 17 | 8,000 | 60,000 |
| Example 2 | 11 | 40.7 | 0.054 | 17 | 9,000 | 60,000 |
| Example 3 | 11 | 40.7 | 0.072 | 17 | 10,000 | 60,000 |
| Example 4 | 12 | 45.5 | 0.035 | 18 | 7,000 | 60,000 |
| Example 5 | 9 | 19.8 | 0.035 | 19 | 8,000 | 60,000 |
| Example 6 | 15 | 35.5 | 0.035 | 18 | 9,000 | 60,000 |
| Example 7 | 3 | 37.5 | 0.035 | 17 | 7,000 | 60,000 |
| Example 8 | 2 | 25.5 | 0.035 | 18 | 7,000 | 60,000 |
| Example 9 | 16 | 50.5 | 0.035 | 17 | 8,000 | 60,000 |
| Example 10 | 11 | 40.7 | 0.018 | 15 | 8,000 | 60,000 |
| Example 11 | 24 | 31.0 | 0.035 | 15 | 12,000 | 60,000 |
| Example 12 | 24 | 18.6 | 0.035 | 15 | 13,000 | 60,000 |
| Example 13 | 30 | 31.5 | 0.035 | 13 | 11,000 | 60,000 |
| Example 14 | 49 | 31.0 | 0.035 | 12 | 14,000 | 65,000 |
| Example 15 | 49 | 16.8 | 0.035 | 13 | 12,000 | 62,000 |
| Example 16 | 50 | 33.6 | 0.035 | 15 | 13,000 | 62,000 |
| Example 17 | 88 | 31.8 | 0.035 | 13 | 14,000 | 64,000 |
| Example 18 | 89 | 36.2 | 0.035 | 14 | 13,000 | 62,000 |
| Example 19 | 98 | 34.5 | 0.035 | 15 | 14,000 | 66,000 |
| Example 20 | 99 | 33.3 | 0.035 | 15 | 14,000 | 66,000 |
| Example 21 | 112 | 28.9 | 0.035 | 18 | 7,000 | 58,000 |
| Example 22 | 116 | 26.8 | 0.035 | 18 | 8,000 | 59,000 |
| Example 23 | 118 | 31.2 | 0.035 | 19 | 9,000 | 55,000 |
| Example 24 | 11 | 40.7 | Image-recording layer: 0.025 Protective layer: 0.010 | 17 | 9,000 | 60,000 |
| Example 25 | 11 | 40.7 | Image-recording layer: 0.000 Protective layer: 0.035 | 17 | 8,000 | 60,000 |
| Example 26 | 120 | 31.5 | 0.035 | 12 | 14,000 | 65,000 |
| Example 27 | 121 | 31.0 | 0.035 | 12 | 14,000 | 65,000 |
| Comparative Example 1 | C-1 | 32.6 | 0.035 | 30 | 1,000 | 40,000 |
| Comparative Example 2 | C-2 | 33.5 | 0.035 | 35 | 1,500 | 45,000 |
| Comparative Example 3 | C-3 | 35.6 | 0.035 | 22 | 1,000 | 30,000 |

As is apparent from the results shown in Table 1, the lithographic printing plate precursor containing the specific polymer according to the invention in at least one of the image-recording layer and the protective layer thereof exhibits the unexpected result in that the excellent on-machine development property and ink-receptive property are achieved as well as the excellent printing durability. On the contrary, it can be seen that in the case of using any one of Compounds C-1 to C-3 for comparison which do not have the ammonium structure, the ink-receptive property severely deteriorates.

Preparation of Lithographic Printing Plate Precursor (2) of Development Processing Type

Examples 28 to 30 and Comparative Example 4

Undercoat solution (2) having the composition shown below was coated on Support 1 described hereinbefore and dried at 100° C. for 3 minutes. The coating amount of the undercoat layer was 10 mg/m$^2$.

| <Undercoat solution (2)> | |
|---|---|
| Undercoat compound (1) shown above | 2.5 g |
| N-methylpyrrolidone | 49.0 g |
| Methanol | 450.0 g |
| Water | 1.5 g |

Coating solution 2 for image-recording layer having the composition shown below was coated on the undercoat layer obtained as described above and dried at 80° C. for one minute. The coating amount of the image-recording layer was 1.2 g/m$^2$.

| <Coating solution 2 for image-recording layer> | |
|---|---|
| Binder polymer (1) shown above | 0.54 g |
| Polymerizable monomer (Isocyanuric acid EO-modified triacrylate: Aronics M-315, produced by Toagosei Co., Ltd.) | 0.48 g |
| Sensitizing dye (1) shown below | 0.06 g |
| Polymerization initiator (1) shown below | 0.10 g |
| Co-sensitizer (1) shown below | 0.07 g |

-continued

| <Coating solution 2 for image-recording layer> | |
|---|---|
| Dispersion of □-phthalocyanine pigment [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Specific polymer according to the invention (as shown in Table 2) | 0.035 g |
| Methyl ethyl ketone | 4.80 g |
| Dimethylsulfoxide | 4.80 g |

Sensitizing dye (1):

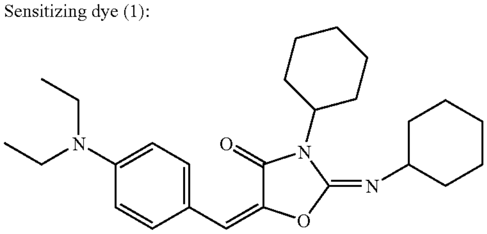

Polymerization initiator (1):

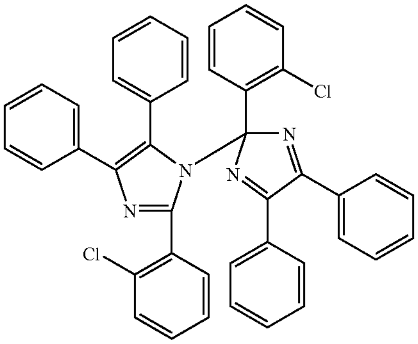 [SMILES: Clc1ccccc1-c1nc(-c2ccccc2)c(-c2ccccc2)n1C1(c2ccccc2Cl)N=C(c2ccccc2)C(c2ccccc2)=N1]

Co-sensitizer (1):

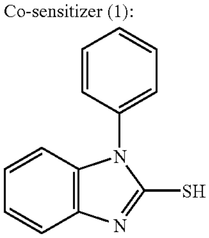

Coating solution 2 for protective layer having the composition shown below was coated on the image-recording layer using a bar and dried at 125° C. for 70 seconds to form a protective layer having a coating amount of 0.50 g/m$^2$, whereby Lithographic printing plate precursors (28) to (30) and Lithographic printing plate precursor (R4) for comparison were prepared, respectively.

| <Coating solution 2 for protective layer> | |
|---|---|
| Dispersion of stratiform compound (1) | 918 g |
| Polyvinyl alcohol (saponification degree: 98% by mole; polymerization degree: 500) | 40 g |
| Polyvinyl pyrrolidone (Mw: 50,000) | 5 g |
| Vinyl pyrrolidone/vinyl acetate (1/1) copolymer (Mw: 70,000) | 0.5 g |
| Surfactant (Emalex 710, produced by Nihon-Emulsion Co., Ltd.) | 0.5 g |
| Water | 30 g |

[Evaluation of Lithographic Printing Plate Precursor]

<Exposure and Development)

Each of Lithographic printing plate precursors (28) to (30) and (R4) was subjected to imagewise exposure using a semiconductor laser of 405 n having an output of 100 mW.

Then, development processing was performed in an automatic development processor having a structure shown in FIG. 1 using as a developer, Aqueous solution A shown below to prepare a lithographic printing plate (without heating).

On the other hand, within 30 seconds after the laser imagewise exposure, the exposed lithographic printing plate precursor was put in an oven and heated the entire surface of the lithographic printing plate precursor by blowing hot air to maintain at 110° C. for 15 seconds and then the development processing was performed within 30 seconds in the same manner as described above to prepare a lithographic printing plate (with heating).

Furthermore, each of Lithographic printing plate precursors (28) to (30) and (R4) was lapped with aluminum craft paper and allowed to stand in an oven at 60° C. for 3 days. Then, the laser imagewise exposure and development processing without heating were performed in the same manner as described above to prepare a lithographic printing plate (enforced preservation).

The automatic development processor had two rotating brush rollers. The first brush roller was a brush roller having an outer diameter of 90 mm and being implanted with fiber of polybutylene terephthalate (bristle diameter: 200 μm, bristle length: 17 mm), and the brush roller was rotated at 200 rpm (peripheral velocity at the tip of brush: 0.94 m/sec) in the same direction as the transporting direction. The second brush roller was a brush roller having an outer diameter of 60 mm and being implanted with fiber of polybutylene terephthalate (bristle diameter: 200 μm, bristle length: 17 mm), and the brush roller was rotated at 200 rpm (peripheral velocity at the tip of brush: 0.63 m/sec) in the opposite direction to the transporting direction. The transportation of the lithographic printing plate precursor was performed at transporting speed of 100 cm/min.

Aqueous solution A was supplied on the surface of the lithographic printing plate precursor by showering from a spray pipe using a circulation pump. The tank volume for Aqueous solution A was 10 liters.

| <Aqueous solution A> | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Ethylene glycol | 0.50 g |
| Ammonium primary phosphate | 0.05 g |
| Citric acid | 0.05 g |

<Printing and Evaluation>

Then, each of the lithographic printing plate (without heating), the lithographic printing plate (with heating) and the lithographic printing plate (enforced preservation) was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G(N) black ink (produced by Dainippon Ink & Chemicals, Inc.).

The printing durability and ink-receptive property were evaluated in the following manner. The results are shown in Table 2.

(1) Printing Durability

The printing was continued and as increase in a number of the printed materials, the image-recording layer was gradually abraded to cause deterioration of the ink receptivity, resulting in decrease of ink density on the printed material. With respect to the lithographic printing plate obtained by the exposure in the same exposure amount (energy density), a number of the printed materials obtained until the ink density (reflection density) decreased by 0.1 from that at the initiation of printing was determined to relatively evaluate the printing durability. Specifically, the printing durability was calculated according to the formula shown below using Comparative Example 4 as the criterion (100). It is indicated that as the value increases, the printing durability becomes higher.

Printing durability=(Number of printed materials of subject lithographic printing plate)/(Number of printed materials of criterion lithographic printing plate)×100

(2) Ink-Receptive Property

A number of the printed materials obtained until the ink density (reflection density) decreased by 0.01 from that at the initiation of printing was determined to relatively evaluate the ink-receptive property. Specifically, the ink-receptive property was calculated according to the formula shown below using Comparative Example 4 as the criterion (100). It is indicated that as the number of the printed materials is large, the ink-receptive property is more excellent.

Ink-receptive property=(Number of printed materials of subject lithographic printing plate)/(Number of printed materials of criterion lithographic printing plate)×100

TABLE 2

Performance Evaluation of Examples 28 to 30 and Comparative Example 4

| | Lithographic Printing Plate Precursor | Specific Polymer | Printing Durability Without Heating | Printing Durability With Heating | Printing Durability Enforced Preservation | Ink-receptive Property Without Heating | Ink-receptive Property With Heating | Ink-receptive Property Enforced Preservation |
|---|---|---|---|---|---|---|---|---|
| Example 28 | 28 | 11 | 130 | 130 | 140 | 300 | 300 | 300 |
| Example 29 | 29 | 49 | 120 | 120 | 130 | 400 | 450 | 400 |
| Example 30 | 30 | 15 | 130 | 130 | 140 | 200 | 200 | 200 |
| Comparative Example 4 | R4 | None | 100 | 100 | 100 | 100 | 100 | 100 |

As is apparent from the results shown in Table 2, the lithographic printing plate precursor of development processing type containing the specific polymer according to the invention is excellent in the ink-receptive property and exhibits the high printing durability.

Example 31 and Comparative Example 5

Lithographic printing plate precursor (31) was prepared in the same manner as in Lithographic printing plate precursors (28) to (30) except for changing Coating solution 2 for image-recording layer to Coating solution 3 for image-recording layer shown below and changing Coating solution 2 for protective layer to Coating solution 3 for protective layer shown below, respectively.

Lithographic printing plate precursor (R5) for Comparative Example 5 was prepared in the same manner as in Lithographic printing plate precursor (31) except for eliminating Compound 11 of the specific polymer according to the invention.

| <Coating solution 3 for image-recording layer> | |
|---|---|
| Binder polymer (2) shown below | 0.54 g |
| Polymerizable monomer (2) shown below | 0.48 g |
| Sensitizing dye (1) shown above | 0.06 g |
| Polymerization initiator (1) shown above | 0.18 g |
| Co-sensitizer (1) shown above | 0.07 g |

-continued

| <Coating solution 3 for image-recording layer> | |
|---|---|
| Dispersion of □-phthalocyanine pigment [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-nitrosophenylhydroxylamine aluminum salt | 0.01 g |
| Fluorine-based surfactant (1) shown above | 0.001 g |
| Polyoxyethylene-polyoxypropylene condensate (Pluronic L44, produced by ADEKA Corp.) | 0.04 g |
| Tetraethylamine hydrochloride | 0.01 g |
| Specific polymer according to the invention (Compound (11)) | 0.035 g |
| 1-Methoxy-2-propanol | 3.5 g |
| Methyl ethyl ketone | 8.0 g |

Polymerizable monomer (2):

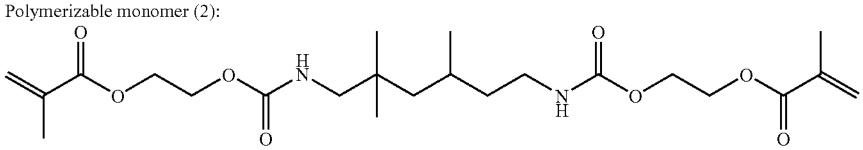

Binder polymer (2):

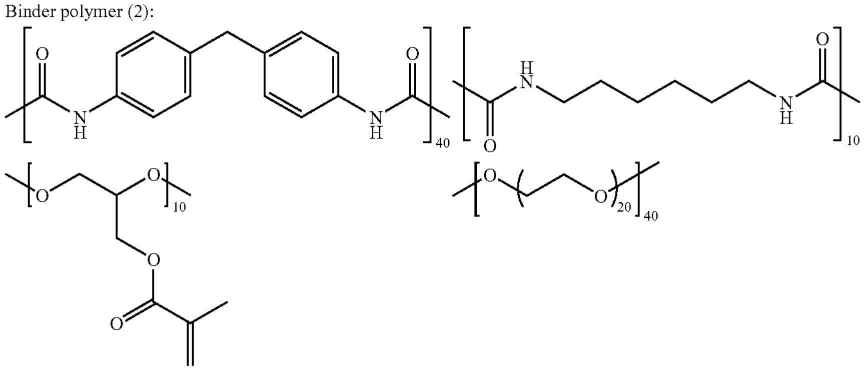

| <Coating solution 3 for protective layer> | |
|---|---|
| Dispersion of stratiform compound (2) shown below | 13.00 g |
| Polyvinyl alcohol (saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.05 g |
| Surfactant (Emalex 710, produced by Nihon-Emulsion Co., Ltd.) | 0.05 g |
| Water | 133.00 g |

<Preparation of Dispersion of Stratiform Compound (2)>

To 368 g of water was added 32 g of synthetic mica (Somasif ME-100, produced by CO-OP Chemical Co., Ltd.; aspect ratio: 1,000 or more) and the mixture was dispersed using a homogenizer until the average particle size (according to a laser scattering method) became 0.5 μm to prepare Dispersion of stratiform compound (2).

Lithographic printing plate precursors (31) and (R5) thus-obtained were subjected to the exposure, development and printing in the same manner as in Example 28 and evaluated in the same manner as in Example 31. As a result, it was found that Lithographic printing plate precursor (31) was excellent in the ink-receptive property and exhibited the high printing durability in comparison with Lithographic printing plate precursor (R5) for comparison.

Examples 32 to 58 and Comparative Example 6

Each of exposed Lithographic printing plate precursors (1) to (27) and Lithographic printing plate precursor (R1) for comparison was developed under the same development condition as in Example 28 and the printing durability and ink-receptive property were evaluated in the same manner as in Examples 1 to 27. As a result, it was found that the lithographic printing plate precursor containing the specific polymer according to the invention exhibited the excellent printing durability and the excellent ink-receptive property.

From the examples described above, the effects of the invention are clearly recognized.

This application is based on Japanese Patent application JP 2007-163821, filed Jun. 21, 2007, Japanese Patent application JP 2007-231901, filed Sep. 6, 2007 and Japanese Patent application JP 2008-026525, filed Feb. 6, 2008, the entire contents of which are hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A lithographic printing plate precursor comprising:

an image-recording layer; and a protective layer comprising a stratiform compound, wherein the protective layer comprises a polymer containing, as a repeating unit, a structural unit having an ammonium structure, wherein the structural unit having an ammonium structure is a structure represented by the following formula (1):

(1)

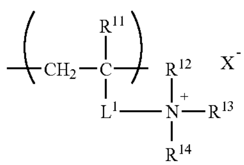

wherein $R^{11}$ represents a hydrogen atom, an alkyl group or a halogen atom, $L^1$ represents a single bond or a divalent connecting group, $R^{12}$, $R^{13}$ and $R^{14}$ each independently represents a hydrogen atom, an alkyl group, an aryl group, a heterocyclic group or an alkylidene group, or at least two of $R^{12}$, $R^{13}$ and $R^{14}$ may be combined with each other to form a ring, and $X^-$ represents a counter ion necessary for neutralizing a charge, wherein the polymer containing as a repeating unit, a structural unit having an ammonium structure further contains a structural unit represented by the following formula (2):

(2)

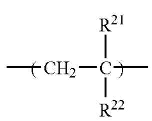

wherein $R^{21}$ represents a hydrogen atom, an alkyl group or a halogen atom, and $R^{22}$ represents an ester group, an amido group, a phenyl group which may have a substituent, or a group containing a polyalkyleneoxy group, wherein the image-recording layer comprises a sensitizing dye, a polymerization initiator, and a polymerizable monomer, wherein a molar ratio of the structural unit represented by the formula (1) to the structural unit represented by formula (2) in the polymer is from 10:90 to 50:50, and wherein the polymer containing, as a repeating unit, a structural unit having an ammonium structure is contained only in the protective layer.

2. The lithographic printing plate precursor as claimed in claim 1, wherein the divalent connecting group represented by $L^1$ in the formula (1) is a group containing at least one group selected from a phenylene group, a carbonyloxy group and a carbonylimino group.

3. The lithographic printing plate precursor as claimed in claim 1, wherein the counter ion represented by $X^-$ in the formula (1) is at least one anion selected from a halide ion, a carboxylate ion, an alkylsulfonate ion, an arylsulfonate ion, an alkylsulfate ion, a sulfate ion, a phosphate ion, an alkylphosphate ion, a phosphonate ion, $PF_6^-$ and $BF_4^-$.

4. The lithographic printing plate precursor as claimed in claim 1, wherein the polymer containing as a repeating unit, a structural unit having an ammonium structure is contained in the image-recording layer and the protective layer.

5. The lithographic printing plate precursor as claimed in claim 1, further comprising an undercoat layer, so that the undercoat layer, the image-recording layer and the protective layer are provided in this order, wherein the polymer containing as a repeating unit, a structural unit having an ammonium structure is contained in each of the undercoat layer, the image-recording layer and the protective layer.

6. The lithographic printing plate precursor as claimed in claim 1, wherein the sensitizing dye is an infrared absorbing agent.

7. The lithographic printing plate precursor as claimed in claim 1, wherein the image-recording layer further comprises a binder polymer.

8. The lithographic printing plate precursor as claimed in claim 1, wherein the image-recording layer comprises a microcapsule or a microgel.

9. The lithographic printing plate precursor as claimed in claim 1, wherein the image-recording layer is capable of being removed with at least one of printing ink and dampening water.

10. The lithographic printing plate precursor as claimed in claim 1, wherein the structural unit represented by the formula (1) is a structural unit represented by one of the following formulae (6) to (8):

(6)

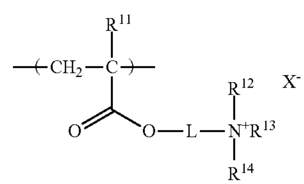

(7)

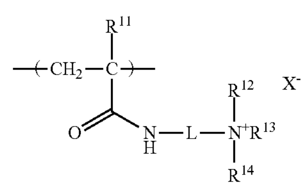

(8)

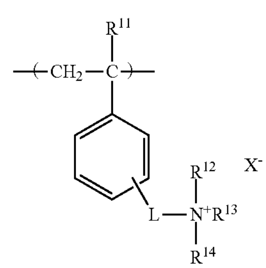

wherein $R^{11}$, $R^{12}$, $R^{13}$ and $R^{14}$ each independently represent a hydrogen atom or a substituent, L represents a single bond or a divalent connecting group, and $X^-$ represents a halide ion, a carboxylate ion having from 1 to 70 carbon atoms, an alkylsulfonate ion having from 1 to 70 carbon atoms, an arylsulfonate ion having from 6 to 70 carbon atoms, an alkylsulfate ion having from 1 to 70 carbon atoms, a sulfate ion, a phosphate ion, an alkylphosphate ion having from 1 to 70 carbon atoms, an alkylphosphonate ion having from 1 to 70 carbon atoms, an arylphosphonate ion having from 6 to 70 carbon atoms, $PF_6^-$, $BF_4^-$ or a combination thereof.

11. The lithographic printing plate precursor as claimed in claim 10, wherein the halide ion is F, $Cl^-$ or $Br^-$.
12. The lithographic printing plate precursor as claimed in claim 1, wherein the structural unit represented by the formula (1) is selected from the group consisting of:
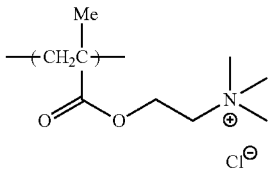
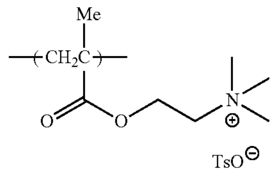
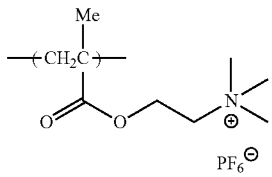
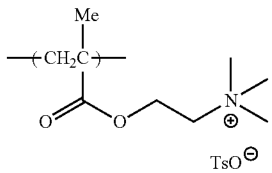
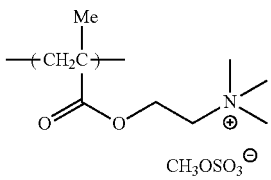
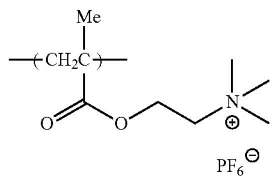
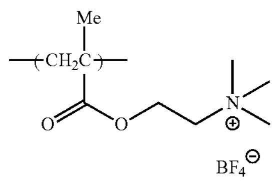
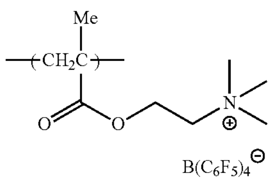
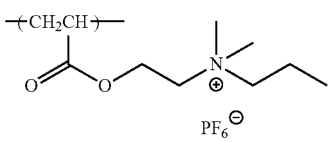
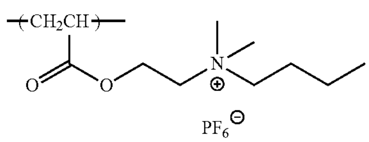
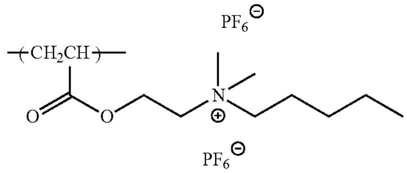
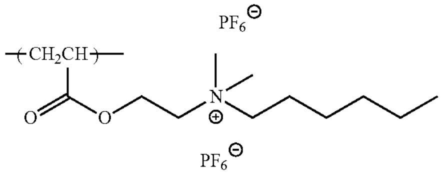
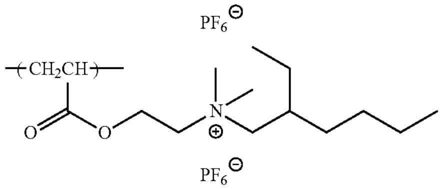
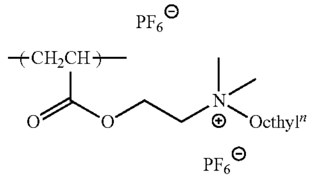
-continued
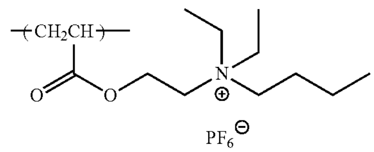
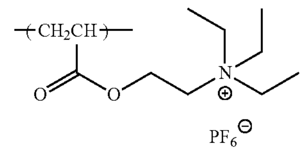
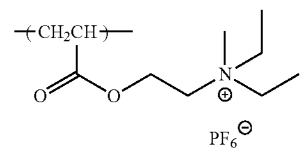
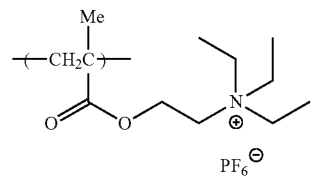
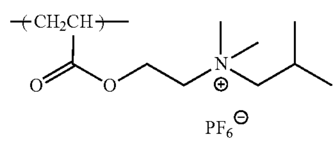
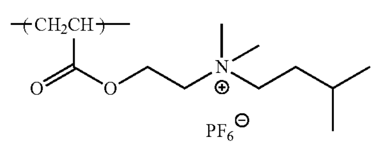
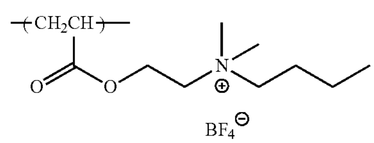
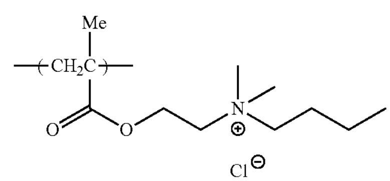
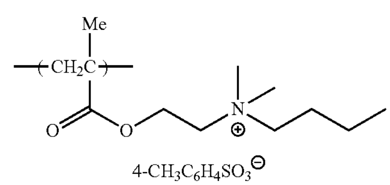
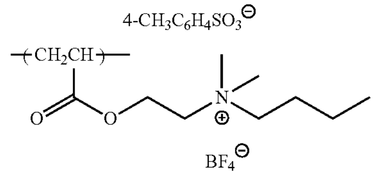
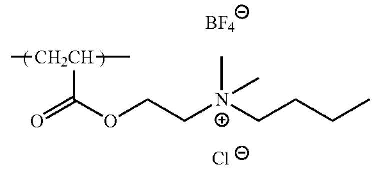

-continued
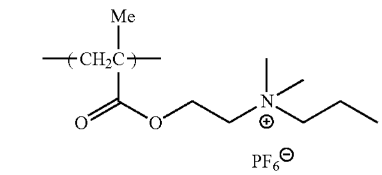
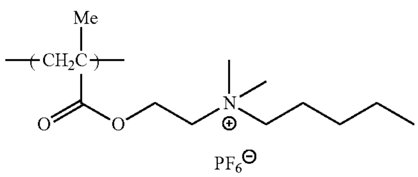
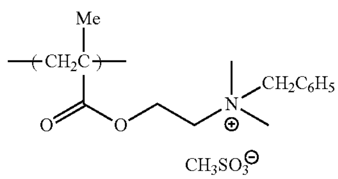
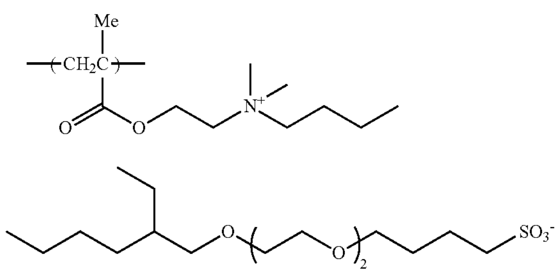
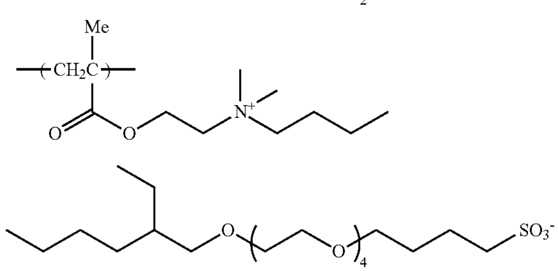
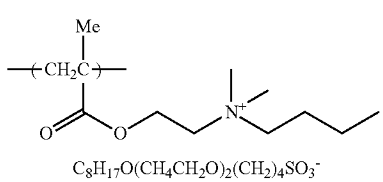
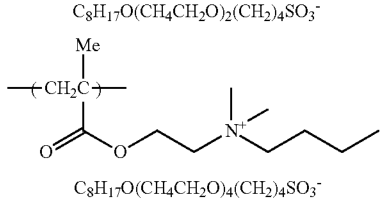
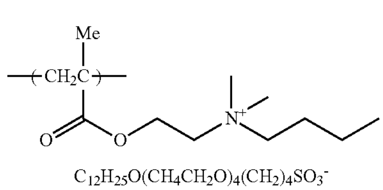
-continued
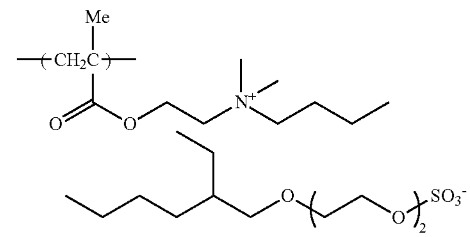
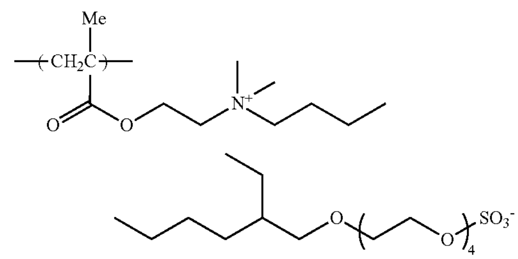
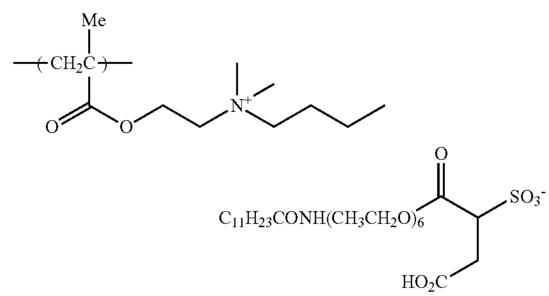
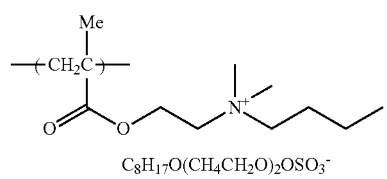
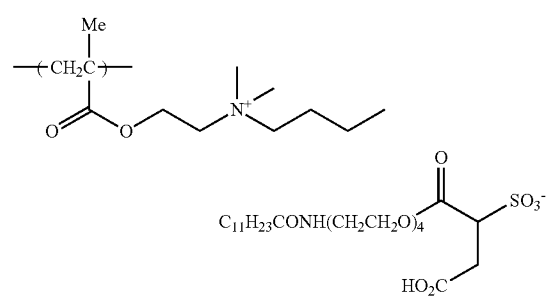
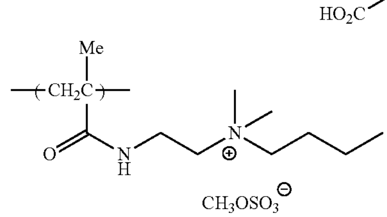
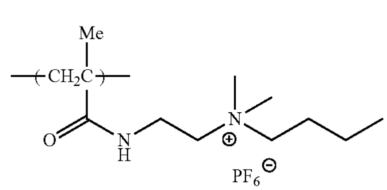

-continued
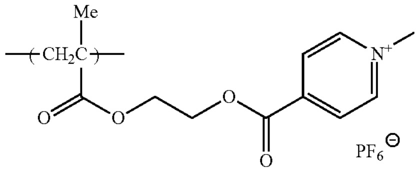
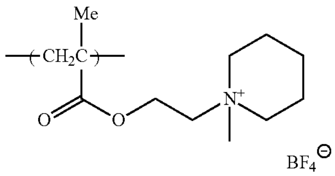
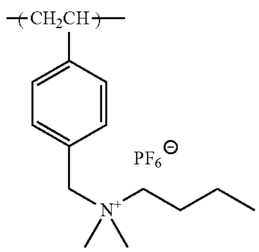
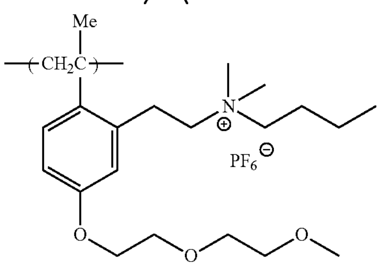
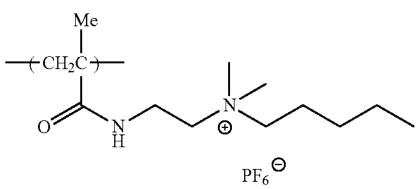
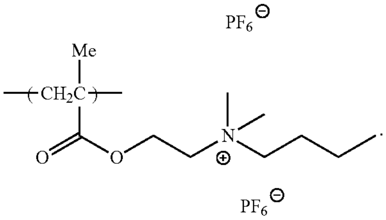
13. The lithographic printing plate precursor as claimed in claim 12, wherein the structural unit represented by the formula (1) is selected from the group consisting of:
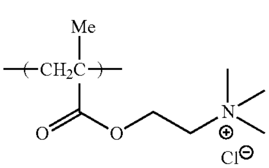
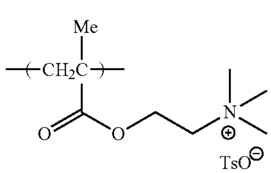
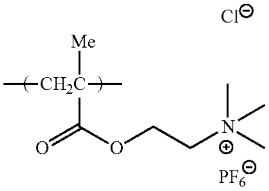
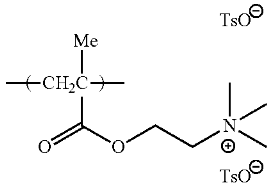
-continued
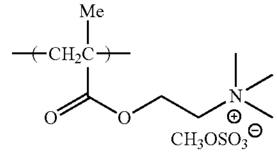
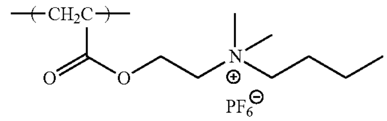
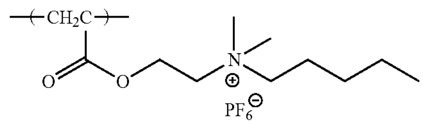
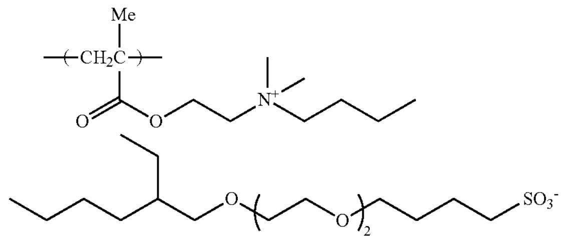
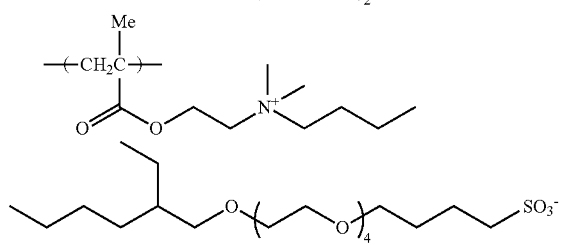
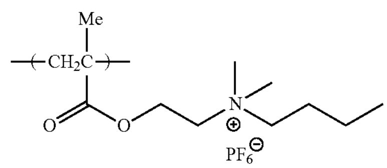
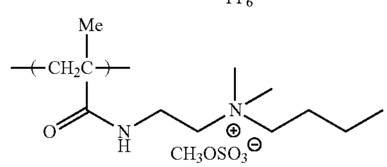
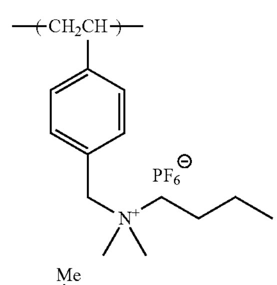
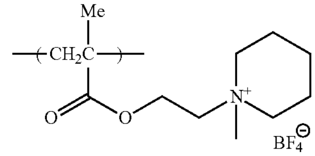
14. The lithographic printing plate precursor as claimed in claim 12, wherein the structural unit represented by the formula (2) is selected from the group consisting of:

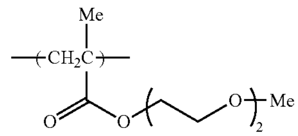

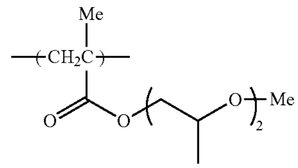

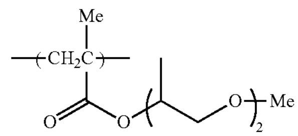

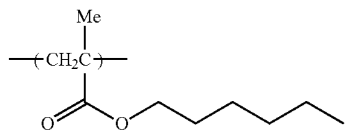

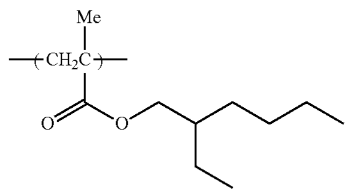

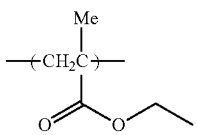

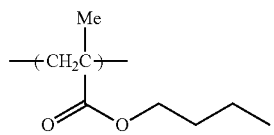

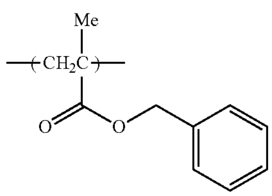

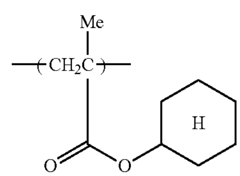

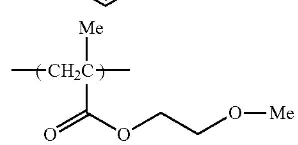

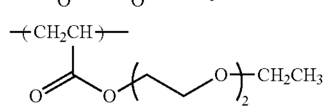

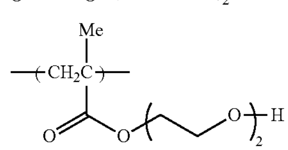

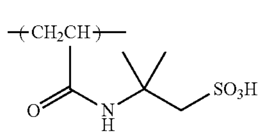

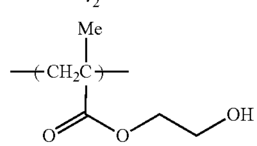

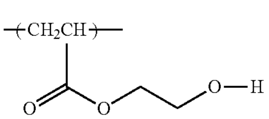

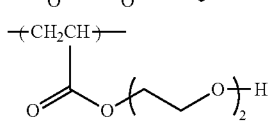

-continued

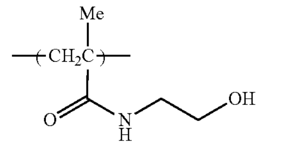

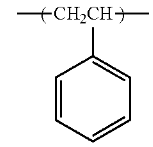

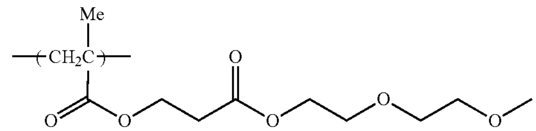

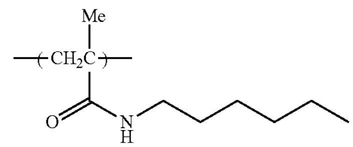

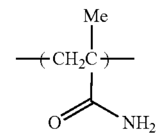

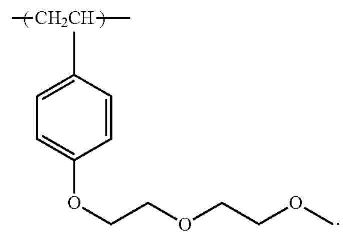

15. The lithographic printing plate precursor as claimed in claim 13, wherein the structural unit represented by the formula (2) is selected from the group consisting of:

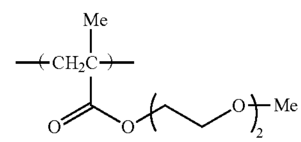

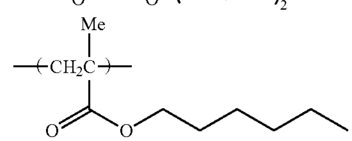

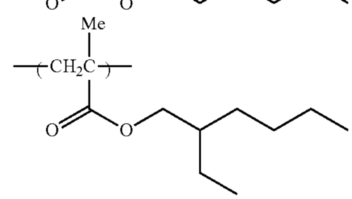

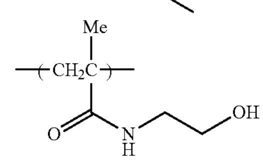

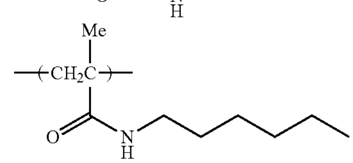

16. The lithographic printing plate precursor as claimed in claim 14, wherein the structural unit represented by the formulae (1) and (2) is a polymer having one of the following sets of structural units:

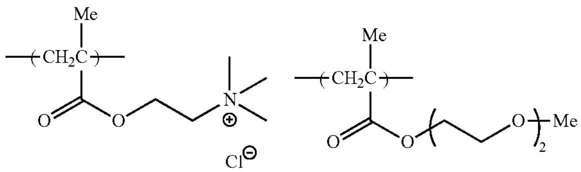
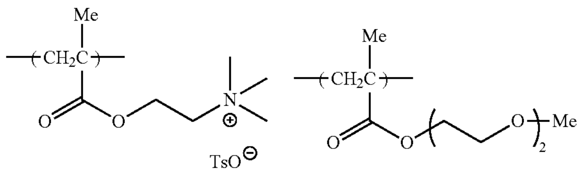
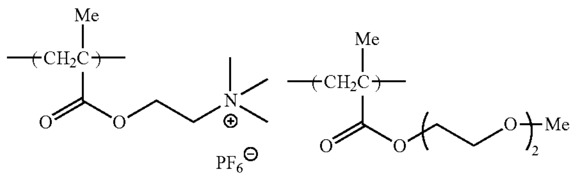
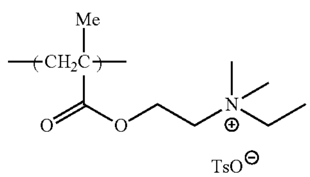
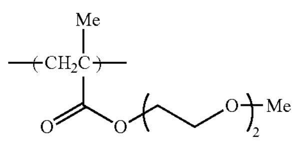
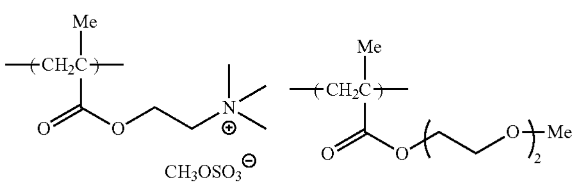
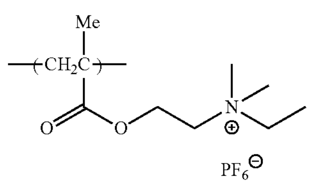
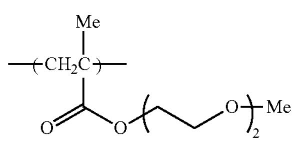
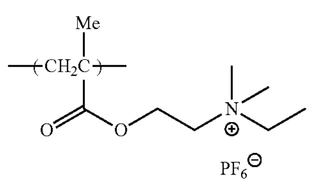
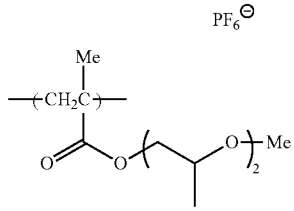
-continued
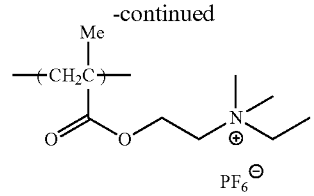
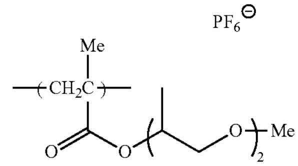
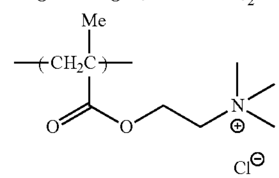
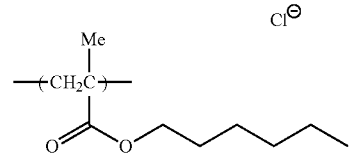
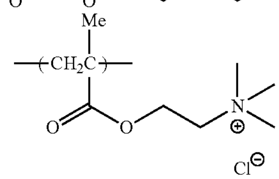
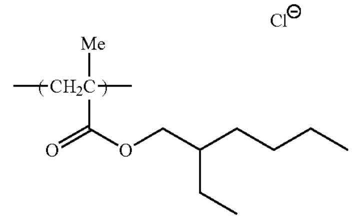
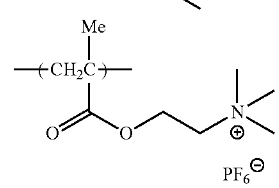
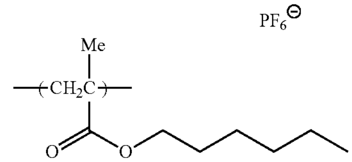
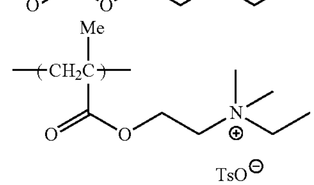
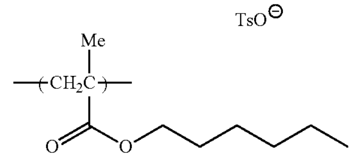
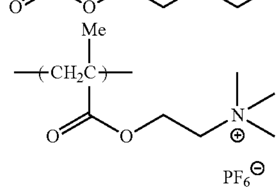

-continued
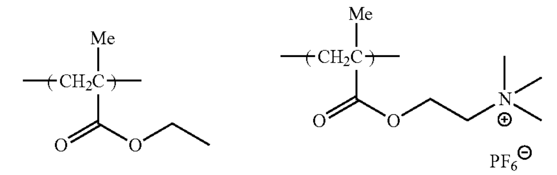
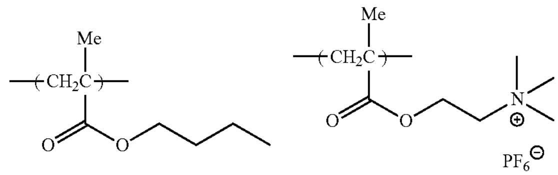
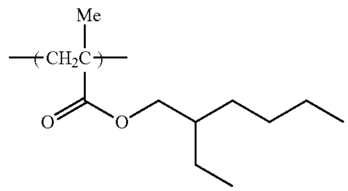
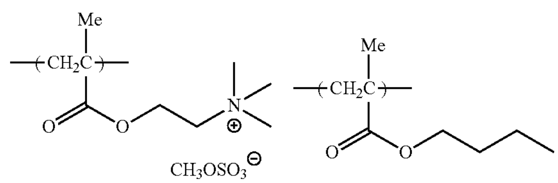
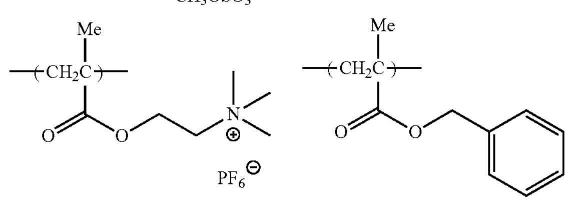
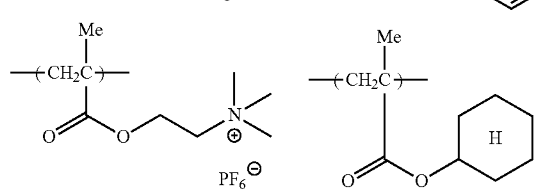
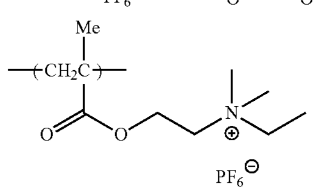
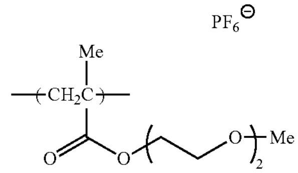
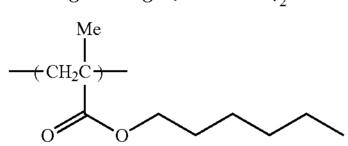
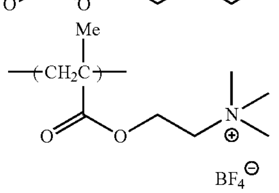
-continued
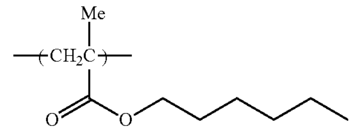
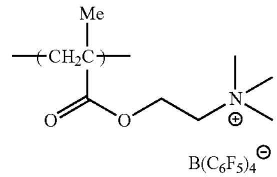
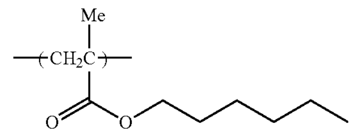
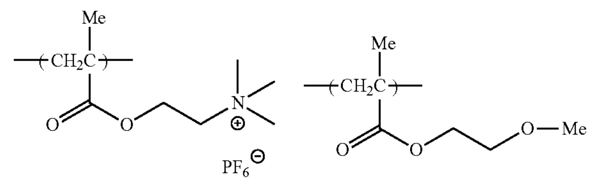
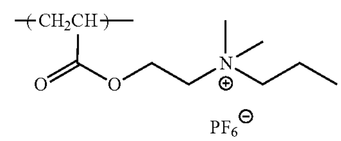
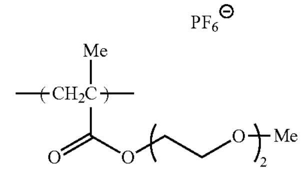
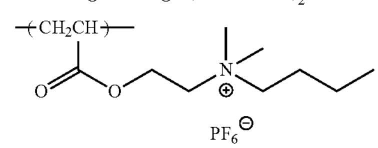
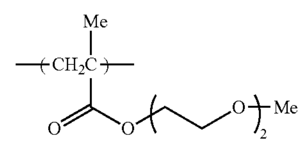
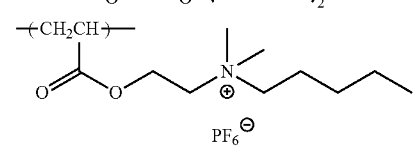
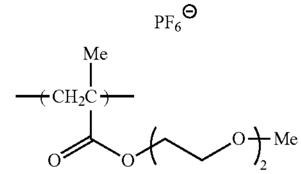
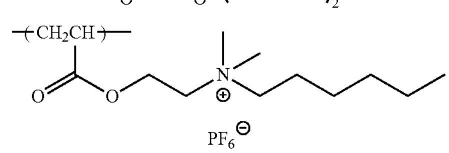
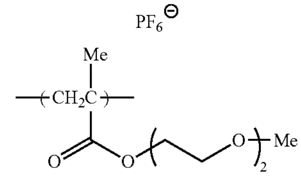

-continued
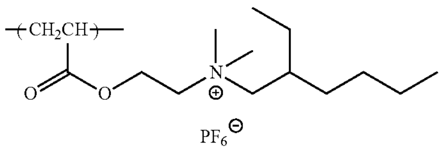
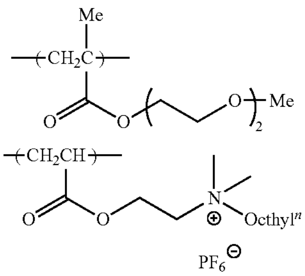
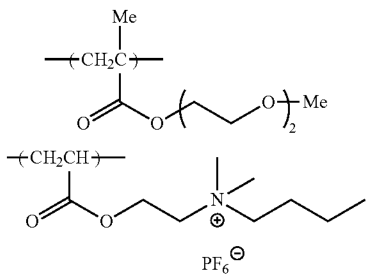
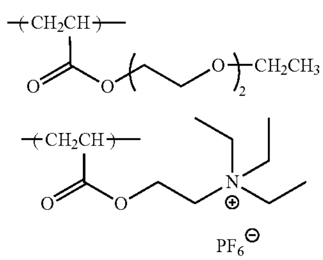
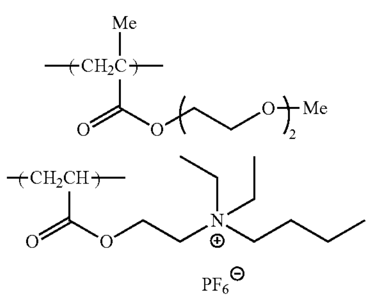
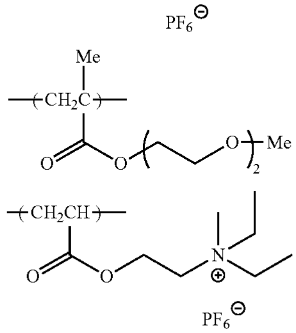
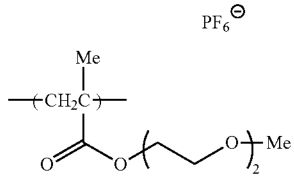
-continued
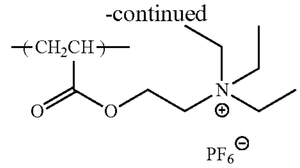
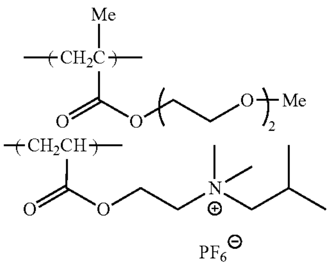
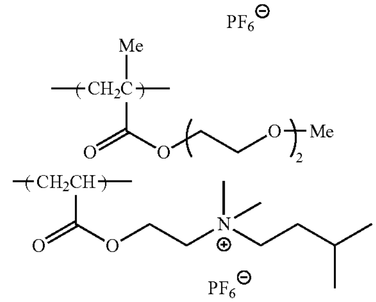
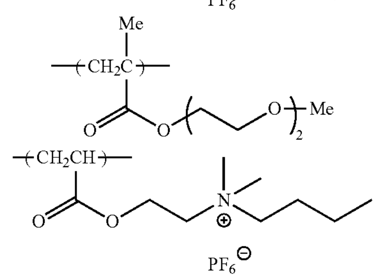
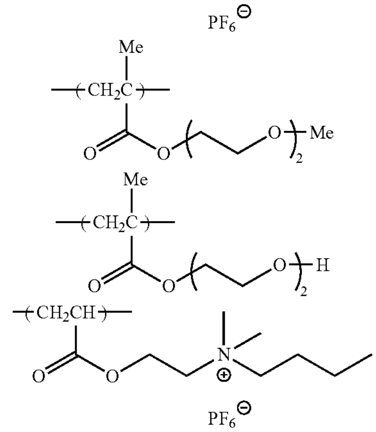
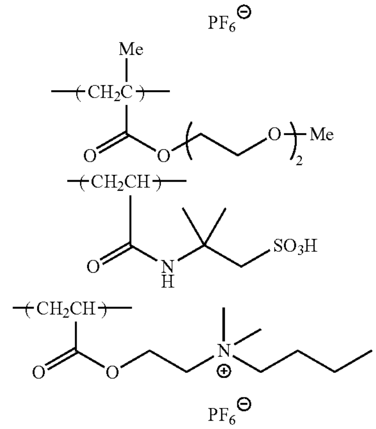

-continued
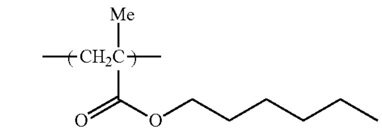
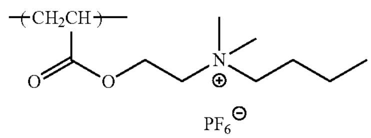
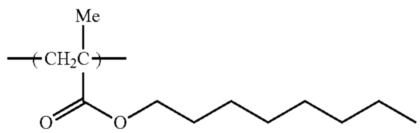
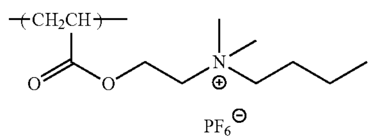
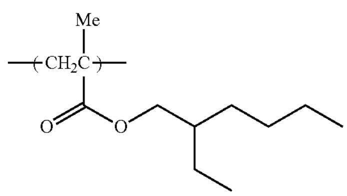
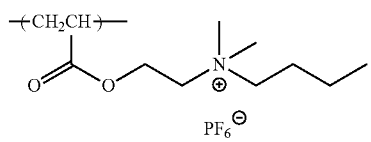
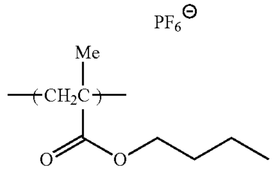
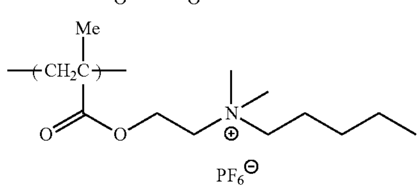
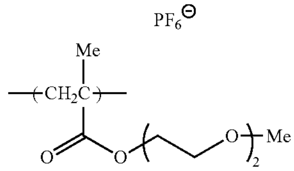
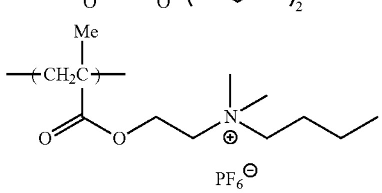
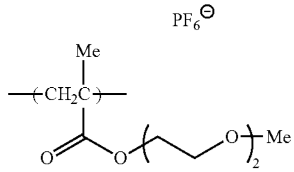
-continued
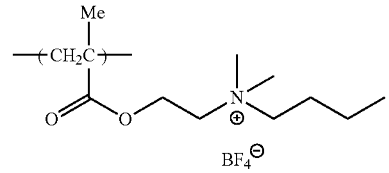
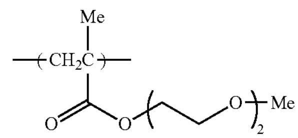
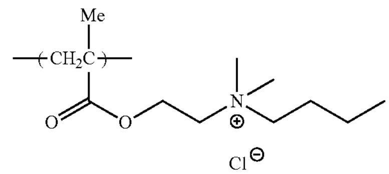
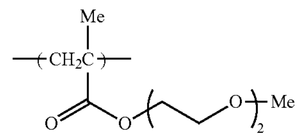
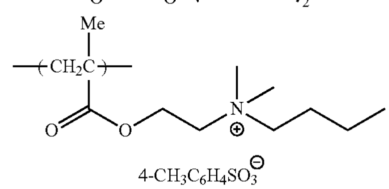
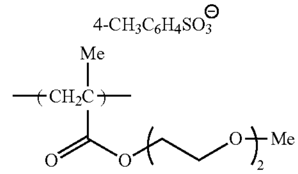
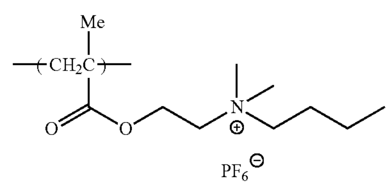
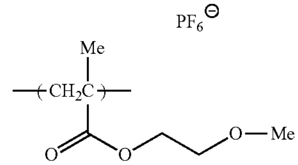
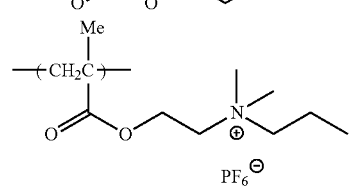
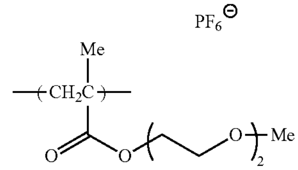
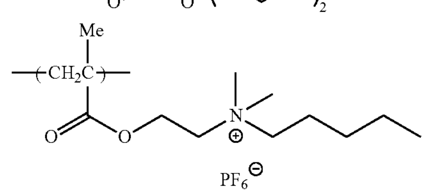

-continued
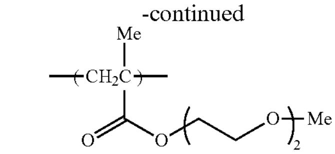
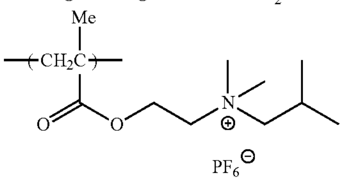
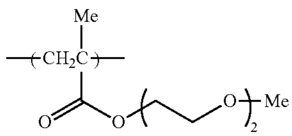
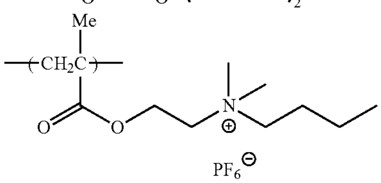
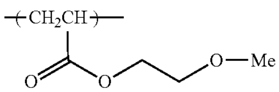
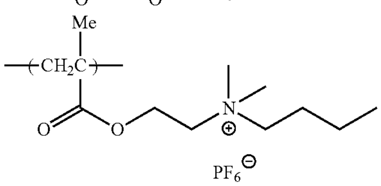
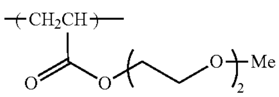
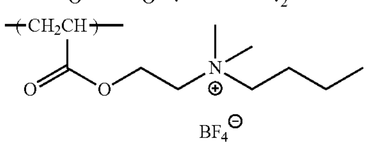
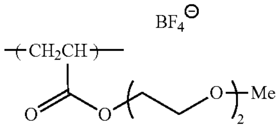
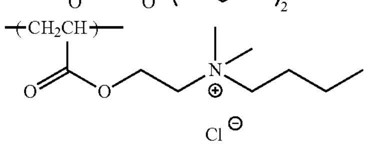
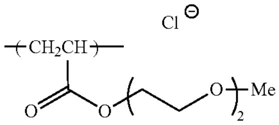
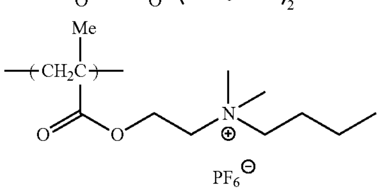
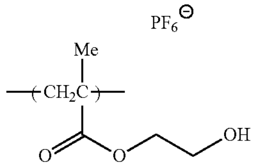
-continued
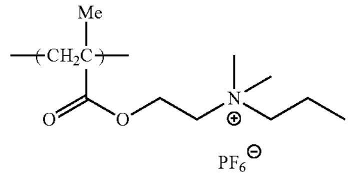
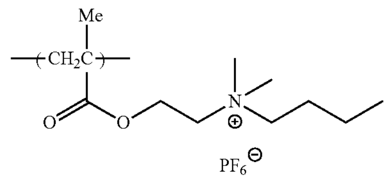
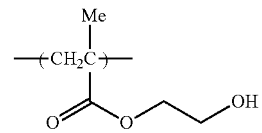
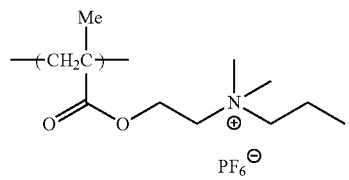
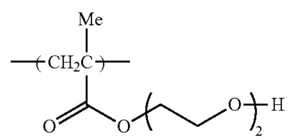
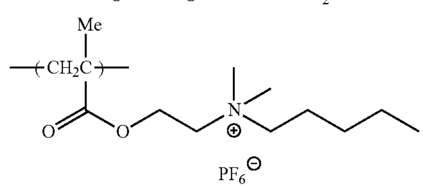
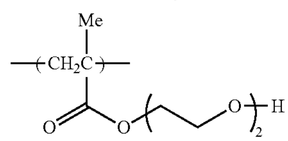
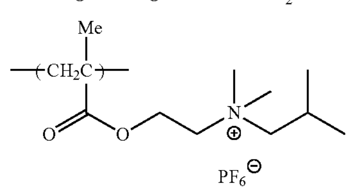
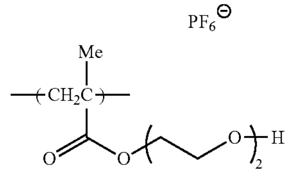
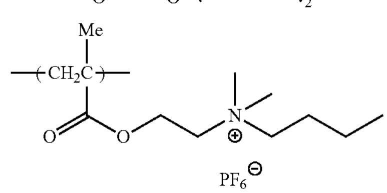
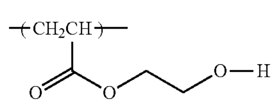

-continued
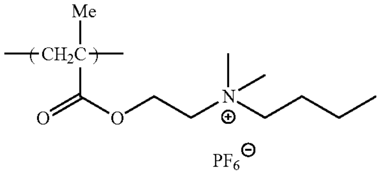
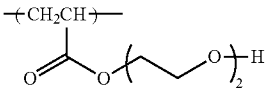
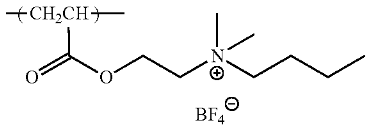
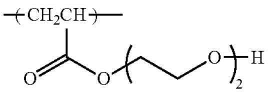
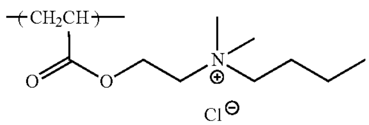
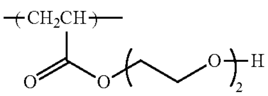
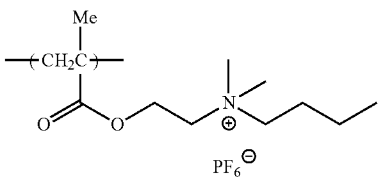
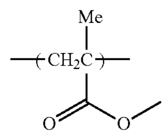
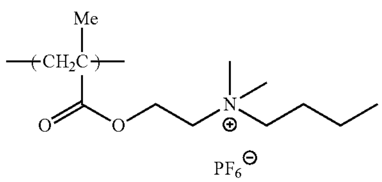
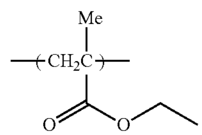
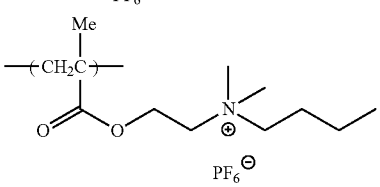
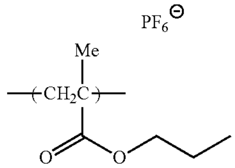
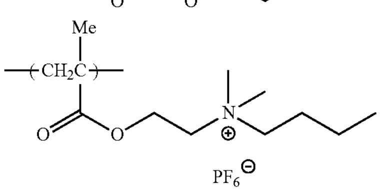
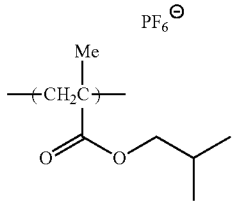
-continued
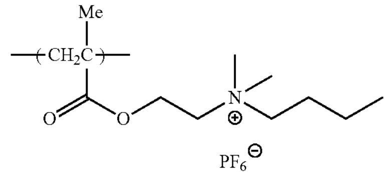
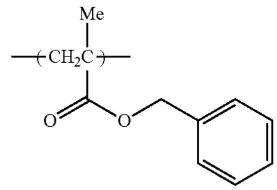
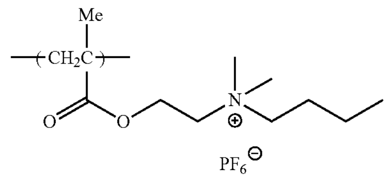
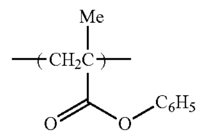
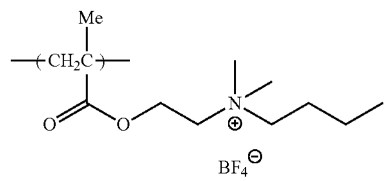
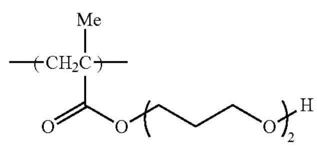
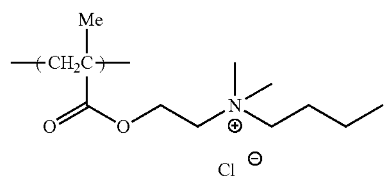
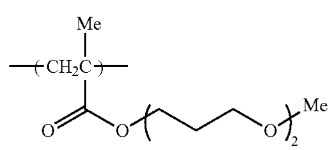
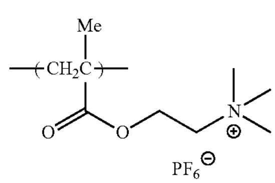
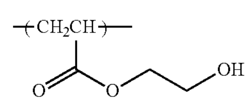
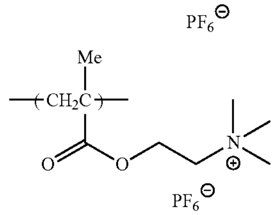
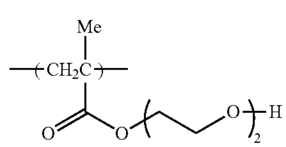

-continued
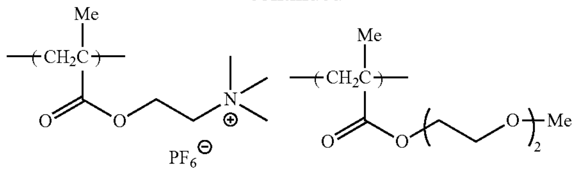
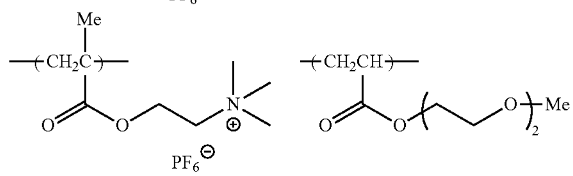
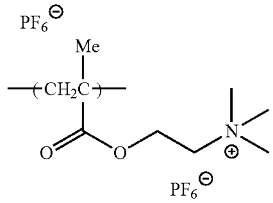
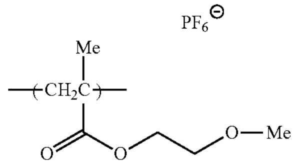
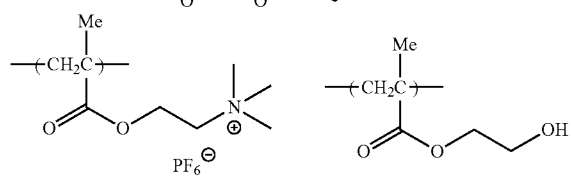
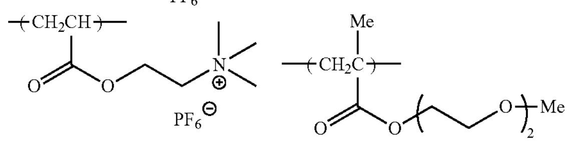
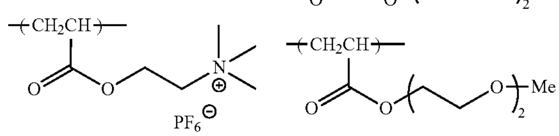
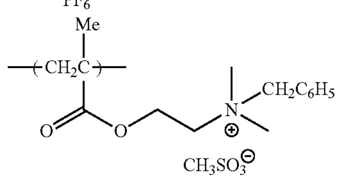
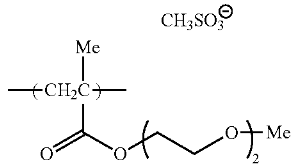
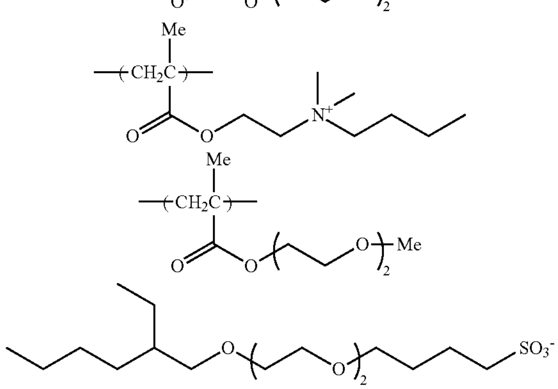
-continued
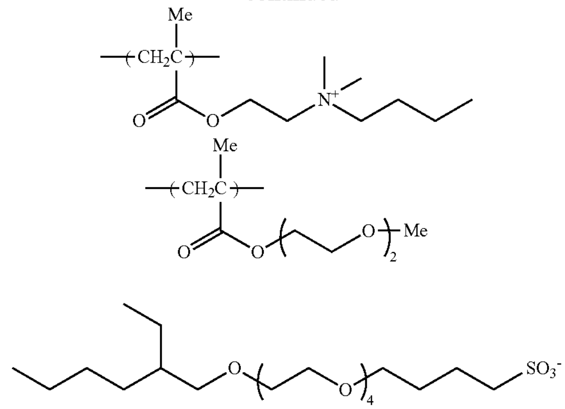
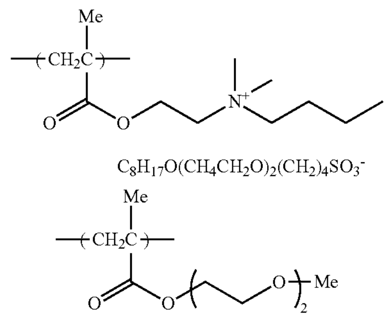
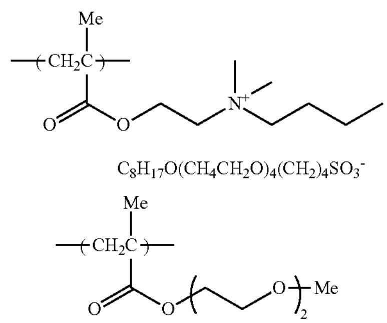
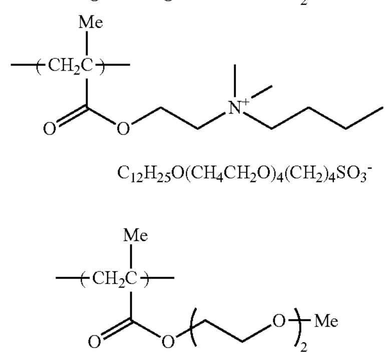
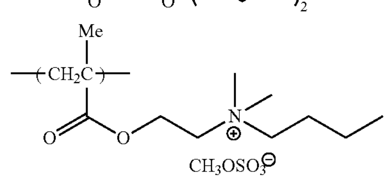
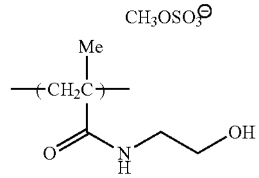

-continued
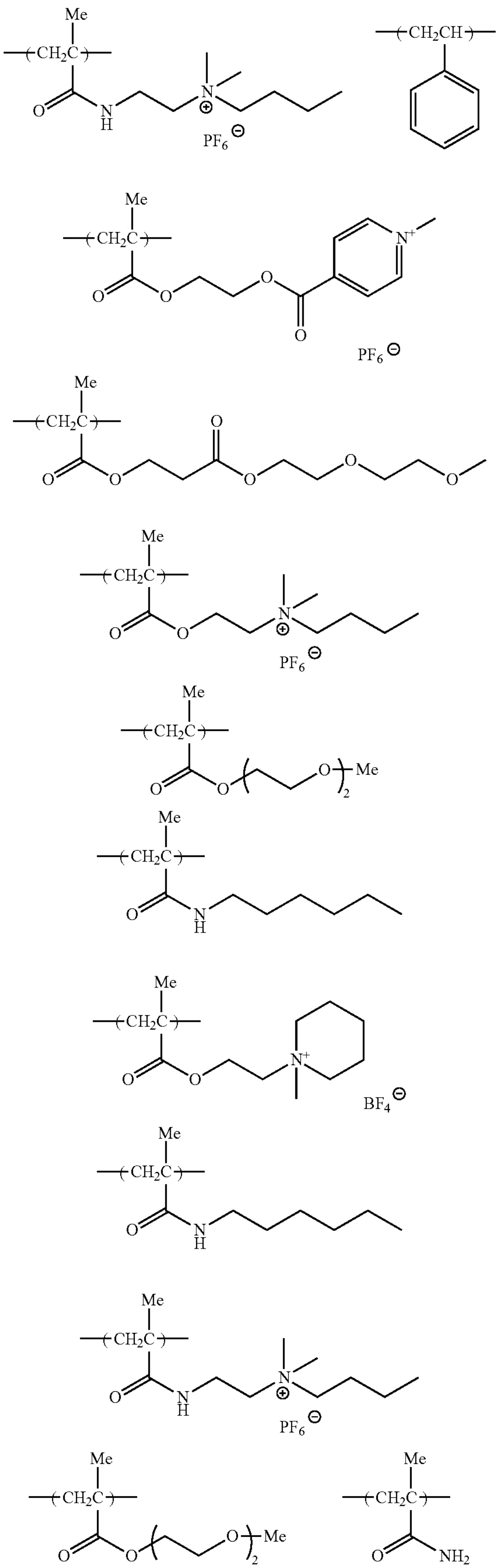
-continued
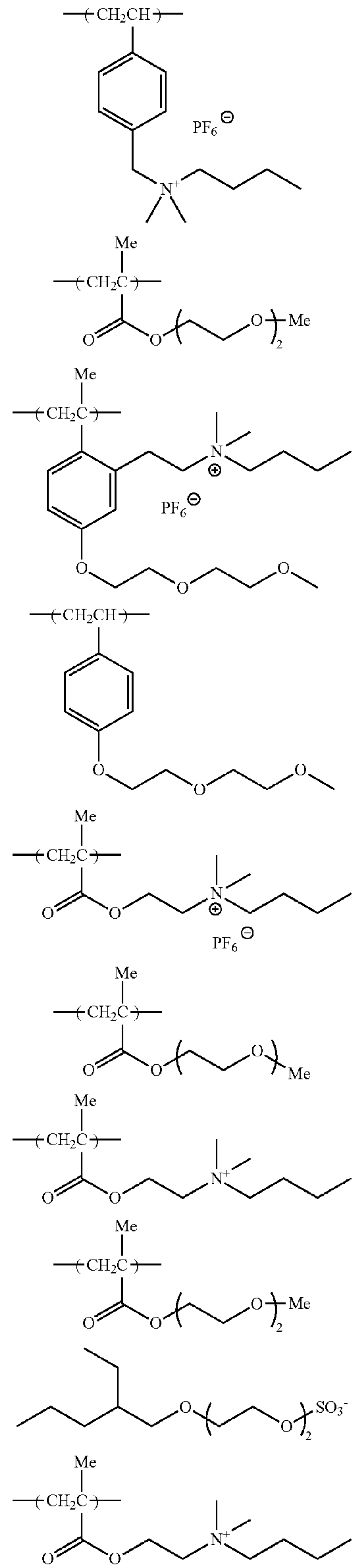

-continued

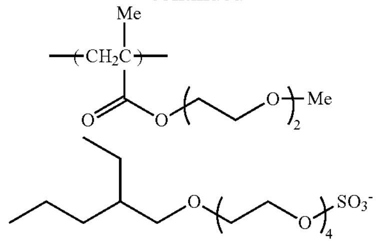

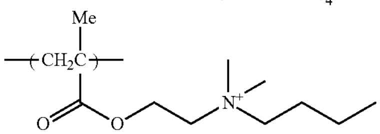

$C_8H_{17}O(CH_4CH_2O)_2OSO_3^-$

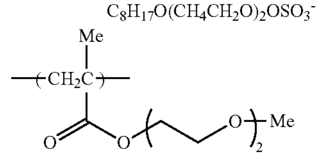

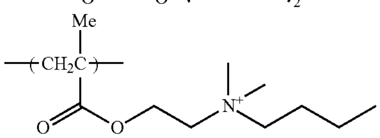

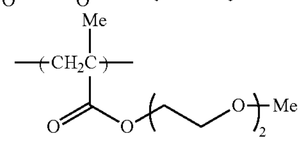

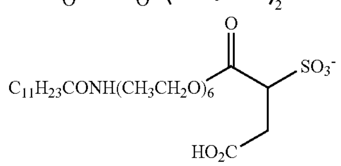

-continued

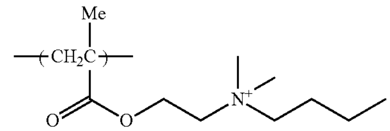

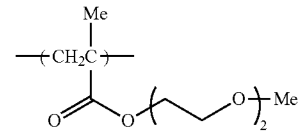

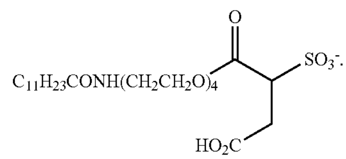

17. A lithographic printing method comprising:

exposing imagewise the lithographic printing plate precursor as claimed in claim 9 with a laser and loading the exposed lithographic printing plate precursor on a printing machine or loading the lithographic printing plate precursor as claimed in claim 9 on a printing machine and exposing imagewise the loaded lithographic printing plate precursor with a laser; and supplying printing ink and dampening water to the exposed lithographic printing plate precursor to perform on-machine development processing.

18. The lithographic printing method as claimed in claim 17, wherein the laser is an infrared laser.

* * * * *